United States Patent
Mark et al.

(10) Patent No.: US 11,237,542 B2
(45) Date of Patent: Feb. 1, 2022

(54) COMPOSITE FILAMENT 3D PRINTING USING COMPLEMENTARY REINFORCEMENT FORMATIONS

(71) Applicant: MARKFORGED, INC., Somerville, MA (US)

(72) Inventors: Gregory Thomas Mark, Cambridge, MA (US); Rick Bryan Woodruff, Cambridge, MA (US); David Steven Benhaim, Cambridge, MA (US); Abraham Lawrence Parangi, Lincoln, MA (US); Benjamin Tsu Sklaroff, Somerville, MA (US)

(73) Assignee: MARKFORGED, INC., Watertown, MA (US)

( * ) Notice: Subject to any disclaimer, the term of this patent is extended or adjusted under 35 U.S.C. 154(b) by 628 days.

(21) Appl. No.: 14/944,093

(22) Filed: Nov. 17, 2015

(65) Prior Publication Data
US 2016/0107379 A1    Apr. 21, 2016

Related U.S. Application Data

(63) Continuation-in-part of application No. 14/491,439, filed on Sep. 19, 2014, now Pat. No. 9,694,544, which
(Continued)

(51) Int. Cl.
G05B 19/4099    (2006.01)
B33Y 10/00      (2015.01)
(Continued)

(52) U.S. Cl.
CPC ........ *G05B 19/4099* (2013.01); *B29C 64/118* (2017.08); *B29C 70/16* (2013.01);
(Continued)

(58) Field of Classification Search
CPC ..... B29C 64/386; B29C 64/106; B29C 70/16; B33Y 10/00; B33Y 50/02; B33Y 70/00;
(Continued)

(56) References Cited

U.S. PATENT DOCUMENTS 4,291,841 A    9/1981  Dalrymple et al.
4,720,251 A    1/1988  Mallay et al.
(Continued)

FOREIGN PATENT DOCUMENTS

CN    101133107 A    2/2008
CN    101193953 A    6/2008
(Continued)

OTHER PUBLICATIONS

Geek magazine—hacker daily blog "To Skolkovo created the Russia's first composite 3D-printer", Feb. 24, 2015, Retrieved from the internet: <http://geek-mag.com/posts/246332/>.
(Continued)

*Primary Examiner* — Michael M. Robinson
(74) *Attorney, Agent, or Firm* — Lando & Anastasi, LLP

(57) ABSTRACT

In a method for additive manufacturing, a multi-strand core reinforced filament including a flowable matrix material and substantially continuous reinforcing strands extending in a direction parallel to a length of the filament is supplied. A first consolidated composite swath of a height less than ½ the width of the filament is deposited in a first reinforcement formation including at least one straight path and at least one curved path against a deposition surface, and a second consolidated composite swath of a height less than ½ the width of the filament is deposited in a second reinforcement formation against the first consolidated composite swath. Each deposition flows the matrix material and applies an
(Continued)

ironing force to spread the reinforcing strands within the filament against the underlying surface and/or previously deposited swath.

25 Claims, 38 Drawing Sheets

Related U.S. Application Data is a continuation-in-part of application No. 14/333,881, filed on Jul. 17, 2014, now Pat. No. 9,419,988, which is a continuation-in-part of application No. 14/297,437, filed on Jun. 5, 2014, now Pat. No. 9,370,896.

(60) Provisional application No. 62/080,890, filed on Nov. 17, 2014, provisional application No. 62/172,021, filed on Jun. 5, 2015, provisional application No. 61/907,431, filed on Nov. 22, 2013, provisional application No. 61/902,256, filed on Nov. 10, 2013, provisional application No. 61/883,440, filed on Sep. 27, 2013, provisional application No. 61/881,946, filed on Sep. 24, 2013, provisional application No. 61/880,129, filed on Sep. 19, 2013, provisional application No. 61/878,029, filed on Sep. 15, 2013, provisional application No. 61/847,113, filed on Jul. 17, 2013, provisional application No. 61/831,600, filed on Jun. 5, 2013, provisional application No. 61/815,531, filed on Apr. 24, 2013, provisional application No. 61/804,235, filed on Mar. 22, 2013.

(51) Int. Cl.
| | |
|---|---|
| *B29C 70/16* | (2006.01) |
| *G06F 30/00* | (2020.01) |
| *B29C 64/118* | (2017.01) |
| *B29K 101/12* | (2006.01) |
| *B29K 105/08* | (2006.01) |
| *B33Y 50/02* | (2015.01) |
| *B33Y 70/00* | (2020.01) |
| *B29K 25/00* | (2006.01) |
| *B29K 71/00* | (2006.01) |
| *B29K 77/00* | (2006.01) |
| *B29K 79/00* | (2006.01) |
| *B29K 63/00* | (2006.01) |

(52) U.S. Cl.
CPC .............. *B33Y 10/00* (2014.12); *G06F 30/00* (2020.01); *B29K 2025/08* (2013.01); *B29K 2063/00* (2013.01); *B29K 2071/00* (2013.01); *B29K 2077/00* (2013.01); *B29K 2079/085* (2013.01); *B29K 2101/12* (2013.01); *B29K 2105/08* (2013.01); *B33Y 50/02* (2014.12); *B33Y 70/00* (2014.12); *G05B 2219/35134* (2013.01); *G05B 2219/49007* (2013.01)

(58) Field of Classification Search
CPC ...... G05B 19/4099; G05B 2219/35134; G05B 2219/49007; G06F 17/50; B29K 2025/08; B29K 2063/00; B29K 2071/00; B29K 2077/00; B29K 2079/085; B29K 2101/12; B29K 2105/08

See application file for complete search history.

(56) References Cited

U.S. PATENT DOCUMENTS

| | | | |
|---|---|---|---|
| 5,002,712 A | 3/1991 | Goldmann et al. | |
| 5,037,691 A | 8/1991 | Medney et al. | |
| 5,096,530 A * | 3/1992 | Cohen | B29C 64/141 156/229 |
| 5,121,329 A | 6/1992 | Crump | |
| 5,155,324 A | 10/1992 | Deckard et al. | |
| 5,340,433 A | 8/1994 | Crump | |
| 5,447,793 A | 9/1995 | Montsinger | |
| 5,764,521 A | 6/1998 | Batchelder et al. | |
| 5,866,058 A | 2/1999 | Batchelder et al. | |
| 5,885,316 A | 3/1999 | Sato et al. | |
| 5,906,863 A | 5/1999 | Lombardi et al. | |
| 5,936,861 A | 8/1999 | Jang et al. | |
| 5,955,119 A | 9/1999 | Andris et al. | |
| 6,054,077 A | 4/2000 | Comb et al. | |
| 6,080,343 A | 6/2000 | Kaufman et al. | |
| 6,085,957 A | 7/2000 | Zinniel et al. | |
| 6,099,783 A | 8/2000 | Scranton et al. | |
| 6,129,872 A | 10/2000 | Jang | |
| 6,153,034 A | 11/2000 | Lipsker | |
| 6,214,279 B1 | 4/2001 | Yang et al. | |
| 6,363,606 B1 | 4/2002 | Johnson, Jr. et al. | |
| 6,372,178 B1 | 4/2002 | Tseng | |
| 6,421,820 B1 | 7/2002 | Mansfield et al. | |
| 6,504,127 B1 | 1/2003 | McGregor et al. | |
| 6,547,210 B1 | 4/2003 | Marx et al. | |
| 6,823,230 B1 | 11/2004 | Jamalabad et al. | |
| 6,859,681 B1 | 2/2005 | Alexander | |
| 6,934,600 B2 | 8/2005 | Jang et al. | |
| 6,986,739 B2 | 1/2006 | Warren et al. | |
| 7,020,539 B1 | 3/2006 | Kovacevic et al. | |
| 7,083,697 B2 | 8/2006 | Dao et al. | |
| 7,127,309 B2 | 10/2006 | Dunn et al. | |
| 7,625,200 B2 | 12/2009 | Leavitt | |
| 8,050,786 B2 | 11/2011 | Holzwarth | |
| 8,066,842 B2 | 11/2011 | Farmer et al. | |
| 8,221,669 B2 | 7/2012 | Batchelder et al. | |
| 8,295,972 B2 | 10/2012 | Coleman et al. | |
| 8,815,141 B2 | 8/2014 | Swanson et al. | |
| 8,827,684 B1 | 9/2014 | Schumacher et al. | |
| 8,916,085 B2 | 12/2014 | Jackson et al. | |
| 8,920,697 B2 | 12/2014 | Mikulak et al. | |
| 9,126,365 B1 | 9/2015 | Mark et al. | |
| 9,126,367 B1 | 9/2015 | Mark et al. | |
| 9,156,205 B2 | 10/2015 | Mark et al. | |
| 9,207,540 B1 | 12/2015 | Bhargava et al. | |
| 9,327,453 B2 | 5/2016 | Mark et al. | |
| 9,370,896 B2 | 6/2016 | Mark | |
| 9,427,399 B2 | 8/2016 | Adams et al. | |
| 9,511,544 B2 | 12/2016 | Hemingway et al. | |
| 9,579,851 B2 | 2/2017 | Mark et al. | |
| 9,694,544 B2 | 7/2017 | Mark et al. | |
| 9,849,631 B1 | 12/2017 | Goss et al. | |
| 10,029,415 B2 | 7/2018 | Swanson et al. | |
| 10,059,057 B2 | 8/2018 | Schirtzinger et al. | |
| 10,061,301 B2 | 8/2018 | Burton | |
| 10,076,876 B2 | 9/2018 | Mark et al. | |
| 10,118,375 B2 | 11/2018 | Hickman et al. | |
| 10,131,088 B1 | 11/2018 | Tyler et al. | |
| 10,160,193 B2 | 12/2018 | Nielsen-Cole et al. | |
| 10,254,499 B1 | 4/2019 | Cohen et al. | |
| 10,293,594 B2 | 5/2019 | Gardiner | |
| 10,414,147 B2 | 9/2019 | Sweeney et al. | |
| 10,611,082 B2 | 4/2020 | Mark et al. | |
| 2001/0030383 A1 | 10/2001 | Swanson et al. | |
| 2002/0009935 A1 | 1/2002 | Hsiao et al. | |
| 2002/0062909 A1 | 5/2002 | Jang et al. | |
| 2002/0079607 A1 | 6/2002 | Hawley et al. | |
| 2002/0102322 A1 | 8/2002 | Gunther | |
| 2002/0113331 A1 | 8/2002 | Zhang et al. | |
| 2002/0165304 A1 | 11/2002 | Mulligan et al. | |
| 2002/0172817 A1 | 11/2002 | Owens | |
| 2003/0044593 A1 | 3/2003 | Vaidyanathan et al. | |
| 2003/0056870 A1 * | 3/2003 | Comb | B29C 48/92 156/64 |
| 2003/0090034 A1 | 5/2003 | Mulhaupt et al. | |
| 2003/0186042 A1 | 10/2003 | Dunlap et al. | |
| 2003/0236588 A1 | 12/2003 | Jang et al. | |
| 2004/0067711 A1 | 4/2004 | Bliton et al. | |
| 2004/0124146 A1 * | 7/2004 | Dao | D04H 3/05 210/645 |

(56) References Cited

U.S. PATENT DOCUMENTS

| | | |
|---|---|---|
| 2004/0140078 A1 | 7/2004 | Liu et al. |
| 2004/0166140 A1 | 8/2004 | Santini et al. |
| 2004/0253365 A1 | 12/2004 | Warren et al. |
| 2005/0061422 A1 | 3/2005 | Martin |
| 2005/0104257 A1 | 5/2005 | Gu et al. |
| 2005/0109451 A1 | 5/2005 | Hauber et al. |
| 2005/0156352 A1 | 7/2005 | Burkle et al. |
| 2005/0230029 A1 | 10/2005 | Vaidyanathan et al. |
| 2005/0279185 A1 | 12/2005 | Cook et al. |
| 2006/0047052 A1 | 3/2006 | Barrera et al. |
| 2007/0003650 A1 | 1/2007 | Schroeder |
| 2007/0036964 A1 | 2/2007 | Rosenberger et al. |
| 2007/0151167 A1 | 7/2007 | Cook et al. |
| 2007/0179657 A1* | 8/2007 | Holzwarth ............ B29C 64/106 700/119 |
| 2007/0225856 A1 | 9/2007 | Slaughter et al. |
| 2007/0228592 A1* | 10/2007 | Dunn .................. B29C 64/386 264/40.4 |
| 2007/0252871 A1 | 11/2007 | Silverbrook |
| 2008/0176092 A1 | 7/2008 | Owens |
| 2008/0206394 A1 | 8/2008 | Bouti |
| 2008/0251975 A1 | 10/2008 | Gallagher et al. |
| 2008/0274229 A1 | 11/2008 | Barnett |
| 2009/0022615 A1 | 1/2009 | Entezarian |
| 2009/0054552 A1 | 2/2009 | Yano et al. |
| 2009/0065965 A1 | 3/2009 | Bowen |
| 2009/0092833 A1 | 4/2009 | Schmitt et al. |
| 2009/0095410 A1 | 4/2009 | Oldani |
| 2009/0174709 A1 | 7/2009 | Kozlak et al. |
| 2009/0199948 A1 | 8/2009 | Kisch |
| 2009/0220632 A1 | 9/2009 | Haque |
| 2009/0234616 A1 | 9/2009 | Perkins |
| 2010/0024987 A1 | 2/2010 | Saine et al. |
| 2010/0028641 A1 | 2/2010 | Zhu et al. |
| 2010/0151072 A1 | 6/2010 | Scheurich |
| 2010/0191360 A1 | 7/2010 | Napadensky et al. |
| 2010/0203351 A1 | 8/2010 | Nayfeh |
| 2010/0243764 A1 | 9/2010 | Okesaku et al. |
| 2011/0001264 A1 | 1/2011 | Minoura et al. |
| 2011/0032301 A1 | 2/2011 | Fienup et al. |
| 2011/0070394 A1 | 3/2011 | Hopkins et al. |
| 2011/0143108 A1 | 6/2011 | Fruth et al. |
| 2011/0178621 A1 | 7/2011 | Heide |
| 2011/0222081 A1 | 9/2011 | Yi et al. |
| 2011/0230111 A1 | 9/2011 | Weir et al. |
| 2011/0289791 A1 | 12/2011 | Menchik et al. |
| 2012/0060468 A1 | 3/2012 | Dushku et al. |
| 2012/0070523 A1 | 3/2012 | Swanson et al. |
| 2012/0092724 A1 | 4/2012 | Pettis |
| 2012/0140041 A1 | 6/2012 | Burgunder et al. |
| 2012/0144795 A1 | 6/2012 | Knappe |
| 2012/0156445 A1 | 6/2012 | Schmidt et al. |
| 2012/0231225 A1 | 9/2012 | Mikulak et al. |
| 2012/0247655 A1 | 10/2012 | Erb et al. |
| 2013/0004610 A1 | 1/2013 | Hartmann et al. |
| 2013/0075952 A1 | 3/2013 | Seman, Sr. et al. |
| 2013/0164498 A1 | 6/2013 | Langone et al. |
| 2013/0205920 A1 | 8/2013 | Tow |
| 2013/0209600 A1 | 8/2013 | Tow |
| 2013/0221192 A1 | 8/2013 | Rocco et al. |
| 2013/0233471 A1 | 9/2013 | Kappesser et al. |
| 2013/0241102 A1 | 9/2013 | Rodgers et al. |
| 2013/0320467 A1 | 12/2013 | Buchanan et al. |
| 2013/0327917 A1 | 12/2013 | Steiner et al. |
| 2013/0337256 A1 | 12/2013 | Farmer et al. |
| 2013/0337265 A1 | 12/2013 | Farmer |
| 2014/0034214 A1 | 2/2014 | Boyer et al. |
| 2014/0036035 A1 | 2/2014 | Buser et al. |
| 2014/0039663 A1 | 2/2014 | Boyer et al. |
| 2014/0044822 A1 | 2/2014 | Mulliken |
| 2014/0048969 A1 | 2/2014 | Swanson et al. |
| 2014/0048970 A1 | 2/2014 | Batchelder et al. |
| 2014/0061974 A1 | 3/2014 | Tyler |
| 2014/0065847 A1 | 3/2014 | Salmon et al. |
| 2014/0090528 A1 | 4/2014 | Graf |
| 2014/0120197 A1 | 5/2014 | Swanson et al. |
| 2014/0121813 A1 | 5/2014 | Schmehl |
| 2014/0154347 A1 | 6/2014 | Dilworth et al. |
| 2014/0159284 A1 | 6/2014 | Leavitt |
| 2014/0175706 A1 | 6/2014 | Kritchman |
| 2014/0210137 A1 | 7/2014 | Patterson et al. |
| 2014/0232035 A1 | 8/2014 | Bheda |
| 2014/0265037 A1 | 9/2014 | Stirling et al. |
| 2014/0268604 A1 | 9/2014 | Wicker et al. |
| 2014/0277661 A1 | 9/2014 | Amadio et al. |
| 2014/0287139 A1 | 9/2014 | Farmer et al. |
| 2014/0291886 A1 | 10/2014 | Mark et al. |
| 2014/0322383 A1 | 10/2014 | Rutter |
| 2014/0328963 A1 | 11/2014 | Mark et al. |
| 2014/0328964 A1 | 11/2014 | Mark et al. |
| 2014/0358273 A1 | 12/2014 | LaBossiere et al. |
| 2014/0361460 A1 | 12/2014 | Mark |
| 2015/0014885 A1 | 1/2015 | Hofmann et al. |
| 2015/0037446 A1 | 2/2015 | Douglass et al. |
| 2015/0165666 A1 | 6/2015 | Butcher et al. |
| 2015/0165690 A1 | 6/2015 | Tow |
| 2015/0165691 A1 | 6/2015 | Mark et al. |
| 2015/0183161 A1 | 7/2015 | Molinari et al. |
| 2015/0197063 A1 | 7/2015 | Shinar et al. |
| 2015/0201499 A1 | 7/2015 | Shinar et al. |
| 2015/0239178 A1 | 8/2015 | Armstrong |
| 2015/0242737 A1 | 8/2015 | Glazberg et al. |
| 2015/0266243 A1 | 9/2015 | Mark et al. |
| 2015/0266244 A1 | 9/2015 | Page |
| 2015/0287247 A1 | 10/2015 | Willis et al. |
| 2015/0290875 A1 | 10/2015 | Mark et al. |
| 2015/0298393 A1 | 10/2015 | Suarez |
| 2015/0321427 A1 | 11/2015 | Gunnarsson et al. |
| 2015/0342720 A1 | 12/2015 | Koc et al. |
| 2016/0067927 A1 | 3/2016 | Voris et al. |
| 2016/0068678 A1 | 3/2016 | Luo et al. |
| 2016/0075089 A1 | 3/2016 | Royo et al. |
| 2016/0114432 A1 | 4/2016 | Ferrar et al. |
| 2016/0120040 A1 | 4/2016 | Elmieh et al. |
| 2016/0129634 A1 | 5/2016 | Keicher et al. |
| 2016/0179064 A1 | 6/2016 | Arthur et al. |
| 2016/0192741 A1 | 7/2016 | Mark |
| 2016/0221259 A1 | 8/2016 | Kobida et al. |
| 2016/0257033 A1 | 9/2016 | Jayanti et al. |
| 2016/0263832 A1 | 9/2016 | Bui et al. |
| 2016/0290880 A1 | 10/2016 | Lewis et al. |
| 2016/0303794 A1 | 10/2016 | Atwood et al. |
| 2016/0325491 A1 | 11/2016 | Sweeney et al. |
| 2016/0346997 A1 | 12/2016 | Lewis et al. |
| 2016/0361873 A1 | 12/2016 | Maier |
| 2017/0021564 A1 | 1/2017 | Ooba et al. |
| 2017/0057164 A1 | 3/2017 | Hemphill et al. |
| 2017/0057170 A1 | 3/2017 | Gupta et al. |
| 2017/0080642 A1 | 3/2017 | Tyler |
| 2017/0087635 A1 | 3/2017 | Wilkes et al. |
| 2017/0106594 A1 | 4/2017 | Gardiner |
| 2017/0129170 A1 | 5/2017 | Kim et al. |
| 2017/0129171 A1 | 5/2017 | Gardner et al. |
| 2017/0136703 A1 | 5/2017 | Hayes et al. |
| 2017/0136707 A1 | 5/2017 | Batchelder et al. |
| 2017/0137955 A1 | 5/2017 | Hofmann et al. |
| 2017/0151713 A1 | 6/2017 | Steele |
| 2017/0173889 A1 | 6/2017 | Thomas-Lepore et al. |
| 2017/0255183 A1 | 9/2017 | Clement et al. |
| 2017/0259502 A1 | 9/2017 | Chapiro et al. |
| 2017/0361497 A1 | 12/2017 | Crescenti Savall et al. |
| 2019/0022922 A1 | 1/2019 | Swanson et al. |

FOREIGN PATENT DOCUMENTS

| | | |
|---|---|---|
| CN | 101300299 A | 11/2008 |
| CN | 101484397 A | 7/2009 |
| CN | 101689229 A | 3/2010 |
| CN | 101801647 A | 8/2010 |
| CN | 101815746 A | 8/2010 |
| CN | 104149339 A | 11/2014 |
| DE | 1102257 A1 | 7/1992 |
| EP | 2762520 A1 | 8/2014 |
| JP | S58-122116 A | 7/1983 |

(56) References Cited

FOREIGN PATENT DOCUMENTS

| | | |
|---|---|---|
| JP | 1-266231 A | 10/1989 |
| JP | H7-117141 A | 5/1995 |
| JP | H11207828 A | 8/1999 |
| JP | 2003-534159 A | 11/2003 |
| JP | 2004-331706 A | 11/2004 |
| JP | 2010535117 A | 11/2010 |
| JP | 2012-97449 A | 5/2012 |
| KR | 20100004475 A | 1/2010 |
| KR | 100995983 B1 | 11/2010 |
| KR | 101172859 B1 | 8/2012 |
| WO | 0189714 A1 | 11/2001 |
| WO | 2004050323 A1 | 6/2004 |
| WO | 2009009137 A1 | 1/2009 |
| WO | 2013017284 A2 | 2/2013 |
| WO | 2014028826 A1 | 2/2014 |
| WO | 2014153535 A2 | 9/2014 |
| WO | 2014193505 A1 | 12/2014 |
| WO | 2015042422 A1 | 3/2015 |
| WO | 2015061855 A1 | 5/2015 |
| WO | 2015077262 A1 | 5/2015 |
| WO | 2015120429 A1 | 8/2015 |

OTHER PUBLICATIONS

This 3D printer could allow ISS components to be created in space—YouTube. Published on May 20, 2016. Retreived from the internet: <URL:<https://www.youtube.com/watch?v=YwrTfOjEFtw>.
"Sandwich-structured Composite", wikipedia.com, Dec. 29, 2009 version, accessed Apr. 18, 2018 at https://en.wikipedia.org/w/index.php?title=Sandwich-structured_composite&oldid=334666649 (Year: 2009).
"Thermal Conductivity of Metals", The Engineering Toolbox, http://www.engineeringtoolbox.com/thermal-conductivity-metalsd_858.html, Sep. 15, 2017, 6 pages.
Bales, Steven, "Know Your Mold Coatings", Plastics Technology, http://www.ptonlinecom/articles/know-your-mold-coatings, Dec. 1, 2004, 8 pages.
Compton, B. G. et al., "3D-Printing of Lightweight Cellular Composites," Advanced Materials 2014, vol. 26, pp. 5930-5935.
Liu et al., "Wear of Materials", 2003, p. 1345.
Notification of Transmittal of the International Search Report and the Written Opinion of the International Searching Authority from Corresponding PCT/US2015/061151 dated Mar. 3, 2016.
Ahn et al., Anisoptropic material properties of fused deposition modeling ABS, Rapid Prorotyping vol. 8, No. 4, 2002, pp. 248-257.
August et al., Recent Developments in Automated Fiber Placement of Thermoplastic Composites, SAMPE Technica Conference Proceedings, Wichita, KS, Oct. 23, 2013.
Dell'Anno et al. , Automated Manufacture of 3D Reinforced Aerospace Composite Structures, International Journal of Structural Integrity, 2012, vol. 3, Iss 1, pp. 22-40.
Devleig et al., High-Speed Fiber Placement on Large Complex Structures, No. 2007-01-3843 SAE International 2007.
Hasenjaeger, Programming and Simulating Automated Fiber Placement (AFP) CNC Machines, SAMPE Journal, vol. 49, No. 6, Nov./Dec. 2013.
Hossain et al., Improving Tensile Mechanical Properties of FDM-Manufactured Specimens via Modifying Build Parameters, Proceedings of Solid Freeform Fabrication Symposium, Austin, Texas, Aug. 16, 2013.
Lamontia et al., "Contoured Tape Laying and Fiber Placement Heads for Automated Fiber Placement of Large Composite Aerospace Structures," 34th ISTC, Baltimore, Md, Nov. 4-7, 2002.
Vondo et al., Overview of Thermoplastic Composite ATL and AFP Technologies, ITHEC 2012, Oct. 30, 2012, Messe Bremen, Germany.
Rower, Robot Driven Automatic Tapehead for Complex Composite Lay-ups, No. 10AMAF-0066, SAE International 2010, Aerospace Manufacturing and Automated Fastening Conference & Exhibition, Sep. 28, 2010.
Slocum, Alexander: "Kinematic Couplings: A Review of Design Principles and Applications", International Journal of Machine Tools and Manufacture 50.4 (2010): 310-327.
Zieman et al.. Anisotropic Mechanical Properties of ABS Parts Fabricated by Fused Deposition Modelling, INTECH Open Access Publisher, 2012.
Brett Compton, "3D printing of composites with controlled architecture," Engineering Conferences International, ECI Digital Archives, Composites at Lake Louise (CALL 2015), Fall Nov. 9, 2015, pp. 30.
Brett G. Compton and Jennifer A. Lewis, "3D-Printing of Lighweight Cellular Compsites," Advanced Materials 2014, 26, pp. 5930-5935.
ATI technical data sheet, ATI metals, Allegheny Technologies Incorporated, https://www.atimetals.com/Products/Documents/ <http://www.atimetals.com/Products/Documents/datasheets/stainless-specialty-steel/martensitic/ati_410_420_425_mod_440a_440c_tds_en2_v2.pdf (Year: 2014).
Donghong, Ding et al: "A tool-path generation strategy for wire and arc additive manufacturing," The International Journal of Advanced Manufacturing Technology, vol. 73, No. 1-4, Apr. 11, 2014 (Apr. 11, 2014), pp. 173-183, XP055472255, London, ISSN: 0268-3768, DOI: 10.1007/s00170-014-5808-5.
Extended European Search Report from corresponding European Application No. 15860446.2 dated Sep. 3, 2018.
Gray IV, R.W., Baird, D.G and Bohn, J.H , 1998. Thermoplastic composites reinforced with long fiber thermotropic liquid crystalline polymers for fused deposition modeling. Polymer composites, 19(4), pp. 383-394. (Year: 1998).
"List of thermal conductives" https://en.wikipedia.org/wiki/List_of_thermal_conductivities, accessed Mar. 27, 2019 (Year 2019).
"Printed strain gauges for aircraft load detection using Aerosol Jet printing", Fraunhofer, 39 pages (Year: 2011).
Gray, R.W. IV et al., 1997, Effects ofProcessing Conditions on Prototypes Reinforced with TLCPs for Fused Deposition Modeling, In 1997 International Solid Freeform Fabrication Symposium (Year: 1998).
https://community.ultimaker.com/topic/3248-some-questions-on-perimeters-100-infill-extrusion-width/ (Year: 2013).
Lantern Robotics (https://www.fabbaloo.com/blog/2014/4/18/how-to-make-any-3d-printed-part-much-stronger and see https:// imgur.com/a/EHxkE & https://www.reddit.com/r/3Dprinting/comments/22jwlm/njecting_hot_melt_adhesive_for_100_solid_faster/ (Year: 2014).
Shofner, M.L. et al., 2003, Nanofiber-reinforced polymers prepared by fused deposition modeling, Journal of applied polymer science, 89(11), pp. 3081-3090 (Year: 2003).
Shofner, M.L. et al., 2003, Single wall nanotube and vapor grown carbon fiber reinforced polymers processed by extrusion freeform fabrication. Composites Part A: Applied Science and Manufacturing, 34( 12), pp. 1207-1217 (Year 2003).

* cited by examiner

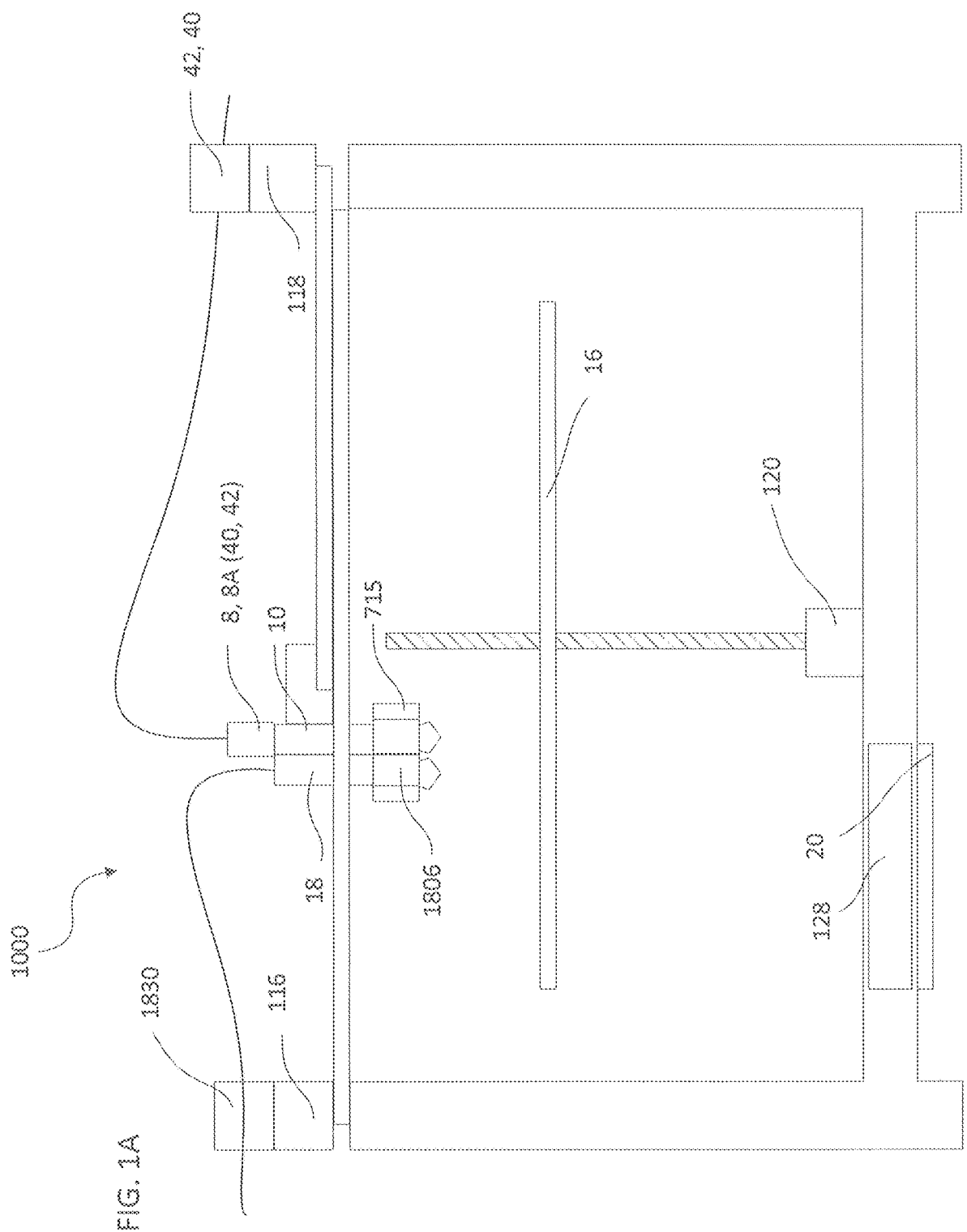

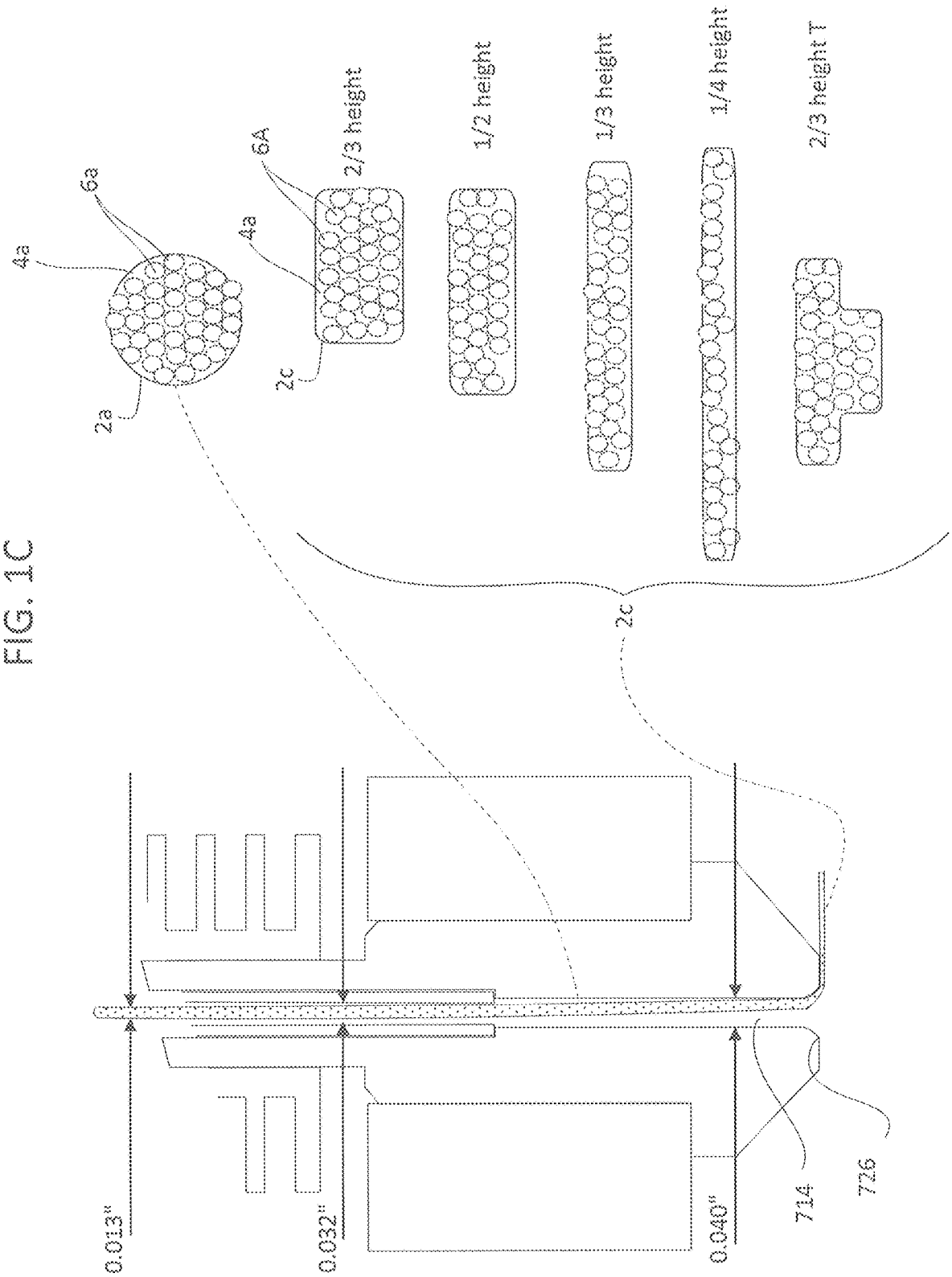

FIG. 1D  FFF CROSS SECTIONS
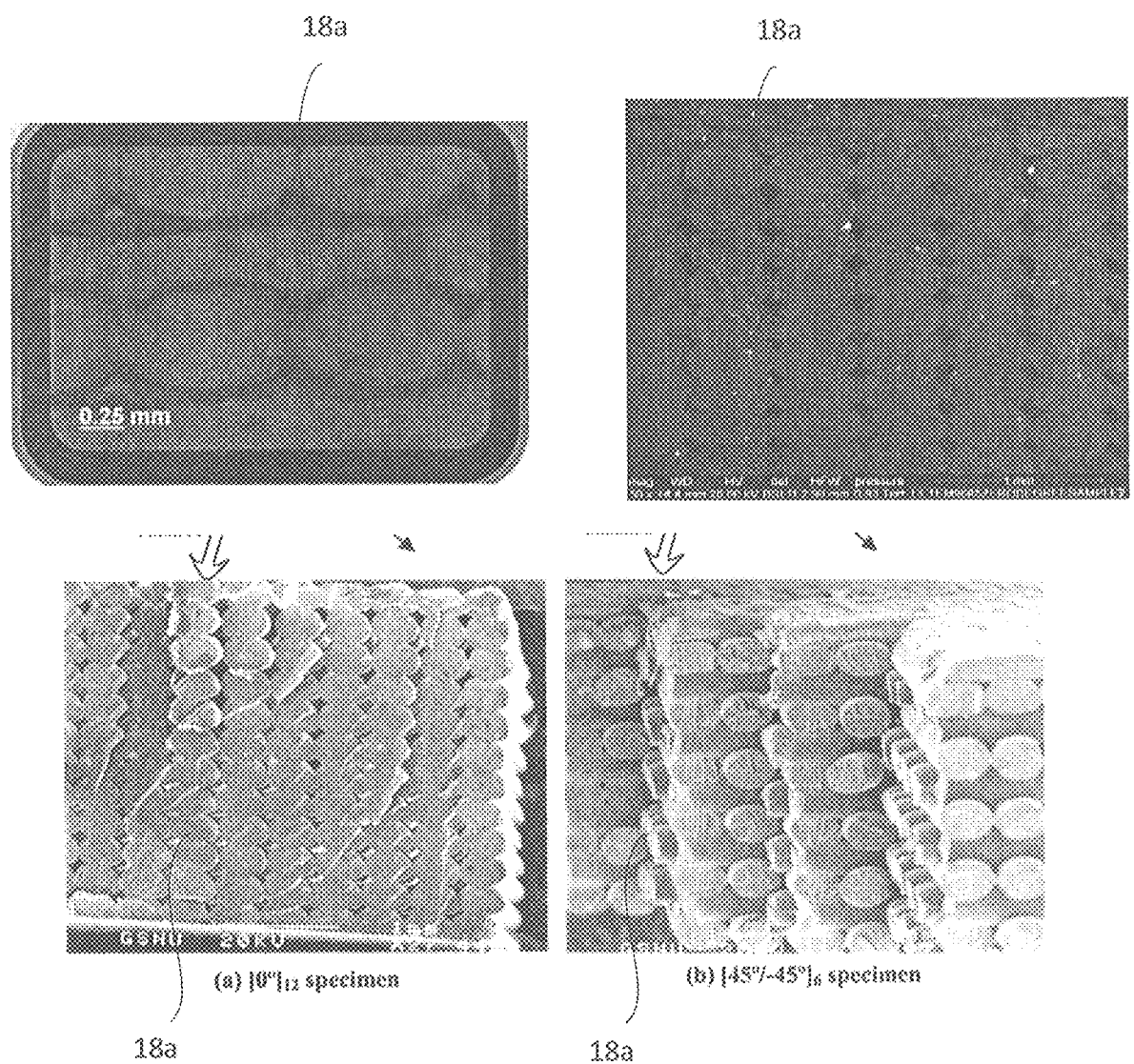

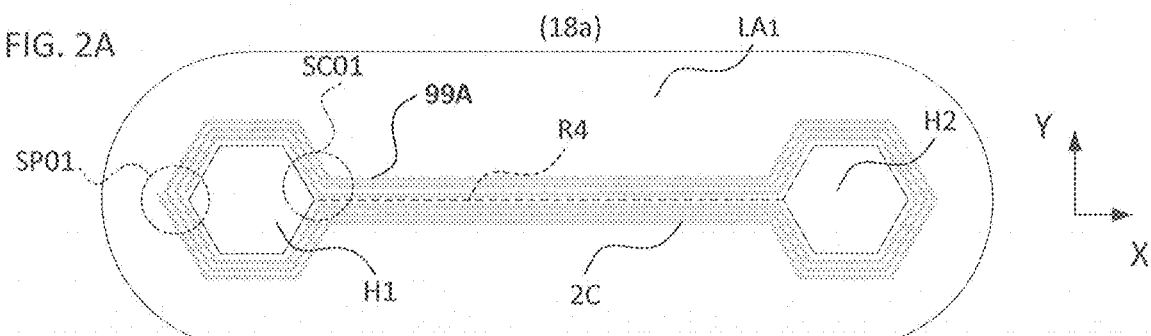
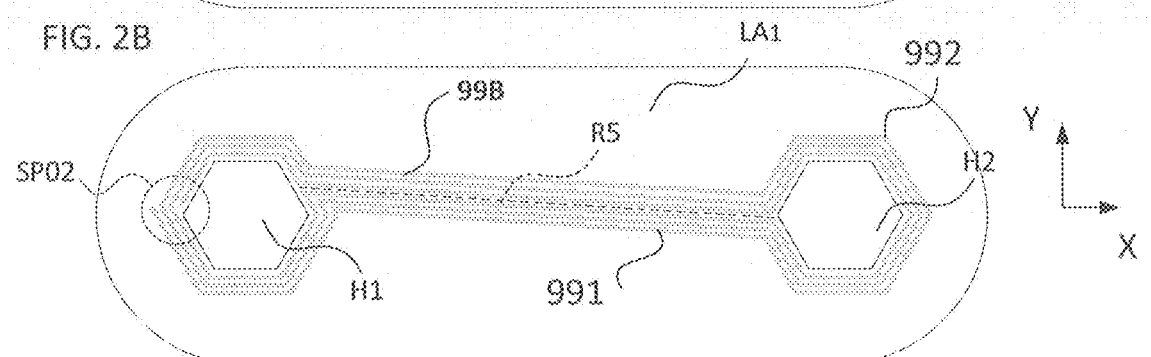
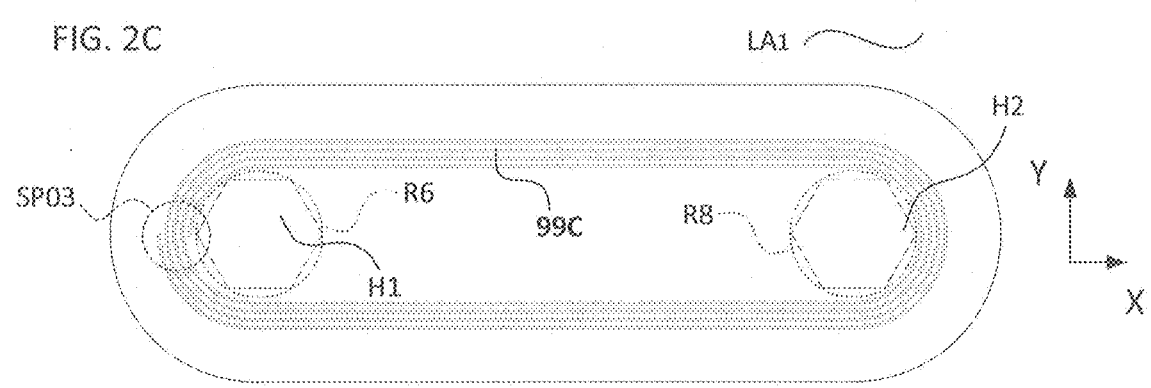
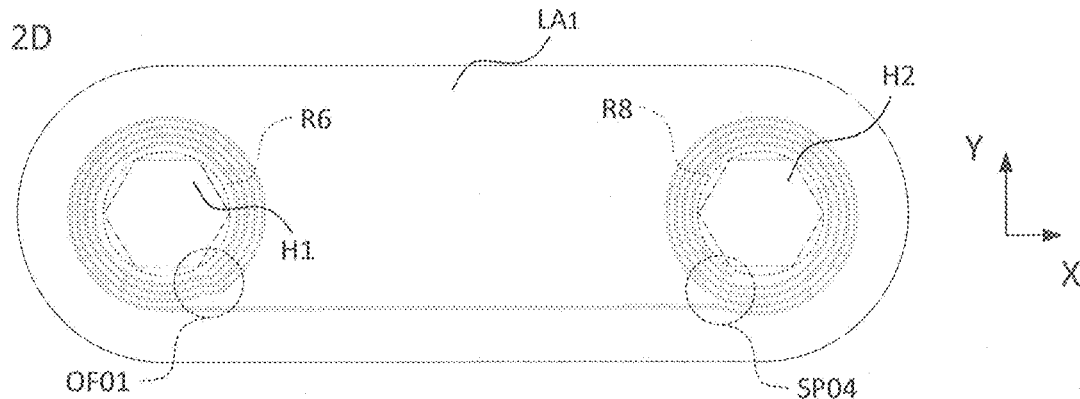

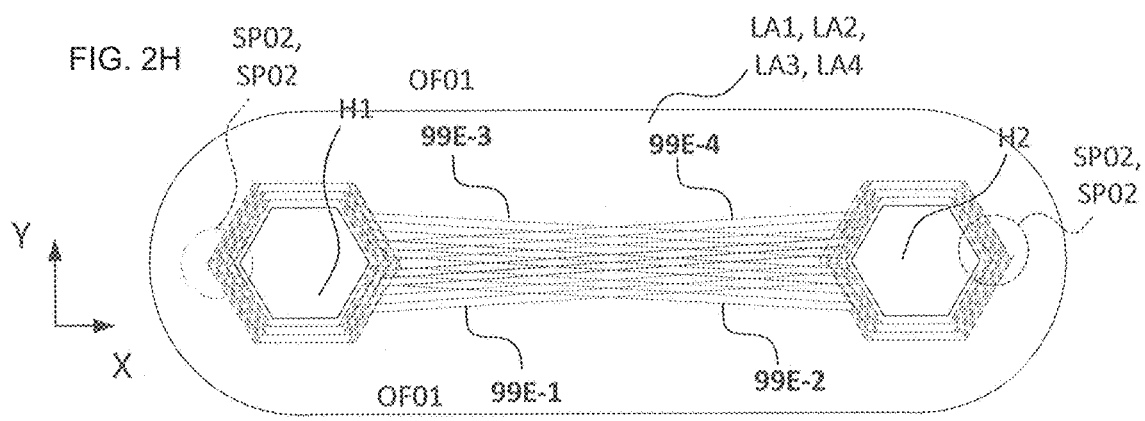
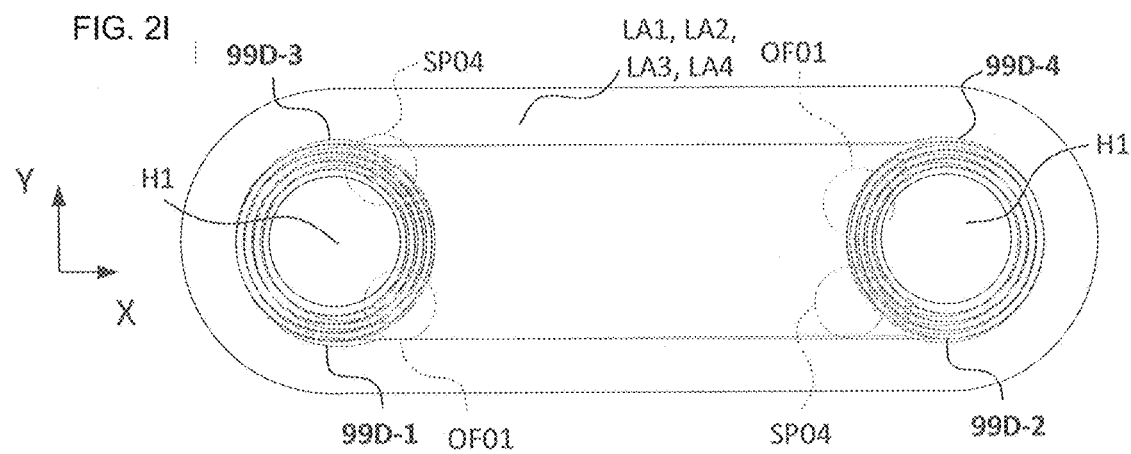
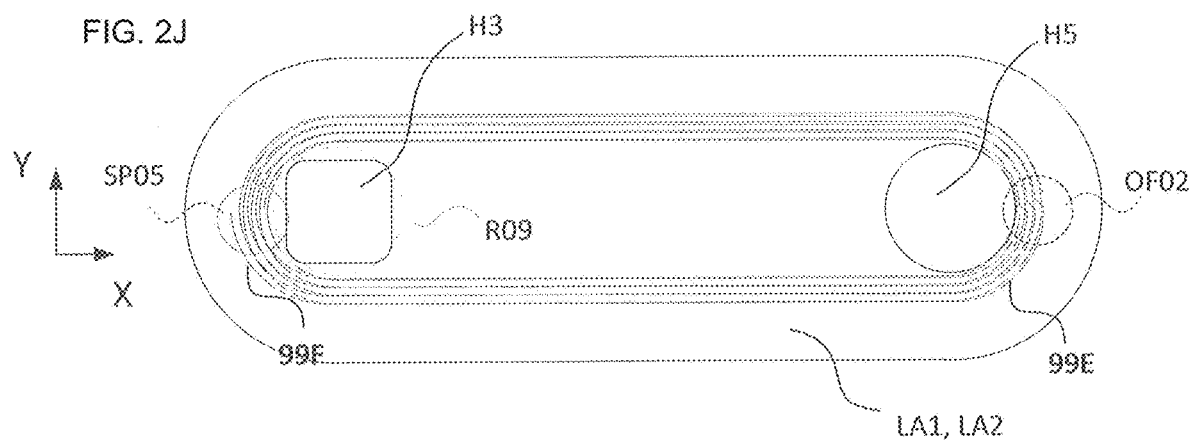

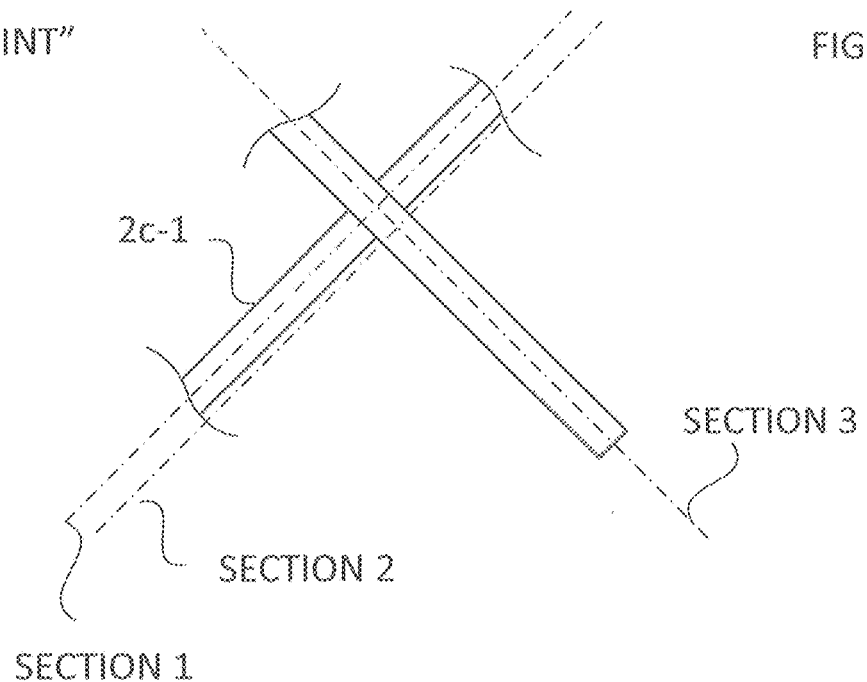
"CROSSING POINT" "JUMP" FIG. 3A
HIGH COMPRESSION, LAYER HEIGHT CONSTANT
E.G. FILAMENT A: 0.1 mm, FILAMENT B: 0.1 mm
NEAR NORMAL SPEED, SOME SYSTEM DEFLECTION
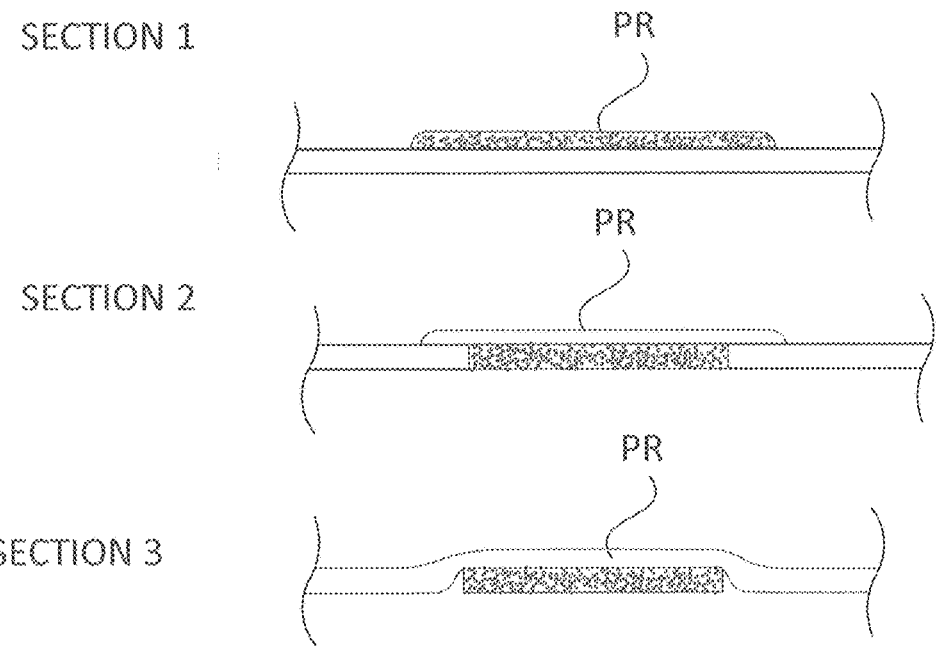

"CROSSING POINT"
"JUMP"
FIG. 3B
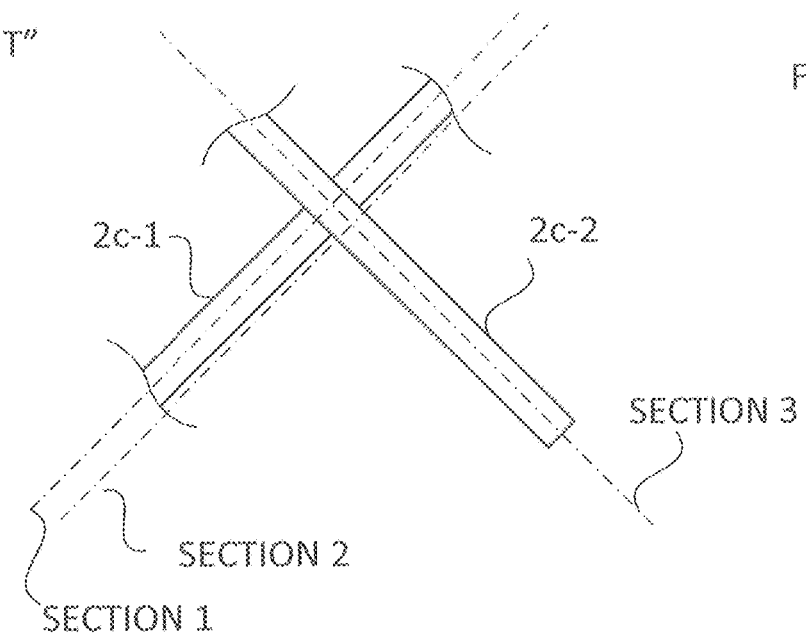
HIGH COMPRESSION, LAYER HEIGHT CHANGED
E.G. FILAMENT A: 0.1 mm, FILAMENT B: 0.2 mm
NEAR NORMAL SPEED, LOWER SYSTEM DEFLECTION
SECTION 1
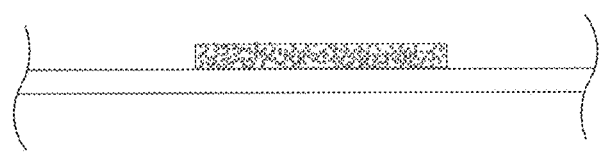
SECTION 2
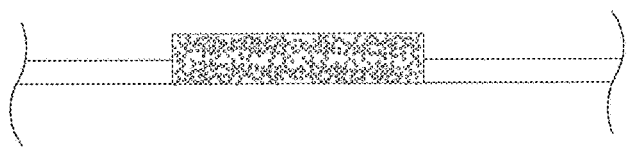
SECTION 3
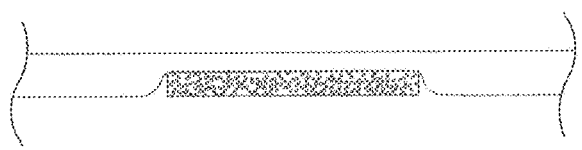

"CROSSING POINT" "JUMP"  FIG. 3C
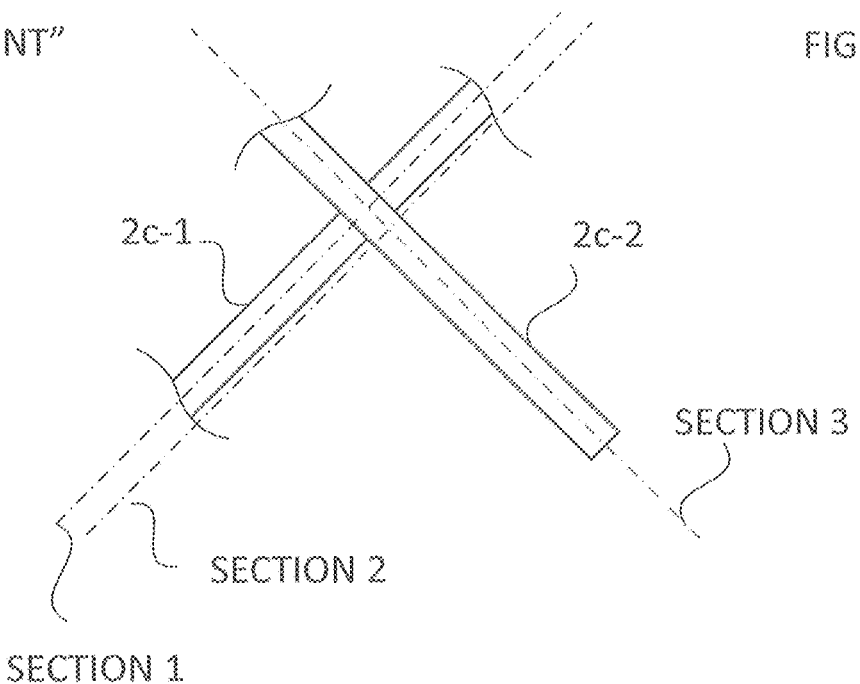
HIGH COMPRESSION, LAYER HEIGHT CONSTANT
E.G. FILAMENT A: 0.1 mm, FILAMENT B: 0.1 mm
SLOWER SPEED, LOWER SYSTEM DEFLECTION
SECTION 1
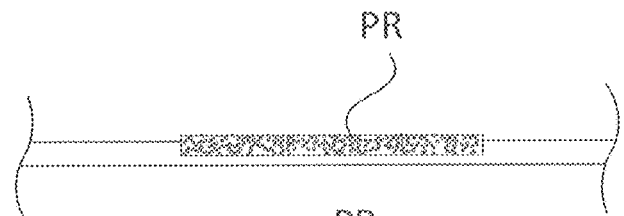
SECTION 2
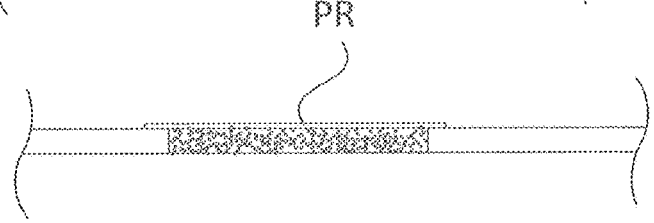
SECTION 3
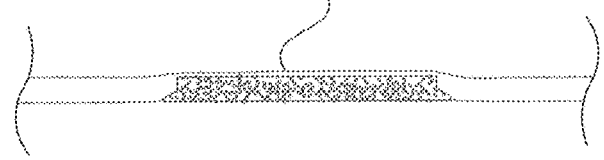

FIG. 3D
INTRALAYER
BUFFER
ZONE –
WITHOUT
REMELTING
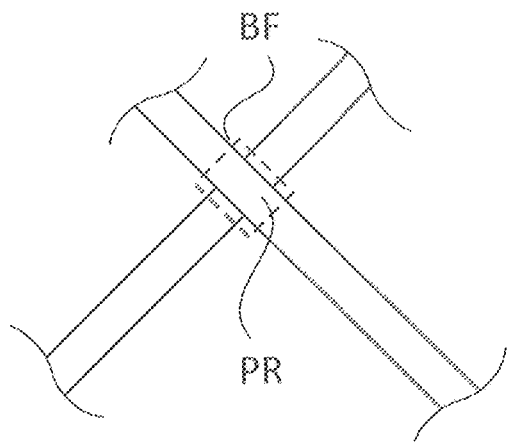
FIG. 3E
INTRALAYER
BUFFER
ZONE – WITH
REMELTING
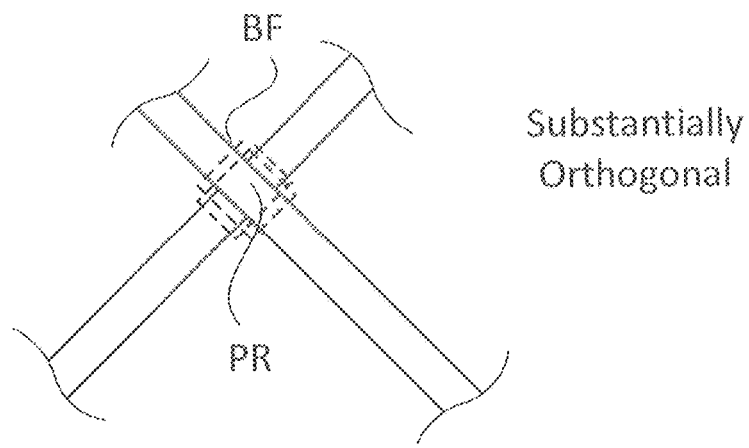
Substantially Orthogonal
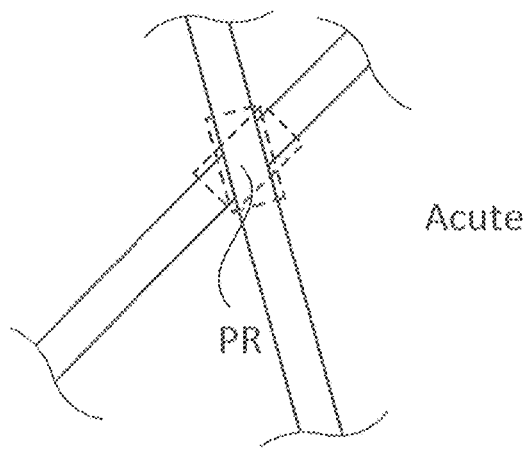
Acute
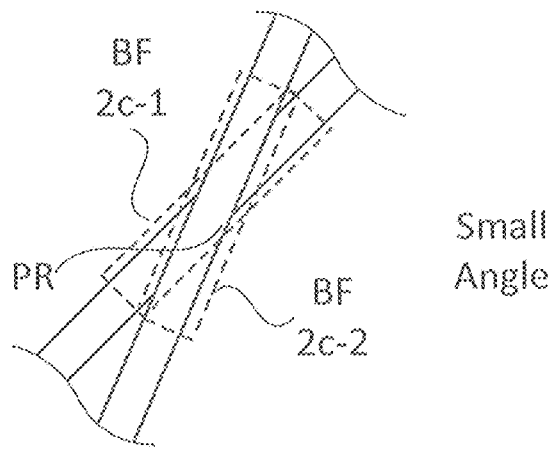
Small Angle

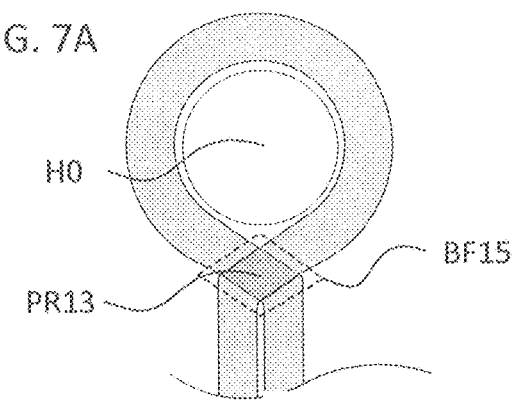
FIG. 7A
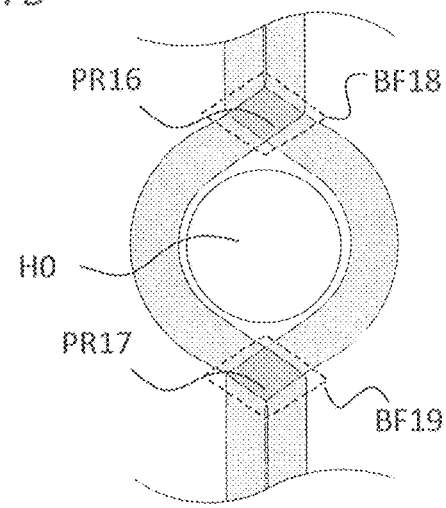
FIG. 7D
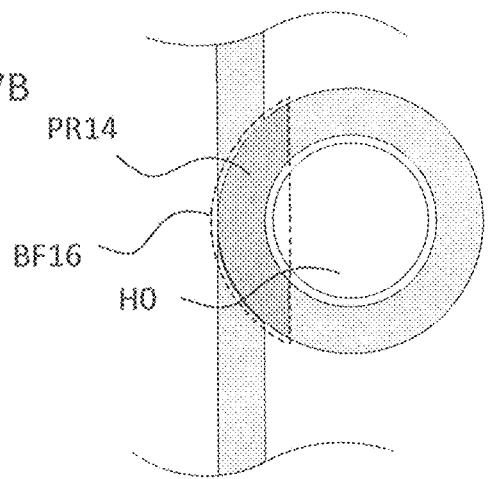
FIG. 7B
FIG. 7C
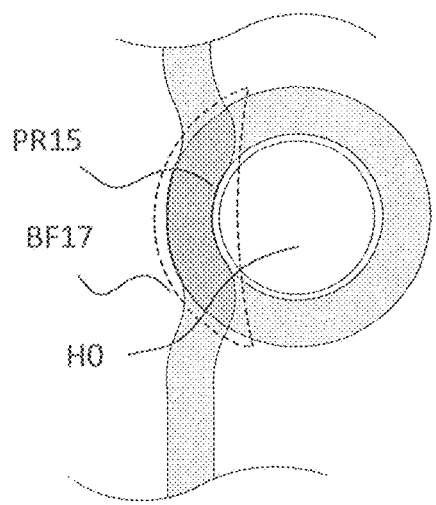
FIG. 7E
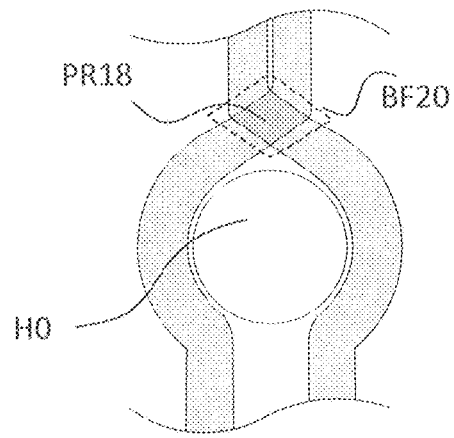

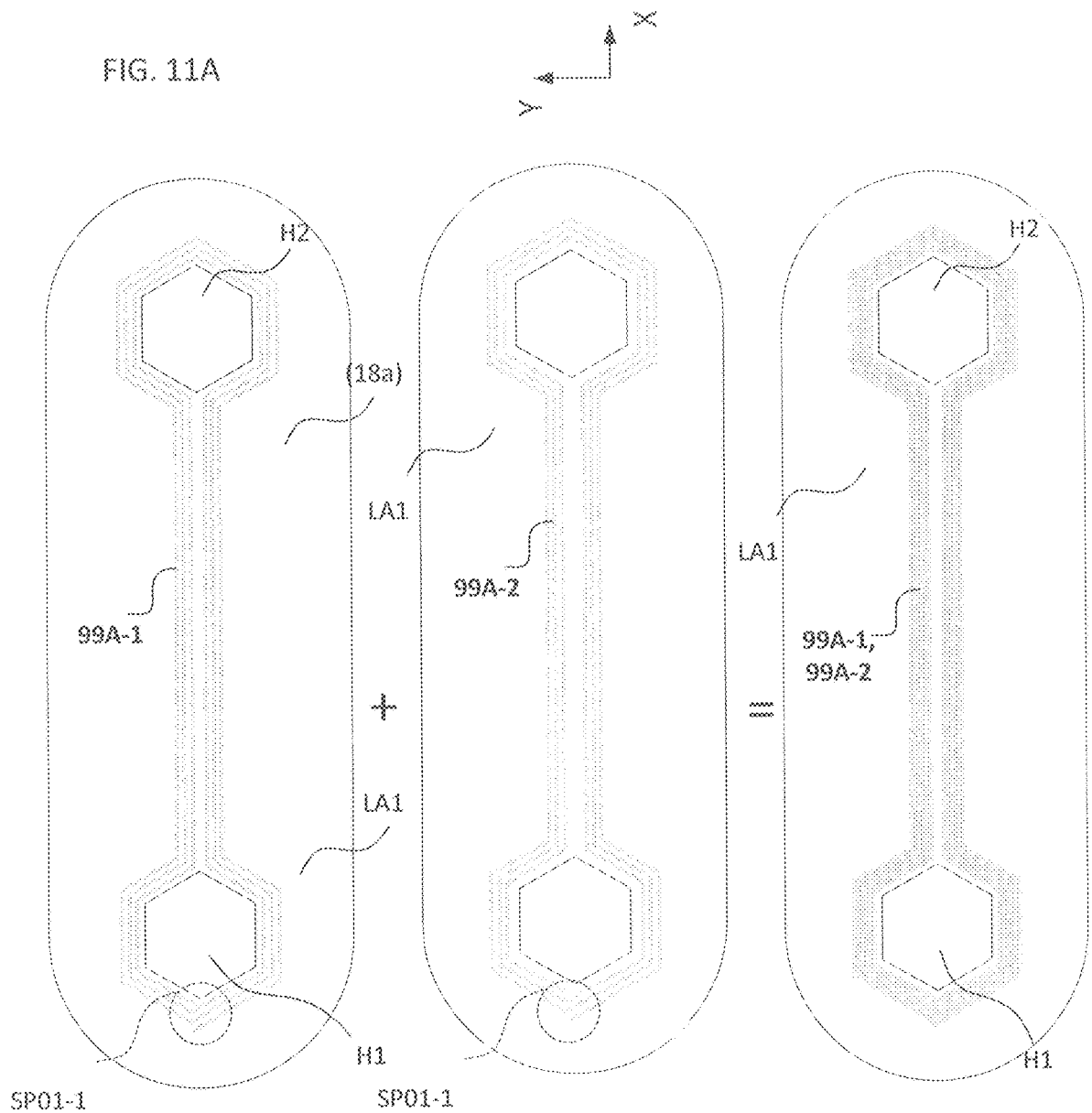

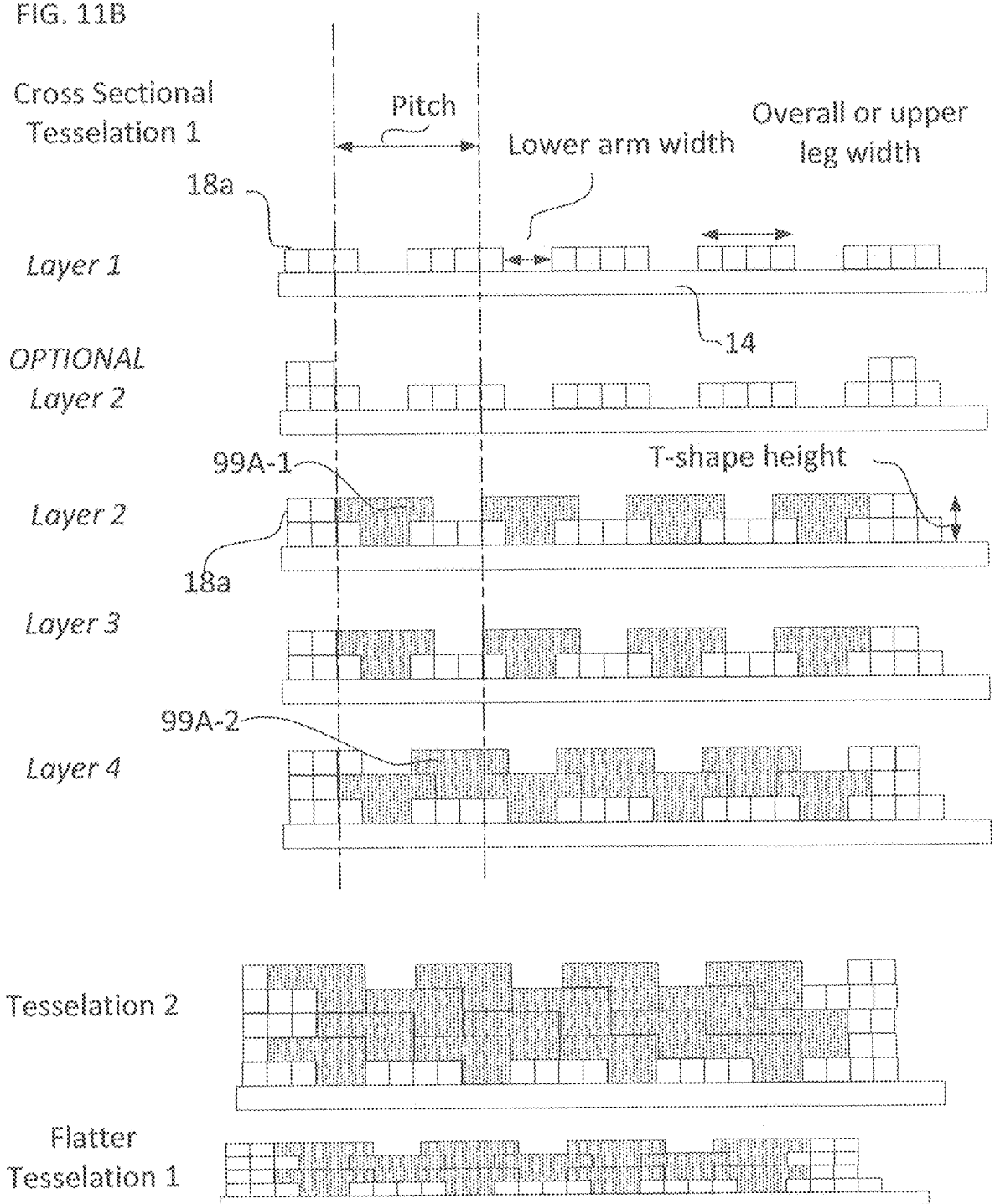

FIG. 15A  
"LOOP"  
"CROSSED LOOP"
FIG. 15B  
"BIGHT"
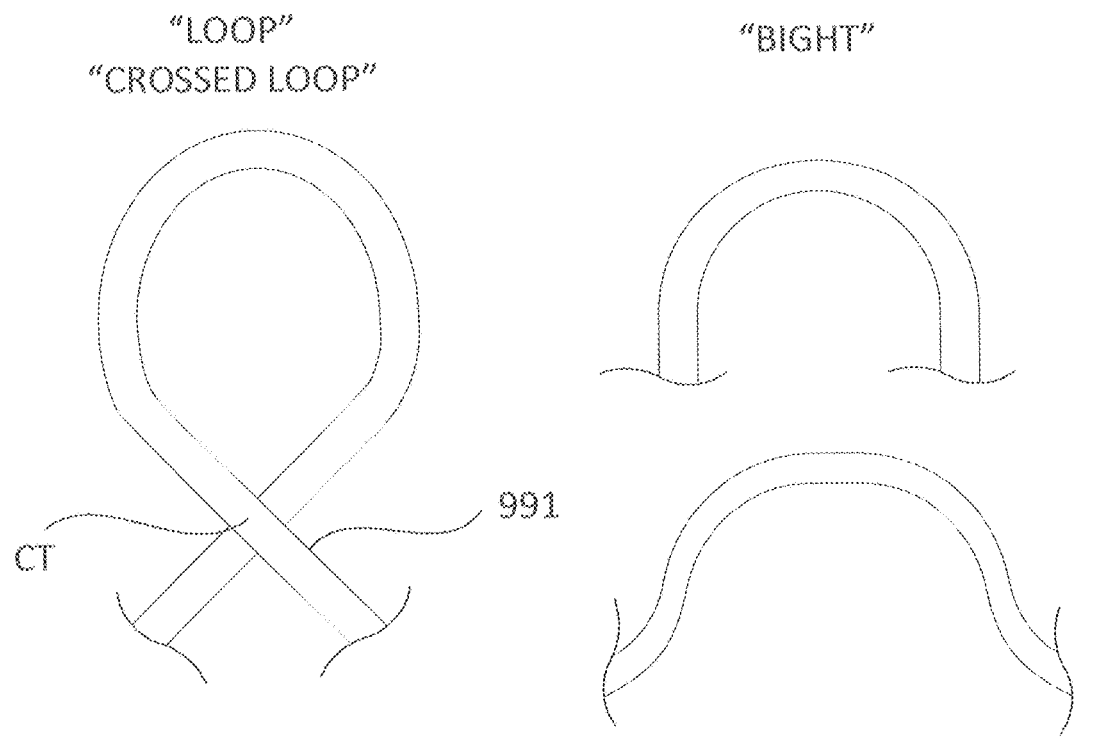
FIG. 15C "OPEN LOOP"
FIG. 15D "TOUCHING LOOP"
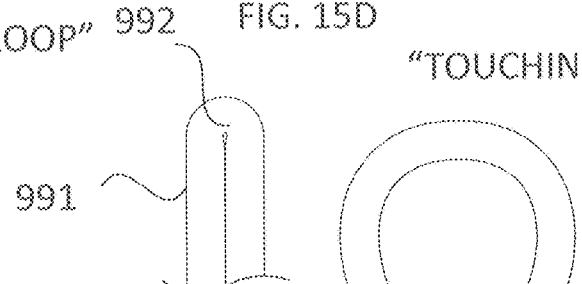

COMPOSITE FILAMENT 3D PRINTING USING COMPLEMENTARY REINFORCEMENT FORMATIONS

CROSS-REFERENCE TO RELATED APPLICATIONS

This application claims the benefit under 35 U.S.C. § 119(e) of U.S. provisional application Ser. No. 62/080,890 filed Nov. 17, 2014; and 62/172,021 filed Jun. 5, 2015, the disclosures of which are herein incorporated by reference in their entirety; and is a continuation-in-part of U.S. patent application Ser. No. 14/491,439 filed Sep. 19, 2014, the disclosure of which is herein incorporated by reference in its entirety. U.S. patent application Ser. No. 14/491,439 claims the benefit under 35 U.S.C. § 119(e) of U.S. provisional application Ser. No. 61/880,129, filed Sep. 19, 2013; 61/881,946, filed Sep. 24, 2013; 61/883,440, filed Sep. 27, 2013; 61/902,256, filed Nov. 10, 2013, 61/907,431, filed Nov. 22, 2013; 61/804,235, filed Mar. 22, 2013; 61/815,531, filed Apr. 24, 2014; 61/831,600, filed Jun. 5, 2013; 61/847,113, filed Jul. 17, 2013, and 61/878,029, filed Sep. 15, 2013, the disclosures of which are herein incorporated by reference in their entirety; and is a continuation-in-part of each of U.S. patent application Ser. No. 14/222,318, filed Mar. 21, 2014; U.S. patent application Ser. No. 14/297,437, filed Jun. 5, 2014; and U.S. patent application Ser. No. 14/333,881 [now U.S. Pat. No. 9,149,988], filed Jul. 17, 2014; the disclosures of which are herein incorporated by reference in their entirety. This application also relates to U.S. patent application Ser. No. 14/944,088 entitled MULTILAYER FIBER REINFORCEMENT DESIGN FOR 3D PRINTING, by Abraham Lawrence Parangi, David Steven Benhaim, Benjamin Tsu Sklaroff, Gregory Thomas Mark, and Rick Bryan Woodruff, filed on even date herewith and incorporated herein by reference.

FIELD

Aspects relate to three dimensional printing.

BACKGROUND

In Composite Filament Fabrication ("CFF"), toolpaths may be generated, traced and/or followed by an continuous fiber composite reinforced 3D printer, in the form of deposited bonded ranks or composite swaths. Toolpaths may follow contours (e.g., within an offset path parallel to a contour), follow patterns (e.g., boustrophedon rows, or spirals), may form transitions between offsets and printed areas, e.g., form a crossover from one offset to an adjacent offset. A core reinforced fiber toolpath may be cloned into an adjacent layer (e.g., "cloned" meaning identically), or reproduced with changes that avoid stacking seams or stress concentrations. Different core reinforced toolpaths having a different directions of reinforcement may be used in different layers.

Additionally, and/or alternatively, as discussed in the present disclosure, new toolpaths and modifications of these toolpaths may overlap toolpaths of different trajectories in a manner to create complementary toolpaths within, between layers and among layers of matrix and/or fill material.

SUMMARY

In one embodiment, or embodiment of the invention, a method for additive manufacturing may include supplying a multi-strand core reinforced filament including a flowable matrix material permeating or embedding substantially continuous reinforcing strands (optionally of a material having a tensile strength of greater than 300 MPa). The substantially continuous reinforcing strands may extend in a direction parallel to a length of the filament. A first consolidated composite swath (optionally of a height less than ½ the width of the filament) may be deposited in a first reinforcement formation including at least one straight path and at least one curved path, by flowing the matrix material and applying an ironing force that spreads the reinforcing strands within the filament against a deposition surface. A second consolidated composite swath (optionally of a height less than ½ the width of the filament) may be deposited in a second reinforcement formation including at least one straight path and at least one curved path, by flowing the matrix material and applying an ironing force to spread the reinforcing strands within the filament against the first consolidated composite swath.

In another embodiment, or embodiment of the invention, a 3D printer for additive manufacturing of a part may include a composite swath deposition head that deposits consolidated composite swaths from a supply of multi-strand core reinforced filament including a flowable matrix material and a plurality of substantially continuous reinforcing strands, the substantially continuous reinforcing strands extending in a direction parallel to a length of the filament. A motorized drive may relatively move at least the composite swath deposition head and a build plate supporting a 3D printed part in at least three degrees of freedom. A controller may be configured to control the motorized drive and the composite swath deposition head (each of which the controller is operatively connected to) to build the 3D printed part by depositing a first consolidated composite swath in a first reinforcement formation including at least one straight path and at least one curved path, by flowing the matrix material and applying, with the composite swath deposition head, an ironing force that spreads the reinforcing strands within the filament against a deposition surface. The controller may further be configured to deposit a second consolidated composite swath in a second reinforcement formation including at least one straight path and at least one curved path, by flowing the matrix material and applying, with the composite swath deposition head, an ironing force to spread the reinforcing strands within the filament against the first consolidated composite swath.

Optionally, at least one cover of fill material or multi-strand core reinforced filament may be deposited in a layer adjacent the location at which the ironing force spreads the reinforcing strands of the second consolidated composite swath against the first consolidated composite swath, the cover having a thickness of less than the height of the layer.

Further optionally, the method may include, or the 3D printer controller may be configured to control the 3D printer components to which it is operatively connected to build a part by, turning the first fused composite swath according to the first reinforcement formation toward a different direction at a first location, and/or turning the second consolidated fibers swath according to the second reinforcement formation toward a different direction at a second location displaced from the first location in at least two orthogonal directions.

Still further optionally, the first consolidated composite swath and the second consolidated composite swath may be deposited as a continuous composite swath within a single shell of an additive manufacturing process. Alternatively or in addition, the second consolidated composite swath may be deposited with less ironing force than the first consolidated composite swath; and/or the second consolidated composite swath may be deposited at a nozzle height from the first consolidated composite swath that is different from a previously deposited layer height; and/or fill material may be deposited horizontally about the common overlap of the first consolidated composite swath and the second consolidated composite swath at a width of 1/10 to 2 times the width of the first consolidated composite swath.

Further optionally, the linear speed at which the second consolidated composite swath is ironed against the first consolidated composite swath is 1/10 to 9/10 a linear speed at which the first consolidated composite swath was deposited; and/or a filament feeding rate at which the filament for the second consolidated composite swath is supplied may be greater than the linear speed at which the second consolidated composite swath is ironed against the first consolidated composite swath by 1 to 20%.

Alternatively or in addition, a tension along the composite swath at which the first consolidated composite swath is deposited may be reduced at a location at which the second consolidated composite swath is ironed against the first consolidated composite swath.

Further optionally, the method may include, or the 3D printer controller may be configured to control the 3D printer components to which it is operatively connected to build a part by, depositing the second consolidated composite swath in a second reinforcement formation that extends substantially parallel to the first reinforcement formation, wherein composite swaths of the second reinforcement formation may be deposited at a second pitch substantially the same as a first pitch of the first reinforcement formation and displaced by a distance of substantially half the first pitch.

Alternatively or in addition, the first consolidated composite swath and second consolidated composite swath may be deposited in a location adjacent to and reinforcing a negative subcontour, and/or the first consolidated composite swath and second consolidated composite swath may be deposited in respective first and second layers in locations adjacent to and reinforcing a negative subcontour extending through each of the respective first and second layers.

Alternatively or in addition, the method may include, or the 3D printer controller may be configured to control the 3D printer components to which it is operatively connected to build a part by, depositing the first consolidated composite swath and the second consolidated composite swath as a continuous composite swath spanning two shells of an additive manufacturing process; and/or depositing the first consolidated composite swath in a first reinforcement formation that has a higher strength in tension between a first negative contour and a second negative contour than the second reinforcement formation.

In a further embodiment, or embodiment of the invention, a method for printing a part with a three dimensional printer may include receiving toolpath instructions having a plurality of single layer toolpaths encoded with first and second degrees of freedom, and/or supplying a strand reinforced composite filament having reinforcing strands embedded in a flowable matrix. Consolidated composite swaths may be deposited by controlling a print head to output the strand reinforced composite filament with the reinforcing strands oriented parallel to a trajectory of the print head, and/or by controlling the print head to iron the strand reinforced composite filament to form consolidated composite swaths having reinforcing strands spread out against a surface. A first consolidated composite swath may be deposited according to a first single layer toolpath within a first layer, and/or a second consolidated composite swath may be deposited according to a second single layer toolpath within the same first layer, the second consolidated composite swath having a crossing point with the first consolidated composite swath within the same first layer. The second consolidated composite swath may be ironed to spread against the first consolidated composite swath.

In another embodiment, or embodiment of the invention, a 3D printer for additive manufacturing of a part may include a composite swath deposition head that deposits consolidated composite swaths from a supply of strand reinforced composite filament having reinforcing strands embedded in a flowable matrix, a motorized drive for relatively moving at least the composite swath deposition head and a build plate supporting a 3D printed part in at least three degrees of freedom, and a controller. The controller may be configured to control the motorized drive and the composite swath deposition head (each of which the controller is operatively connected to) to deposit consolidated composite swaths to build the 3D printed part according to toolpath instructions having a plurality of single layer toolpaths encoded with at least first and second degrees of freedom. The controller may be configured to control the composite swath deposition head to output the strand reinforced composite filament with the reinforcing strands oriented parallel to a trajectory of the composite swath deposition head, and/or control the composite swath deposition head to iron the strand reinforced composite filament to form consolidated composite swaths having reinforcing strands spread out against a surface. The controller may also be configured to deposit a first consolidated composite swath according to a first single layer toolpath within a first layer, and/or deposit a second consolidated composite swath according to a second single layer toolpath within the same first layer, the second consolidated composite swath having a crossing point with the first consolidated composite swath within the same first layer, and/or iron the second consolidated composite swath to spread against the first consolidated composite swath.

Optionally, the first and second single layer toolpaths may form a closed loop from the continuous strand reinforced composite filament, and the first and second consolidated composite swaths may form a crossing turn within the same first layer.

Further optionally, the closed loop and/or the crossing turn may be deposited in a location adjacent to and reinforcing a negative subcontour within an interior of the same first layer. Alternatively or in addition, a third consolidated composite swath may be deposited in a location adjacent to and reinforcing the closed loop and crossing turn in one of the same first layer or an adjacent second layer.

The method may also include, or the 3D printer controller may be configured to control the 3D printer components to which it is operatively connected to build a part by, alternatively or in addition, controlling the print head to iron the strand reinforced composite filament to form consolidated composite swaths having reinforcing strands spread out against a surface by, for example, flowing the matrix material, and/or applying an ironing force that spreads the reinforcing strands, and/or forming consolidated composite swaths of a height less than ½ the width of the strand reinforced composite filament.

In a further embodiment, or embodiment of the invention, a method for additive manufacturing may include supplying a strand reinforced composite filament including a flowable matrix material and a plurality of substantially continuous reinforcing strands of a fiber material having a tensile strength of greater than 300 MPa, the substantially continuous reinforcing strands extending in a direction parallel to a length of the filament. Toolpath instructions may be received having a plurality of single layer toolpaths encoded with first and second degrees of freedom. Composite swaths may be consolidated by, e.g., controlling the print head to iron the strand reinforced composite filament to less than ½ the width of the strand reinforced composite filament to form consolidated composite swaths having reinforcing strands spread out against a surface; and/or depositing a first reinforcement formation including a plurality of interconnected straight segments and curved segment; and/or depositing a second reinforcement formation including a plurality of interconnected straight segments and curved segments, different from the first reinforcement formation. On curved segments which change a direction of a connected straight segment by more than 45 degrees, the printhead may be controlled to deposit consolidated composite swaths in a toolpath that is different from the embedded path of the consolidated composite swath.

In an additional embodiment, or embodiment of the invention, 3D printer for additive manufacturing of a part may include a composite filament deposition head that deposits strand reinforced composite filament from a supply of strand reinforced composite filament including a flowable matrix material and a plurality of substantially continuous reinforcing strands of a fiber material having a tensile strength of greater than 300 MPa, the substantially continuous reinforcing strands extending in a direction parallel to a length of the filament, and a motorized drive for relatively moving at least the composite filament deposition head and a build plate supporting a 3D printed part in at least three degrees of freedom. A controller may be configured to control the motorized drive, the composite swath deposition head and the isotropic solidifying head (each of which to which the controller is operatively connected) to deposit consolidated composite swaths to build the 3D printed part according to toolpath instructions having a plurality of single layer toolpaths encoded with at least first and second degrees of freedom. The controller may further be configured to control the composite filament deposition head to iron the strand reinforced composite filament to less than ½ the width of the strand reinforced composite filament to form consolidated composite swaths having reinforcing strands spread out against a surface. The controller may further be configured to deposit a first reinforcement formation including a plurality of interconnected straight segments and curved segments. The controller may further be configured to deposit a second reinforcement formation including a plurality of interconnected straight segments and curved segments, different from the first reinforcement formation. The controller may further be configured to, on curved segments which change a direction of a connected straight segment by more than 45 degrees, control the composite filament deposition head to deposit consolidated composite swaths in a toolpath that is different from the embedded path of the consolidated composite swath.

Optionally, on curved segments which change a direction of a connected straight segment by more than 45 degrees, the printhead may be controlled to deposit consolidated composite swaths in a toolpath is a longer linear trajectory than the embedded path of the consolidated composite swath. Alternatively, or in addition, on curved segments which change a direction of a connected straight segment by more than 45 degrees, the printhead may be controlled to deposit consolidated composite swath in a toolpath that folds the consolidated composite swath in a curved segment of the consolidated composite swath. Further alternatively or in addition, on curved segments which change a direction of a connected straight segment by more than 45 degrees, the printhead may be controlled to deposit consolidated composite swaths in a toolpath that folds the consolidated composite swath by moving many fibers within the consolidated composite swath from one lateral location to a displaced lateral location along a curved segment of the consolidated composite path.

In another embodiment, or embodiment of the invention, a method for sparse fill in additive manufacturing may include supplying a multi-strand core reinforced filament including a flowable matrix material and a plurality of substantially continuous reinforcing strands (optionally of a material having a tensile strength of greater than 300 MPa), the substantially continuous reinforcing strands extending in a direction parallel to a length of the filament. Within a first layer, a first consolidated composite swath may be deposited (optionally of a height less than ½ the width of the filament) in a first reinforcement formation including a first plurality of parallel lengths each extending in a first direction by flowing the matrix material and applying an ironing force that spreads the reinforcing strands within the filament against a deposition surface. Within the same first layer, a second consolidated composite swath may be deposited (optionally of a height less than ½ the width of the filament) in a second reinforcement formation including a second plurality of parallel lengths each extending a second direction angled from the first direction by sixty degrees, by flowing the matrix material and applying an ironing force to spread the reinforcing strands within the filament against the first plurality of parallel lengths of the first consolidated composite swath. In a second layer above the first layer, a third consolidated composite swath may be deposited (optionally of a height less than ½ the width of the filament) in a third reinforcement formation including a third plurality of parallel lengths each extending a third direction angled from the first and second directions by sixty degrees, by flowing the matrix material and applying an ironing force to spread the reinforcing strands within the filament against the first and second pluralities of parallel lengths of the first and second consolidated composite swaths.

Optionally, the third consolidated composite swath may be deposited with the third plurality of parallel lengths each crossing an intersection of the first and second consolidated composite swaths. Alternatively, or in addition, the third consolidated composite swath may be deposited with the third plurality of parallel lengths each offset from an intersection of the first and second consolidated composite swaths.

In another embodiment, or embodiment of the invention, a method for sparse fill in additive manufacturing may include supplying a filament including a flowable polymer material. Within a first layer, rows of the flowable polymer material may be deposited in a first reinforcement formation including a first plurality of parallel lengths each extending in a first direction by flowing the flowable polymer material against a deposition surface. Within the same first layer, rows of the flowable polymer material may be deposited in a second reinforcement formation including a second plurality of parallel lengths each extending in a second direction angled from the first direction by sixty degrees, by flowing the flowable polymer material against the deposition surface and to thin out when the second plurality of parallel lengths crosses the first plurality of parallel lengths of the rows of the flowable polymer material. Within the same first layer, rows of the flowable polymer material may be deposited in a third reinforcement formation including a third plurality of parallel lengths each extending in a third direction angled from the first and second directions by sixty degrees, by flowing the matrix material against the deposition surface and to thin out when the third plurality of parallel lengths crosses the first and second pluralities of parallel lengths of the first and second rows of the flowable polymer material.

Optionally, supplying a filament may include supplying a multi-strand core reinforced filament including a flowable polymer matrix material and a plurality of substantially continuous reinforcing strands (optionally of a material having a tensile strength of greater than 300 MPa) extending in a direction parallel to a length of the filament. Each row of flowable polymer material may be deposited as a consolidated composite swath (optionally of a height less than ½ the width of the filament) by flowing the polymer matrix material against a previously deposited row and applying an ironing force that spreads the reinforcing strands within the filament against the previously deposited row. The third plurality of parallel lengths may be deposited with each parallel length offset from an intersection of the first and second consolidated parallel lengths.

In another embodiment, or embodiment of the invention, a method for generating three-dimensional toolpath instructions for a three dimensional printer may include receiving a three-dimensional geometry, then slicing the three-dimensional geometry into layers (or shells). Toolpath instructions may be generated to deposit consolidated composite swaths by ironing strand reinforced composite filament to form consolidated composite swaths having reinforcing strands spread out against a surface. Toolpath instructions may be generated to deposit a first consolidated composite swath according to a first single layer toolpath within a first layer of the layers. Toolpath instructions may also be generated to deposit a second consolidated composite swath according to a second single layer toolpath within the same first layer, the second consolidated composite swath having a crossing point with the first consolidated composite swath within the same first layer. Toolpath instructions may further be generated to iron the second consolidated composite swath to spread against the first consolidated composite swath within the same first layer.

BRIEF DESCRIPTION OF THE DRAWINGS

FIG. 1A is a schematic view of a continuous core reinforced filament deposition and fill material filament extrusion printer.

FIG. 1C is a close-up cross-section of a fiber printhead assembly and a set of different possible compression/consolidation shapes.

FIG. 1D is a set of exemplary cross sections of extruded, non-compressed "FDM" or "FFF" depositions.

FIG. 2A shows a reinforcement formation in a single layer of a connecting plate having two hexagonal holes.

FIG. 2B shows a reinforcement formation in a single layer of a connecting plate having two hexagonal holes, with a path change of FIG. 2A moved to a complementary location.

FIG. 2C shows a looped reinforcement formation, formed with a spiral building outward from a minimum composite swath length path that surrounds two holes.

FIG. 2D shows a reinforcement formation which reinforces in a hoop stress direction about each/both of two hexagonal or circular holes.

FIG. 2H shows four superpositions, i.e., layers of this pattern, mirrored vertically and horizontally, to distribute the stress concentrations variously among the four layers.

FIG. 2I illustrates that the stress concentrations/gaps in different kinds of toolpath strategy/reinforcement formations and different locations can be varied.

FIG. 2J shows the superposition of toolpaths or composite swath depositions or reinforcement formations of FIGS. 2E and 2F over two layers.

FIGS. 3A through 3C show crossing points or jumps of composite swaths in a single layer of deposition, in different cases.

FIGS. 3D-3F shows crossing points as in FIGS. 3A-3C, in this case showing buffer zoned recorded in a database.

FIG. 7A shows a crossing turn made about a hole, in which a reinforcement formation of composite swath or multi-swath track approaches near the center of the hole and departs beside and parallel to its entry.

FIGS. 7B and 7C show two variations of a crossing turn made about a hole, in which the reinforcement formation of composite swath or multi-swath track approaches near a tangent to the hole and departs from the hole opposite to and parallel to its entry.

FIGS. 7D and 7E show crossing points adjacent a hole in which a bight, open loop or touching loop may be made away from the reinforced hole from which the reinforcement formation of composite swath or multi-swath track returns toward the hole.

FIGS. 10E-10H show the principles of FIGS. 2A-9H in a second example of a three sided context.

FIGS. 11A and 11B show the principles of FIGS. 2A-9H when the protrusions are formed as parallel and overlapping swaths $2c$, rather than crossing swaths $2c$.

FIGS. 15A-15D show examples of terminology used herein.

DETAILED DESCRIPTION

This patent application incorporates the following disclosures by reference in their entireties: U.S. patent application Ser. Nos. 61/804,235; 61/815,531; 61/831,600; 61/847,113; 61/878,029; 61/880,129; 61/881,946; 61/883,440; 61/902,256; 61/907,431; 62/080,890, and 62/172,021; 14/222,318; 14/297,437; and 14/333,881, which may be referred to herein as "Composite Filament Fabrication patent applications" or "CFF patent applications".

3D Printing System

Figure 1B:
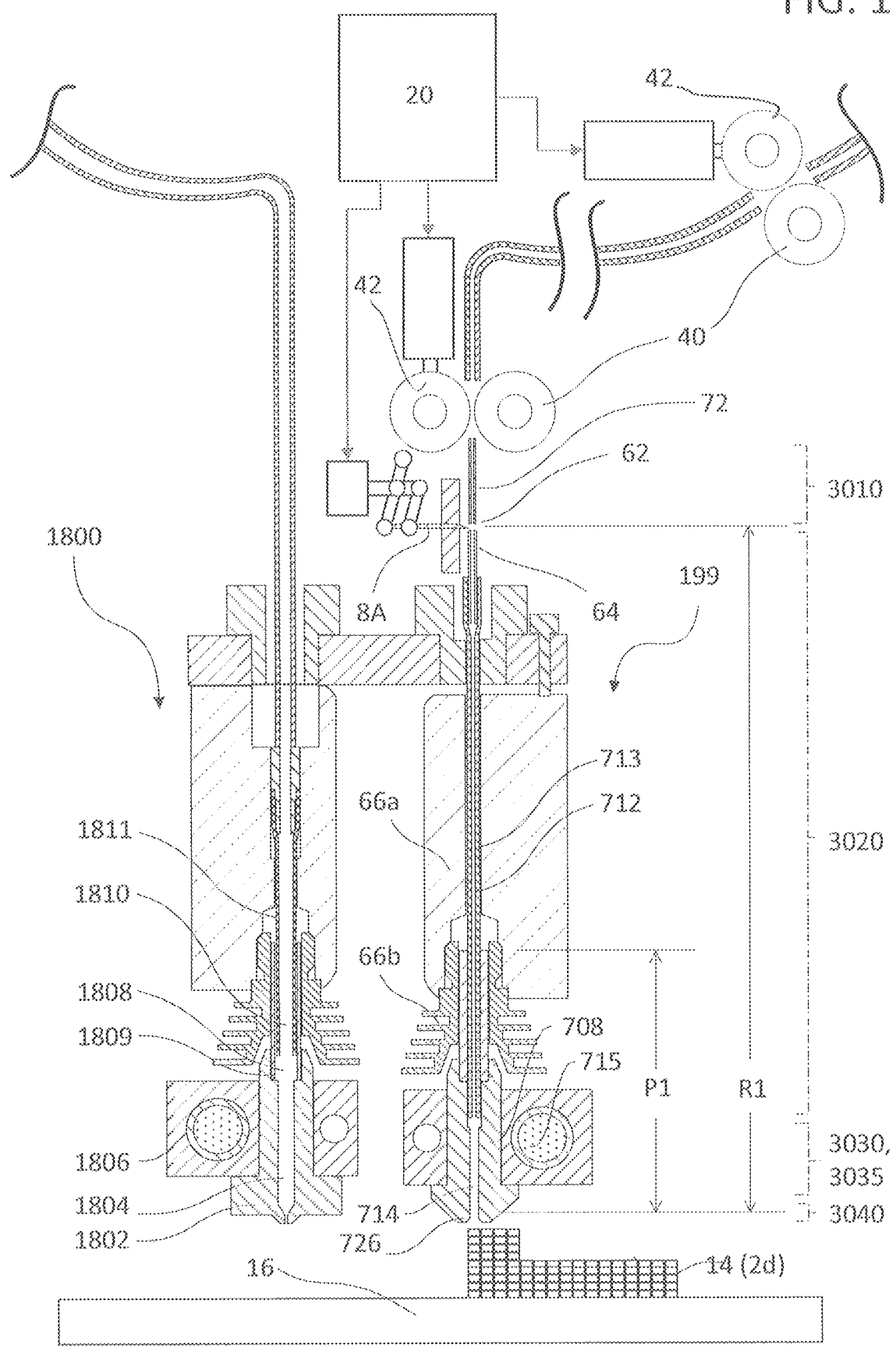
FIG. 1B is a cross-sectional and schematic view of a compound extrusion and fiber printhead assembly.

FIGS. 1A through 1C are schematic representations of a three dimensional printing system using a continuous core reinforced filament together with an extruded resin filament, in which FIG. 1A is a schematic view of a continuous core reinforced filament-extrusion printer, FIG. 1B is a cross-sectional and schematic view of a compound extrusion and fiber printhead assembly; FIG. 1C is a close-up cross-section of a fiber printhead assembly and a set of different possible compression shapes; FIG. 1D is a set of exemplary cross sections of extruded, non-compressed, ordinary "FDM" or "FFF" depositions taken from the literature.

Each of FIGS. 1A-1C with at least two print heads 18, 10 or printing techniques applies a fiber reinforced composite filament, and one which applies pure or neat matrix resin 18$a$ (thermoplastic or curing). The fiber reinforced composite filament 2 (also referred to herein as continuous core reinforced filament) may be substantially void free and include a polymer or resin that coats or impregnates an internal continuous single core or multistrand core. It should be noted that although the print head 18 is shown as an extrusion print head, "fill material print head" as used herein includes an optical curing or sintering devices—not shown—for fill material.

Although FIGS. 1A-1C in general show a Cartesian arrangement for relatively moving the print-heads in 3 orthogonal translation directions, other arrangements are considered within the scope of, and expressly described by, a drive system or drive or motorized drive that may relatively move a print head and a build plate supporting a 3D printed part in at least three degrees of freedom (i.e., in four or more degrees of freedom as well). For example, for three degrees of freedom, a delta, parallel robot structure may use three parallelogram arms connected to universal joints at the base, optionally to maintain an orientation of the print head (e.g., three motorized degrees of freedom among the print head and build plate) or to change the orientation of the print head (e.g., four or higher degrees of freedom among the print head and build plate). As another example, the print head may be mounted on a robotic arm having three, four, five, six, or higher degrees of freedom; and/or the build platform may rotate, translate in three dimensions, or be spun.

The fiber reinforced composite filament 2, 2$a$ is fed, dragged, and/or pulled through a conduit nozzle 10 heated to a controlled temperature selected for the matrix material to maintain a predetermined viscosity, force of adhesion of bonded ranks, melting properties, and/or surface finish.

After having the matrix material or polymer 4, 4a substantially melted, the continuous core reinforced filament 2 is applied onto a build platen 16 to build successive layers 14 to form a three dimensional structure. The relative position and/or orientation of the build platen 16 and conduit nozzle 10 are controlled by a controller 20 to deposit the continuous core reinforced filament 2 in the desired location and direction.

A cutter 8 controlled by the controller 20 may cut the continuous core reinforced filament during the deposition process in order to (i) form separate features and components on the structure as well as (ii) control the directionality or anisotropy of the deposited material and/or bonded ranks in multiple sections and layers. At least one secondary print head 18 may print fill material 18a to form walls, infill, protective coatings, and/or support material.

The supplied filament includes at least one axial fiber strand 6, 6a extending within a matrix material 4, 4a of the filament, for example a nylon matrix 4a that impregnates hundreds or thousands of continuous carbon, aramid, glass, basalt, or UHMWPE fiber strands 6a. The fiber strand material has an ultimate tensile strength of greater than 300 MPa.

The driven roller set 42, 40 push the unmelted filament 2 along a clearance fit zone that prevents buckling of filament 2. In a threading stage, the melted matrix material 6a and the axial fiber strands 4a of the filament 2 are pressed into the part 14 and/or swaths below 2d, at times with axial compression. As the build platen 16 and print head(s) are translated with respect to one another, the end of the filament 2 contacts the ironing lip 726 and is subsequently continually ironed in a transverse pressure zone 3040 to form bonded ranks or composite swaths in the part 14.

The feed rate (the tangential or linear speed of the drive 42, 40) and/or printing rate (e.g., the relative linear speed of the platen/part and print head) may be monitored or controlled to maintain compression, neutral tension, or positive tension within the unsupported zone as well as primarily via axial compressive or tensile force within fiber strand(s) 6a extending along the filament 2.

As shown in FIGS. 1B and 1C, a transverse pressure zone 3040 includes an ironing lip 726 that reshapes the filament 2. This ironing lip 726 compacts or presses the filament 2 into the part and may also melt, heat to cross glass transition into a non-glassy state, and/or liquefy the matrix material 4a in the transverse pressure zone 3040. Optionally, the ironing lip 726 in the transverse pressure zone 3040 flattens the melted filament 2 on the "top" side (i.e., the side opposite the part 14), applying an ironing force to the melted matrix material 4a and the axial fiber strands 6a as the filament 2 is deposited in bonded ranks or composite swaths 2c. For example, the controller 20 maintains the height of the bottom of the ironing lip 726 to the top of the layer below as less than the diameter of the filament (e.g., to compress to ½ the height of the filament, at least at ½ the filament height; to compress to ⅓ the height of the filament, at least at ⅓ the filament height, and so on). The controller 20 may maintain the height at of the bottom of the ironing lip 726 to the layer below at zero (e.g., in which case the amount of consolidation/compression and the fiber swath 2c height may be a function of system stiffness). Another reshaping force is applied as a normal reaction force from the platen 16 or part 14 itself, which flattens the bonded ranks or composite swaths 2c on at least two sides as the melted matrix material 4a and the axial fiber strands 6a are ironed to form laterally and vertically bonded ranks (i.e., the ironing also forces the bonded ranks 2c into adjacent ranks). As shown in FIG. 1C, if the underlying layer or swaths 2d includes channels, the normal reaction force from the part 14 may create T-shapes instead. The pressure and heat applied by ironing improves diffusion and fiber penetration into neighboring ranks or swaths (laterally and vertically).

Unmelted fiber reinforced filament may be cut in a gap 62 between a guide tube 72 (having a clearance fit) and the conduit nozzle 708; or within the conduit nozzle 708, e.g., upstream of the non-contact zone 3030; and/or at the clearance fit zone 3010, 3020 or the ironing lip 725.

After the matrix material 6a is melted by the ironing lip or tip 726, the feed and/or printing rate can be controlled by the controller 20 to maintain neutral to positive tension in the composite filament 2 between the ironing lip 726 and the part 14 primarily via tensile force within the fiber strands 4a extending along the filament 2. A substantially constant cross sectional area of the fiber reinforced composite filament is maintained in the clearance fit zone, the unsupported zone, the transverse pressure zone, and also as a bonded rank is attached to the workpiece or part 14.

FIG. 1B depicts a cross section of a compound (e.g., at least dual) print head with an extrusion printhead 1800 and extrusion nozzle 1802 for FFF and a fiber deposition printhead 199 and conduit nozzle 708 for continuous fiber reinforced thermoplastic deposition Like numbered features are similar to those described with respect to FIG. 1A.

With reference to FIG. 1B, each of the printheads 1800 and 199 are mounted on the same linear guide such that the X, Y motorized mechanism of the printer moves them in unison. As shown, the FFF printhead 1800 includes an extrusion nozzle 1802 with melt zone or melt reservoir 1804, a heater 1806, a high thermal gradient zone 1808 formed by a thermal resistor or spacer 1809 (optionally an air gap), and a Teflon or PTFE tube 1811. A 1.75-1.8 mm or 3 mm thermoplastic filament is driven through, e.g., direct drive or a Bowden tube provides extrusion back pressure in the melt reservoir 1804.

The companion continuous fiber embedded filament printhead 199, as shown, includes the conduit nozzle 708, the composite ironing tip 728, and the limited contact cavity 714, in this example each within a heating block heated by a heater 715. A cold feed zone 712 is formed within a receiving tube 64, including a capillary-like receiving tube of rigid material and a small diameter (e.g. inner diameter of 32 thou) Teflon/PTFE tube extending into the nozzle 708. The cold feed zone is surrounded in this case by an insulating block 66a and a heat sink 66b, but these are fully optional. In operation, an unattached terminal end of the fiber-embedded filament may be held in the cold feed zone, e.g., at height P1. Distance P1, as well as cutter-to-tip distance R1, are retained in a database for permitting the controller 20 to thread and advance the fiber-embedded filament as discussed herein. Further as shown, the controller 20 is operatively connected to the cutter 8, 8A, and feed rollers 42 facing idle rollers 40.

FIG. 1C shows a schematic close-up cross section of the conduit nozzle 708. As shown in FIG. 1C, and depicted essentially proportionately, the inner diameter of the receiving tube 64 (in this case, at a position where a Teflon/PTFE inner tube forms the inner diameter) may be approximately 1½ to 2½ times (at, e.g., 32 thou) the diameter of the filament 2 (at, e.g., 12-15, or 13 thou) shown therewithin. The inner diameter or inner width of the terminal cavity 714 (at, e.g., 40 thou) is from two to six times the diameter of the filament 2 shown therein. These are preferred ranges, it is considered the diameter of the receiving tube may be from 1¹⁄₁₀ to 3 times the diameter of the filament, and the inner diameter of the terminal cavity from two to 12 times the diameter of the filament. The terminal cavity is preferably of larger diameter than the receiving tube.

In addition, as shown essentially proportionately in FIG. 1C, the heated composite filament ironing tip 726 is moved relative to the part, at a height above the part of less than the filament diameter and scaled according to a desired proportion of composite swath, to iron the fiber reinforced composite filament 2 as it is deposited to reshape a substantially oval or circular bundle of inelastic axial fiber strands 6a within the fiber reinforced composite filament to a substantially flattened block of inelastic fibers strands within a bonded rank 2c of the part. Axial compression and/or laterally pressing the melted matrix filament 2 into bonded ranks may enhance final part properties. For example, FIG. 1C shows a composite fiber reinforced filament 2 applied with a compaction force, axial compression, or lateral pressure 62. The compaction pressure from axial compression and flattening from the ironing lip, compresses or reshapes the substantially circular cross-section filament 2a into the preceding layer below and into a second, substantially rectangular cross-section compacted shape 2c. The entire filament 2a forms a bonded rank 2c (i.e., bonded to the layer below 2d and previous ranks on the same layer) as it is shaped.

The interior strands 6a of the filament 2c both spread and intrude into adjacent bonded ranks 2c or 2d on the same layer and the matrix material 4a and strands 6a are compressed into the underlying shaped filament or bonded rank of material 2d. This pressing, compaction, or diffusion of shaped filaments or bonded ranks 2c, 2d reduces the distance between reinforcing fibers, and increases the strength of the resultant part (and replaces techniques achieved in composite lay-up using post-processing with pressure plates or vacuum bagging). Accordingly, in some embodiments or aspect of the invention discussed herein, the axial compression of the filament 2 and/or especially the physical pressing by the printer head 70, conduit nozzle or ironing lip 726 in zone 3040 may be used to apply a compression/compaction/consolidation pressure directly to the deposited material or bonded ranks or composite swaths 2c to force them to spread or compact or flatten into the ranks beside and/or below. Cross-sectional area is substantially or identically maintained.

Alternatively or in addition, pressure may be applied through a trailing pressure plate behind the print head; a full width pressure plate spanning the entire part that applies compaction pressure to an entire layer at a time; and/or heat, pressure, or vacuum may be applied during printing, after each layer, or to the part as a whole to reflow the resin in the layer and achieve the desired amount of compaction (forcing of walls together and reduction and elimination of voids) within the final part.

Description herein referring to the controller 20 of the printer 1000 performing a machine action should be interpreted as the controller 20 controlling those actuators, heaters, and effectors to which it is operatively connected to perform the recited machine action.

The controller 20 of the printer 1000, may, as described herein, supply a multi-strand core reinforced filament 2 including a flowable matrix material 4a and a plurality of substantially continuous reinforcing strands 6a. The strands are preferably of a material having a ultimate or tensile strength of greater than 300 MPa (e.g., see Materials table).

The substantially continuous reinforcing strands 6a extend in a direction parallel to a length of the filament 2. The controller 20 of the printer 1000 controls the actuators and heaters to deposit a first consolidated composite swath 2c of a height less than ½ the width of the filament 2 in a first reinforcement formation, e.g., 99A-99Z, including at least one straight path 991 and at least one curved path 992. Curved paths include both (i) curves in which the corner radius is greater than 2 times the composite swath 2c width—as deposited—as well as, or the alternative (ii) sharp corners, as unfolded or folded corners, having a corner radius from 0 to twice the composite swath 2c width. The controller 20 of the printer 1000 controls the actuators and heaters to flow the matrix material 4a and applying an ironing force that spreads the reinforcing strands 6a within the filament 2a against a deposition surface 16, 14, or 2d (once spread, the material may be considered a bonded rank or consolidated swath 2c).

The controller 20 of the printer 1000 controls the actuators and heaters to deposit a second consolidated composite swath 2c, also of a height less than ½ the width of the filament, in a second reinforcement formation 99A-99Z including at least one straight path 991 and at least one curved path 992, by flowing the matrix material 4a and applying an ironing force to spread the reinforcing strands 6a within the filament 2 and/or second consolidated swath 2c-2 against the first consolidated composite swath 2c.

In some techniques disclosed herein, the controller 20 of the printer 1000 controls the actuators and heaters to deposit a first consolidated composite swath 2c-1 and the second consolidated composite swath 2c-2 as a continuous composite swath 2c within a single shell $LA_n$ of an additive manufacturing process. In alternative or additions to these techniques, the controller 20 of the printer 1000 controls the actuators and heaters to deposit the second consolidated composite swath 2c-2 with less ironing force than the first consolidated composite swath 2c-2, and/or deposit the second consolidated composite swath 2c-2 at a nozzle height $NH_n$ from the first consolidated composite swath 2c-2 that is different from a previously deposited layer height $LH_n$.

In particular additions or alternative to these techniques, the controller 20 of the printer 1000 controls the actuators and heaters to deposit fill material 18a horizontally about the common overlap PR of the first consolidated composite swath 2c-1 and the second consolidated composite swath 2c-2 at a width of ¹⁄₁₀ to 2 times the width 2c-1$_w$ of the first consolidated composite swath 2c-1. The linear speed at which the second consolidated composite swath 2c-2 is ironed against the first consolidated composite swath 2c-2 is optionally ¹⁄₁₀ to ⁹⁄₁₀ the linear speed at which the first consolidated composite swath 2c-1 was deposited; and/or the linear filament feeding rate at which the filament 2 for the second consolidated composite swath 2c-2 is supplied is greater than the linear printing speed at which the second consolidated composite swath 2c-2 is ironed against the first consolidated composite swath 2c-1 by 1 to 20%.

In other additions or alternative to these techniques, the controller 20 of the printer 1000 controls the actuators and heaters to maintain a tension along the composite swath 2c at which the first consolidated composite swath 2c-1 is deposited to be reduced at a location at which the second consolidated composite swath 2c-2 is ironed against the first consolidated composite swath 2c-1. In further alternatives or additions, the second consolidated composite swath 2c is deposited by the controller 20/printer 1000 in a second reinforcement formation 99A-99Z, e.g., 99A-2 that extends substantially parallel to the first reinforcement formation 99A-99Z, e.g., 99A-1, wherein composite swaths 2c of the second reinforcement formation 99A-99Z, e.g., 99A-2 are deposited at a second pitch substantially the same as a first pitch of the first reinforcement formation 99A-99Z, e.g., 99A-1, and displaced by a distance of substantially half the first pitch.

Yet further alternative or additionally, the controller 20 of the printer 1000 controls the actuators and heaters such that the first consolidated composite swath 2c and second consolidated composite swath 2c are deposited in a location adjacent to and reinforcing a negative subcontour. In this case, "reinforcing" means following or tracing along a perimeter, wall, load line, stress concentration, or a trajectory drawn between the same. "Adjacent" means immediately adjacent, and also separated by a small number (e.g., 1-5) of coating, smoothing or compliant neat material 18a walls, floors, or ceilings. A negative subcontour may be a hole, or an embedded material or object or set-aside for same, or a second object with surfaces intruding into the layer or a set-aside for the same, or an overmolding, or in some cases a touching loop surrounding a hole, embedded object, or intruding object. In this technique, alternatively or additionally the first consolidated composite swath 2c and second consolidated composite swath 2c may be deposited in respective (adjacent) first and second layers $LA_n$, $LA_{n+1}$ in locations adjacent to and reinforcing a negative subcontour extending through each of the respective first and second layers $LA_n$, $LA_{n+1}$.

Still further alternative or additionally, the controller 20 of the printer 1000 may control the actuators and heaters such that depositing the first consolidated composite swath 2c and the second consolidated composite swath 2c as a continuous composite swath 2c spanning (e.g., via inter-layer continuous traverse SP30-A, SP30-B) two shells $LA_n$, $LA_{n+1}$ of an additive manufacturing process.

Still further alternative or additionally, the controller 20 of the printer 1000 may control the actuators and heaters such that the first consolidated composite swath 2c is deposited in a first reinforcement formation 99A-99Z that has a higher strength in tension between a first negative contour (or hole $H_a$) and a second negative contour (or hole $H_b$) than the second reinforcement formation 99A-99Z.

The secondary print head 18 prints fill material to form walls, infill, protective coatings, and/or support material on each layer, and as described herein, to smooth over protrusions into neighboring layers.

As noted above, arrangements are considered within the scope of, and expressly described by, a drive system or drive or motorized drive that may relatively move a print head and a build plate supporting a 3D printed part in at least three degrees of freedom (i.e., in four or more degrees of freedom as well), such as a delta robot or robot arm drive permitting four or higher degrees of freedom among the print head and build plate. Accordingly, as used herein, "layers" and "shells" deposited by the print head(s) or deposition head(s) or solidification head(s) may mean any layer or stratum or shell that may be formed in three degrees of freedom or higher (i.e., in four or more degrees of freedom as well), as appropriate, which may be planar layers in the case of three translation degrees of freedom (although shallowly curved layers may be formed even with three translation degrees of freedom), or curved, cupped, convex, concave, or topologically or topographically complex layers, shells, or layers or shells following two dimensional manifolds. Although the Figures and examples herein often show planar layers or shells, the present description and claims expressly contemplate that a layer or shell may be curved, and the orientation of print head(s), deposition head(s) or solidification head(s) driven such that such head(s) are normal or near-normal to the surface being printed and tracking along such surface in 3D space, or otherwise appropriately oriented to deposit the layer or surface.

Consolidation, Compression, and/or Flattening of Composite Swaths

An optional or preferred technique for depositing a core-reinforced filament to become a fused composite swath includes compressing a core reinforced filament exiting a conduit nozzle to form a flattened shape (e.g., as discussed in the CFF patent applications).

The flattened shape is of variable height-to-width proportion, e.g., in cross-section from 1:2 through about 1:12 proportion. Preferably, the height of a compressed composite swath 2c substantially corresponds to the fill material layer height in the same layer $LA_1$, so that neighboring composite swaths 2c in the vertical direction can be tightly packed, yet be built up as part of the same or adjacent layers as the surrounding, complementary and/or interstitial fill material 18a.

Inter-layer interaction among composite swaths 2c and fill material 18a may be more involved than interlayer interaction among layers of fill material 18a. In most cases, the only requirement for adjacent layers of fill material 18a is that they are satisfactorily fused in the vertical direction to avoid delamination, and in most cases the fill material 18a is fused (melted, or cured) under ambient or room pressure.

However, in the case of vertically adjacent layers of composite swaths 2c (or even of composite swaths 2c neighboring fill material 18a in a vertical direction), more types and more complex interaction is required and/or enabled. The properties of a composite swath 2c, or especially a group of composite swaths 2c interacting with one another, may improve with significant compression (e.g., flattening to more than 1:4 proportion), and providing this compression in the part 14 may require accommodation of vertical and horizontal effects of the additional compression. In addition, unlike homogenous fill material 18a, the overlapping or crossing of composite swaths 2c may provide advantageous anisotropy or advantageous internal geometry.

With respect to additional compression, overlapping, or crossing, at least the following effects may be addressed:

1) Ironing compression is not necessarily linear, and because embedded fiber remains solidified and incompressible, compressed fiber may extend above or below the layer height of the fill material 18a within the same layers as the composite swaths 2c as set.

2) Overlapping or crossing composite swaths 2c may create humps 2c-3 or ridges 2c-4 that may extend above the current layer $LA_n$ height of the fill material 18a as set.

3) Overlapping or crossing composite swaths 2c-2, 2c-1 may cause a current or an underlying composite swath 2c-1 to widen (in which case air volume to receive the widening composite swath 2c-1 may be provided, modeled, marked, or calculated, and later filled with fill material 18a).

Note also that inter-layer effects may be of significantly lesser height than a layer $LA_n$ height of the slicing process for the fiber reinforced material and the fill material, for example, an intrusion of $\frac{2}{3}$-$\frac{1}{100}$ of the layer height. In those cases where the effect or intrusion is particularly small, e.g., $\frac{1}{3}$-$\frac{1}{100}$ of a layer height, it is not preferable to reslice the solid model at a fraction of the fill material layer height, as this may increase the printing time by a similar proportion. However, the effects may be "buffered" by, e.g., routing composite swaths 2c-1, 2c-2 in a neighboring layer to route around an inter-layer interference, or depositing fill material 18a to level the layer height $LA_n$ above or below an inter-layer interference 2c-3.

Accordingly, the present disclosure contemplates different buffering operations of an additive manufacturing 3D printer 100 to permit inter-layer effects of fiber compression, stacking, overlapping, crossing, and runout (e.g., different versions of composite swath 2c avoidance routing; different versions of composite swath 2c overprinting or fill material 18a "topping off"; ameliorating patterns which distribute rather than group discontinuities, gaps, or stress concentrations). In topping off, the controller 20 of the printer 1800 controls the actuators and the heaters to deposit at least one cover of fill material 18a (a material compatible with the matrix material 4a) or multi-strand core reinforced filament s in a layer adjacent the location at which the ironing force spreads the reinforcing strands 6a of the second consolidated composite swath 2c-2 against the first consolidated composite swath 2c-1, the cover having a thickness of less than the height HEIGHTNUM of the layer $LA_n$.

In addition, the present disclosure contemplates that composite swath 2c routing and fill material 18a routing (i.e., toolpath generation) may generate data structures for keeping track of locations of inter-layer effects. One example data structure is an inter-layer interference map stored as a special set of zero-height contours (i.e., a zero-height phantom layer to which a layer above and below may refer during toolpathing operations). Contours may be stored in the interference map indicating the predicted effect in a layer above or below.

In depositing core reinforced filament as described in the CFF set of patent applications, the embedded strands 6a—unmelted carbon fiber, aramid, fiberglass, basalt or the like—are effectively incompressible and solid and cannot be as readily displaced as the heated and highly viscous fluidized thermoplastic 18a of FFF/FDM printing. The present disclosure details inventions, embodiments, and implementations of techniques for intra-layer and inter-layer crossing of core reinforced filament as applied in additive manufacturing in the CFF set of patent applications.

A core-reinforced multi-strand composite filament 2 may be supplied, for example, as a circular to oval cross section, and/or of approximately ⅓ mm in diameter and/or "13 thou" diameter.

As shown in Table 1 below, a circular cross-section filament 2 compressed during deposition becomes a progressively wider composite swath 2c. The table uses an example dimensionless diameter of 3 units for "round numbers".

As shown in the table, for any size of substantially circular cross section core reinforced filament 2, flattening to about ⅓ of its diameter becomes about 2.2-2.5 times as wide as its original diameter, and if flattened to about ½ its diameter becomes about 1.4-1.7 times its original diameter.

TABLE 1

| Example Diameter (Circle): 3 units Rectangle Compression | | Approximate Area: 7 units^2 T-Shape or L-Shape Compression | |
| --- | --- | --- | --- |
| H | W | H | W |
| ⅔ D height | ~2 | ~3½ | ⅔ D height | 2 | 4.7 |
| ½ D height | ~1½ | ~4½ | ½ D height | 1.5 | 6.3 |
| ⅓ D height | ~1 | ~7 | ⅓ D height | 1 | 9.5 |
| ¼ D height | ~¾ | ~9½ | ¼ D height | 0.75 | 12.5 |

TABLE 1-continued

| Example Diameter (Circle): 3 units Rectangle Compression | | Approximate Area: 7 units^2 T-Shape or L-Shape Compression | |
| --- | --- | --- | --- |
| H | W | H | W |

For example, to complement an additive manufacturing layer height of 0.1 mm, a ⅓ mm diameter core reinforced filament 2 may be flattened to a composite swath 2c of roughly rectangular shape of proportion 1:6 through 1:12 (herein "highly compressed"), e.g., about 0.7-1.1 mm wide by about 0.07-0.12 mm high. One preferred ratio is roughly 1:9. Even higher compression may be possible, e.g., 1:12 to 1:20, but may demand significant system stiffness in the printer 100.

In contrast, to complement an additive manufacturing layer height of 0.2 mm, a ⅓ mm diameter core reinforced filament 2 may be flattened to a composite swath 2c of roughly rectangular shape of proportion 1:1.5 to 1:4 (herein "lightly compressed"), e.g., about a roughly rectangular shape of about 0.4-0.6 mm wide by about 0.2 mm high.

However, a fiber-embedded rectangular cross section of 1:1.5 to 1:3 is not as compressed or consolidated as one of 1:6 to 1.12 proportion, and in many cases, an relatively higher amount of consolidation is preferable to reduce voids and improve mingling of fibers in adjacent ranks 2c-2c or 2c-2d.

It should be noted that a supplied fiber reinforced filament 2 may have a constant cross-sectional area as supplied and as deposited (unless coextruded or supplemented); while a supplied FFF filament 18a has both a very different cross-sectional area as supplied and as deposited (having a much larger diameter as supplied), as well as variable cross-sectional area as deposited (having a bead size depending on extrusion rate). Given that a highly compressed composite swath is preferable to a lightly compressed one, combining a larger FFF extrusion rate layer height (e.g., 0.3 mm) with a highly compressed composite swath (e.g., 1:9 ratio) may be challenging. Accordingly, when a fill material height is such that the amount of compression is unacceptably reduced, more than one layer of fiber may be arranged per layer of fill material (e.g., 2 or 3 1:9 sublayers of 0.1 mm composite swath 2c per one respective 0.2 or 0.3 mm layer of fill material 118a). In this case, most or all fill material 18a is deposited after the composite swaths 2c; although in an alternative mode self-collision detection may be used to avoid contacting the nozzles to the part and the order of deposition thereby varied. In addition, in a modification of this process, the fill material height and compression amount may be selected to match stacks of 1:6-1:12 "highly compressed" composite swaths 2c (e.g., for a fiber of ⅓ mm diameter, the matching fill material 18a layer height capped at approximately 0.24 mm, because the highest acceptable "highly compressed" stack of two fibers is 1:6 ratio×2, or 0.12 mm×2).

As shown in FIGS. 1C, 11A, and 11B, another possible compressed shape is a T or L shape, with the "long" side being the top surface directly compressed. As shown in FIG. 11B, a first step may be arranging a support surface for T-shaped or L-shaped compression. The support surface includes channels formed by rows of either core-reinforced fiber or fill material. As shown in the Table above, and in FIG. 11B, the channels should be ½ of the overall width of the T-shape or L-shape to be shaped, as well as spaced from one another by a pitch of 1½ times the overall width of the T-shape or L-shape to be shaped, in order that ⅓ of the cross-sectional area is pushed into the channel. While FIG. 11B shows that fill material has been printed in beads of ¼ the overall width of the T-shape or L-shape and ½ the overall height in order to create receiving channels in the first layer, the channels may be prepared using core reinforced fiber as well.

It should be noted that the cross-sectional representation of reinforcing strands 4a within filament 2a and deposited swaths 2c are schematic only. In most cases, the reinforcing strands are in the hundreds to thousands of parallel strands within the filament 2a or swaths 2c.

Linkage Arm: Layer Toolpaths without Crossing Point

FIGS. 2A-2J show composite swaths and/or path planning for layers of linkage arms or base plates. Herein, "linkage arm" or "base plate" includes e.g., any member having at least two holes H1, H2; H3, H4; H5, H6 which may link two additional members or support the connecting plate at two locations to a supporting member, inclusive of linkages, brackets, and the like. The linkage arms or connecting plates shown include hexagonal holes H1, H2, square holes H3, and round holes H4, H5 therethrough, and different combinations of these. In each case, a top down view presents a single layer view of an additive manufactured or 3D printed part, and in each case a few (three or four) cycles of outlining, following, or tracing approach for the composite swaths 2c and/or toolpaths, while in many cases the pattern of spiraling, offsetting, rastering, or sparse fill honeycomb may be continued to the limits of a cross-section, contour, or a neighboring section of spiraling, offsetting, rastering, or sparse fill honeycomb. As discussed herein, a typical vertical pitch or layer height for a 3D printed part is 0.1-0.3 mm (although coarser and finer layer heights may be used, as well as different layer heights within the same part). Accordingly, for a 0.1 mm layer height, a 1 cm high part would have 100 layers, and a 30 cm high part would have 3000 layers. In each case, two holes H1-H5 are shown although the same principles extend to multiple holes, negative, embedded or overmolded contours.

FIG. 2A shows a single layer of a connecting plate having two hexagonal holes $H_a$, $H_b$ (here labeled H1, H2). In several figures, including FIG. 2A, as shown, contours or region followed by the strategy are coincident with the hole wall. Alternatively, the contour or region followed may be offset from the hole wall (e.g., representing wall thicknesses of fill material 18a). In FIG. 2A, a reinforcement formation 99A having a spiral tracing strategy is used to follow the two internal contours of the hexagonal holes H1, joined by a shortest possible line (linking H1 and H2). As shown in FIG. 2A, the spiral tracing strategy begins B1 the toolpath on a side of a hexagonal hole opposite to the swaths extending between the two holes H1, H2, and is "anchored" on that side (i) against the hole wall (ii) by the angled curve about the hole wall and/or (iii) by surrounding composite swaths in the second and subsequent cycles/loops. The swaths 2c extending between the two holes H1, H2 may be expected to carry load in a tension mode, and the swaths 2c closely surrounding the holes H1, H2 may be expected to reinforce the walls of the holes H1, H2, in a combined tension-compression mode. The spiral toolpath ends E1 on the same side as it began in a proximate position, on a side of a hole H1 opposite the tension-bearing swaths, but may optionally be further "wound" about the hole H1 to improve "anchoring" (e.g., increase that length of fiber fused in matrix material and fill material that directly bears tension loads at the interfaces between fiber surface, matrix material, and fill material). While this strategy is of a toolpath spiraling outward from internal contours H1, H2, a very similar toolpath can be built in an inward direction (i) in the case where the outer contour of the part 14, $LA_1$ is shaped similarly to an offset of the holes H1, H2 and joining line or (ii) where a region bounding toolpath generation is set as a shape similar to an offset of the holes H1, H2 and joining, shortest distance line. For example, FIG. 5C shows a composite swath 2c reinforcement formation 99S or toolpath generated by defining an internal region of the part 14, $LA_1$ as an origin for offset tracing starting from an outer contour and offsetting inwards.

FIG. 2B shows a toolpath, composite swath, or reinforcement formation 99B similar to FIG. 2A, a single layer $LA_1$ of a connecting plate having two hexagonal holes, H1, H2 with a spiral tracing strategy is used to follow the two internal contours of the hexagonal holes H1, H2. In this case, in order to shift the stress concentration and Y-shape at which paths meet to a different location in at least one orthogonal direction and/or along the perimeter of a hole H1, the shortest line from which spiral tracing is offset or spiraled is shifted up along a hole boundary to a position displaced from the former stress concentration location in at least two orthogonal directions (e.g., in the X and Y directions as shown, and also in the Z direction as the displaced stress concentration is in a the next layer). FIG. 2H shows four superpositions, i.e., layers of this pattern, mirrored vertically and horizontally, to distribute the stress concentrations variously among the four layers. As discussed, the pattern or reinforcement formation of FIG. 2A may be combined with that of FIG. 2B for further combinations. It should be noted that for illustration purposes, each of the hexagonal, circular, and square holes represented throughout are generally of similar diameter or width, and the patterns can be variously combined as disclosed herein when not inconsistent with a hole shape or width (and with adjustment that would be readily understood by those of skill in the art). As an example, the patterns of FIGS. 2C and 2D are shown with both circular and hexagonal internal regions or contours at the hole locations (hexagonal holes and circular outline regions), and these patterns are suitable for surrounding and reinforcing hexagonal and circular holes.

FIG. 2C shows a looped toolpath with minimum corners and gentle turns, formed with a spiral building outward from an envelope about circle regions R6, R8 surrounding respective hexagonal holes H1, H2 (optionally circular holes), a minimum composite swath length path that surrounds both holes H1, H2. This reinforcement formation is suitable for (i) tension loads between the two holes because of the several well-anchored and continuous loops. This reinforcement formation 99C is also suitable for (ii) transmitting torque about the holes, as rather than following the hexagonal hole walls, the circular regions circumscribing the hexagonal holes are reinforced with composite swaths along the direction of hoop stress encircling the holes. However, this toolpath/composite swath/reinforcement formation 99C as deposited does not particularly reinforce the straight walls of a hexagonal hole, and could therefore be used in combination with, e.g., a toolpath of FIG. 2A or 2B, or as in FIG. 2F or 2G in order to reinforce such walls.

FIG. 2D shows a toolpath, fiber or composite swath pattern, or reinforcement formation 99D which reinforces in a loop about each of two hexagonal holes H1, H2 (or circular holes or regions R6, R8). FIG. 2D, which generally does not place a majority of composite swaths in a tension arrangement between the two holes H1, H2, may be more suitable for repeating throughout the entire height of a part, or together with an interior sandwich panel honeycomb portion of a part 14, in order to provide each hole H1, H2 with a solid tube of fiber reinforcement from top to bottom, to provide compression resistance vs. tightening of bolts or the like through the holes H1, H2. FIG. 2D also demonstrates that offset toolpath generation (left, e.g., see offset crossovers at OF1) and spiraling toolpath generation (right, e.g., see spiral start and finish at SP1) can be used in the same part, layer, or even toolpath, and FIG. 2I, which repeats the reinforcement formation 99D in differing orientations throughout several layers, shows that the stress concentrations/gaps in different kinds of toolpath strategy/reinforcement formation and different locations can be varied. Varying can be accomplished, for example, by mirroring horizontally and vertically, and again, optionally by varying, regularly or randomly, the location of pattern crossovers, overlaps, starts, finishes, and/or gaps and about the periphery of the surrounded hole, feature, internal contour, embedded contour, negative contour, or overmold contour).

Figure 2E:
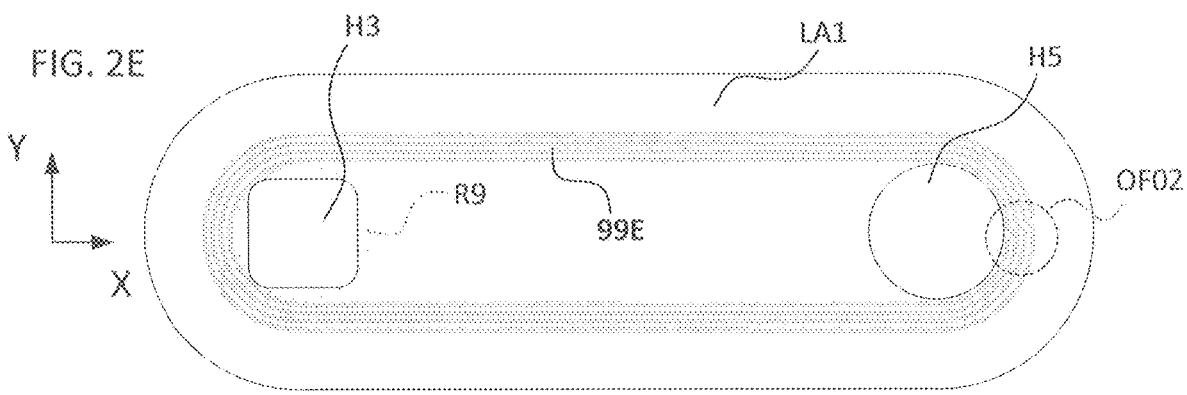
FIG. 2E shows an offset looping or concentric circuit strategy or reinforcement formation, with offset crossovers.
Figure 2F:
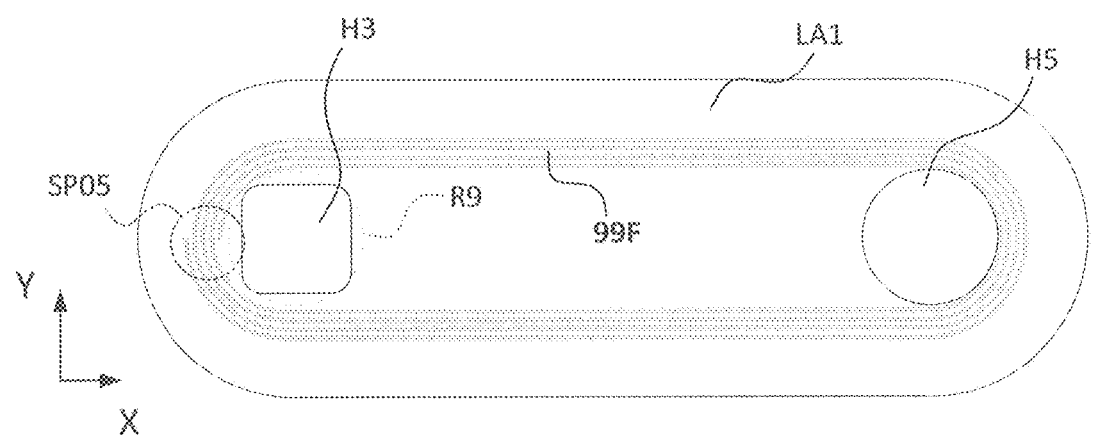
FIG. 2F shows a spiral looping or concentric circuit strategy or reinforcement formation, excepting that FIG. 2F shows a paired square hole and circle.

FIG. 2E shows a variation of FIG. 2F in which the toolpath, composite swath pattern, or reinforcement formation 99E is of offset approach, with crossovers OF02 at the opposite side of the part from the spiral start and end of the spiral strategy toolpath of FIG. 2F. FIG. 2F shows a toolpath, composite swath strategy or reinforcement formation 99F similar to FIG. 2C, as a spiral strategy, excepting that FIG. 2F shows a paired square hole H2 and circular hole H5 (e.g., for a torque arm application, alternatively replacing the square hole H3 with a circular fitted hole corresponding to region/contour R9) FIG. 2J shows the superposition of these toolpaths or composite swath depositions or reinforcement formations 99E, 99F of FIGS. 2E and 2F over two layers, placing the stress concentrations and/or gaps of the offsets and/or spiral start and end in positions displaced from one another in at least two orthogonal directions (here, substantially the X direction as well as the Z direction between layers). The controller 20 of the printer 100 causes the actuators and the heaters to turn the first fused composite swath 2c-1 according to the first reinforcement formation 99A-99Z toward a different direction at a first location, e.g., OF2. In printing the second reinforcement formation 99A-99Z, the printer 100 turns the second consolidated composite swath 2c-2 according to the second reinforcement formation toward a different direction at a second location e.g., SP05 displaced from the first location OF2 in at least two orthogonal directions (in this case, by example, in X and Z directions).

Figure 2G:
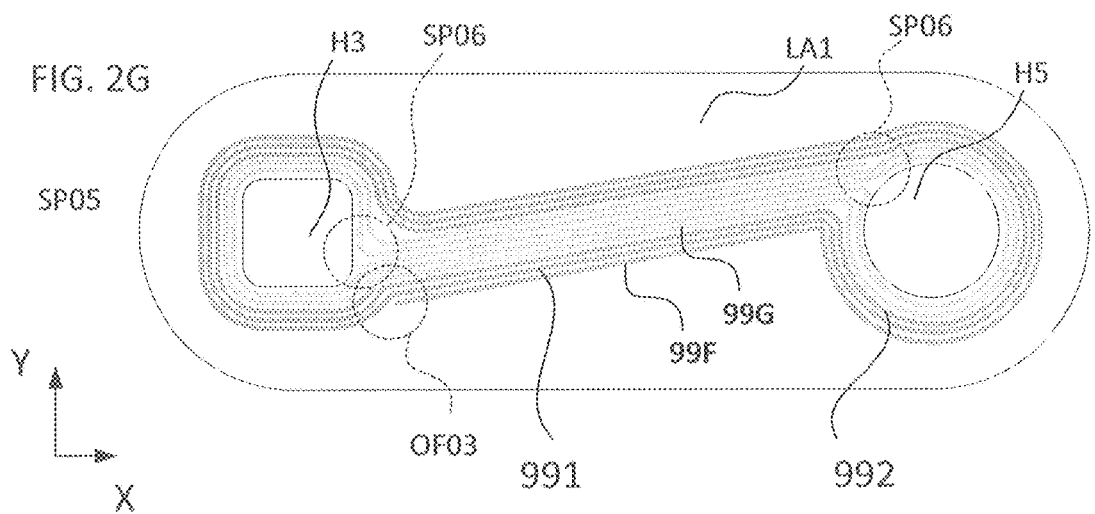
FIG. 2G shows two concentrically located toolpaths or composite swath strategies or reinforcement formations surrounding the same holes in a single layer.

FIG. 2G shows two concentrically located toolpaths or composite swath strategies or reinforcement formations 99G, 99H surrounding the same holes $H_a$, $H_b$ (here labeled H3, H5), in order to relatively displace or distribute gaps, seams and stress concentrations to limit propagation of cracks or other modes of failure from nucleation at a gap, seam, or stress concentration. In addition, the patterns 99g, 99H are biased to angle between the holes, so that it may be mirrored or varied to provide a variety of different and complementary fiber orientations among layers, especially in a direction complementing the loading profile. For example, mirroring the patterns 99G, 99H among layers about the X axis will provide added tensile strength along the X axis, and should the layers containing such patterns be distributed to outer layers in the Z direction, provide added bending strength versus bending about the Y axis. The inner pattern or reinforcing formation 99H is an offsetting pattern with offset crossovers OF03 located at the corner or junction between the longer swath segments between holes and the circular hole H5 (e.g., at the upper left hand side of the round hole); and the outer pattern or reinforcement formation 99G is a spiral pattern with the start of the spiral OF03 abutting a corner or junction formed in the previous pattern (e.g., at the lower right hand side of the pattern previously formed about the square hole H3).

Complementary Reinforcement Formations

Disclosed herein are complementary toolpaths, composite swath deposition strategies, or reinforcement formations 99A-99Z—first, second, and other formations—for both composite swaths 2c and fill material 18a within layers and in adjacent layers, was well as overlaps within a layer, such as same-layer crossing turn overlaps and same-layer parallel overlaps. In addition, "smoothing over" and "attenuation" strategies within or adjacent reinforcement formations 99A-99Z avoid accumulation of, in particular, fiber material overlap protrusions over several or many layers. Such strategies can also be used to ameliorate accumulation of tolerance stack among many composite swath layers.

Using different formations may also permit horizontal repositioning of stress concentrations, gaps, or seams arising from fiber routing in the horizontal plane, as they may permit varying of positioning of start position, end positions, runout accumulation or shortfall, and sharp turns in the composite swath 2c. This is especially the case near contour boundaries, holes $H_a$, $H_b$, $H_c$, etc. or negative contours, as well as channels and island contours, as localized reinforcement in many cases means various sharp turns in the surrounding toolpath. Accordingly, a purpose of using different reinforcement formations within a layer and among layers is to distribute gaps, seams, and stress concentrations to positions that are different from locations in adjacent or nearby layers, and/or in distributed positions among layers; as well as to permit different kinds of reinforcements for different stresses to be distributed among layers.

For example, taking FIG. 2A as an example, the walls of hexagonal holes 2A are to be reinforced by an inner-contour following spiral path of reinforcement formation 99A. An inner-contour, outwardly spiraling toolpath as part of reinforcement formation 99A may be synthesized to reinforce both holes H1, H2 and maintain continuity of long lengths of continuous composite swath 2c as much as possible, and/or provide lengthwise reinforcement in entire part 14. A minimum area, minimum distance connection (i.e., a zero thickness line "hole" negative contour R4) is synthesized between them. A spiral path—i.e., a path that gradually changes offset distance from the contour being outlined or traced, so as to continue in a spiraling fashion—is selected to form the reinforcing toolpath of reinforcement formation 99A. The spiral is begun at a position prioritizing the strength along the center of the part $LA_1$, 14 (e.g., at a position to the left side of the left hole H1, as shown). As shown in FIG. 2A, the walls of the left hexagonal hole H1 are traced, then a path is taken directly paralleling the zero-thickness contour R4 to the right hexagonal hole H2, which is followed. The toolpath returns along the line of the zero-thickness contour R4 (on the opposite side, not overlapping in this case), and spirals about the left hexagonal hole H1 and the previously placed toolpath, and so on, for approximately three "laps" of the "track".

As shown in FIG. 2A, while the walls of the hexagonal hole H1 are reinforced, various gaps, seams, and stress concentrations may be created in the composite swath direction changes and corners. In particular, the entrance/exit zone includes a corner SC01 that is not reinforced by fiber, and which includes various stress concentration at the Y-shaped junction of the two track sections at the corner. If this pattern 99A is repeated for many layers of an additive manufacturing part, the "seam" of stress concentration SC01 and lack of direct corner reinforcement may be continued along this corner (that of the gap/seam/stress concentration SC 01) in the vertical direction (e.g., extending for tens or even hundreds of layers). This may, for example, be addressed by maintaining a similar reinforcement formation 99B as in FIG. 2B, but moving or changing the junctions or turning locations of the "laps" among layers. For example (without overlapping within a layer), the location of a different but similar stress concentration and Y-junction SC02 may be moved along the side of the hexagonal hole H1, as shown in FIG. 2B. This stress concentration location may be "moved" from SC01 to substantially to anywhere along the inner two sides of the hexagonal hole on either side, and may be thereafter throughout the layers arranged in an organized, repeated, or randomized fashion. For example, FIG. 2H shows a repeating pattern over 4 layers in which the arrangement of FIG. 2B is mirrored horizontally, then vertically, providing 4 changed seam locations SC01, SC02, SC03, SC04 on four different layers. Similarly, the location of the spiral origin SP02 is moved to 2 changed locations. Non-symmetric arrangements may be similarly varied (by varying the entry/exit location along a particular path, contour, or guide) regularly or randomly.

Different contour following strategies or reinforcement formations without internal overlaps or composite swath crossings within a layer may be layered among different layers. For example, the following strategy or reinforcement formation 99C of FIG. 2C is a (i) spiral following of (ii) an inner contour, taking a (iii) shortest possible path (iv) including the two hexagonal holes. H1, H2 while (iii) making no sharp corners (a "sharp corner" is an unfolded or folded corner having a corner radius from 0 to twice the composite swath 2c width). The strategy of FIG. 2C transmits hoop stress and longitudinal tension stress with a smaller stress concentration than other strategies, and may be combined with FIGS. 2A, 2B (primarily strategies for strengthening walls of the holes together with resisting tension).

FIG. 2D is an exemplary strategy that could be mirrored in two directions. The strategy of FIG. 2D uses (i) spiral following for one side and (ii) offset following to the remaining side, both following the contour of the hexagonal holes while (iii) making no corners, and only connecting the two hole reinforcing zones by an single composite swath extending between. The connecting swath generally benefits if one of the following patterns about the holes must spiral or connect to neighboring offsets in an outward direction, and the following pattern on the connected hole must spiral/offset inwards. The strategy of FIG. 2D uses reinforces in a hoop stress direction more than FIGS. 2A-2C, but leaves most tension reinforcement to other layers. Alternatively, FIG. 2D, if repeated or repeated in a mirrored fashion from top to bottom of a part, would reinforce the holes in compression vs. overtightening (e.g., as shown with circular holes in FIG. 2I).

As noted, individual reinforcement formation s 99A-99Z may be varied to vary distribution of isolated gaps, starting positions, end positions, and/or stress concentrations. Crossing points PR (i.e., crossing composite swaths within a same layer $LA_n$ may provide more flexibility in the design of toolpaths of reinforcement formations 99A-99Z, permitting more locations for seams to be distributed, as well as additional forms should seams tend to stack among layers $LA_n$, $LA_{n+1}$, etc., or. Overlaps PR of composite swaths 2c within a layer $LA_n$ may create stress concentrations as relatively sharp turns in the composite swath 2c upward and then downward are made, but with sufficient remelting, reduction in printing speed, feeding at a faster rate than the printing speed to provide, or compression in overprinting, these path changes or turns may permit added horizontal repositioning of stress concentrations arising from path planning in the horizontal plane, as well as avoiding turns in the composite swath leftward and rightward as the composite swath 2c is permitted to continue in a straight path 99I. This is especially the case at crossing turns PR about holes and negative contours $H_a$, $H_b$, $H_c$ etc., as reinforcement of a hole in most cases has an entrance and exit to the surrounding toolpath of fiber/composite swath 2c or reinforcement formation 99A-99Z, and the use of crossing turns can permit more freedom in locating that entrance/exit. Accordingly, a purpose of such crossing turns is to distribute gaps, starting and stopping positions, and stress concentrations to positions that are different from locations in adjacent or nearby layers $LA_{n-1}$, $LA_{n+1}$, and/or in distributed positions among layers $LA_1$ . . . $LA_m$; as well as to permit different reinforcements for different stresses to be distributed among layers. "Location" may mean in 2D or 3D location, along contours, or along stress or load lines or fields.

In an alternative, for a second type of material, the controller 20 of the printer 1000 has uses one or more of higher than straight path printing speed, higher than straight path nozzle tip compression, and/or slower than printing speed filament feed rate.

Complementary Formations in 3D Core Reinforced Printing Vs. Laminates or FFF

Continuous carbon fiber composite laminates may be formed up in a "quasi-isotropic" (QI) four-ply or three-ply construction at 0, +/−45 degrees, and 90 degrees. Anisotropically biased layups (e.g., 0, +/−30 degrees, 90 degrees) are also used. The laminae are cut at the row ends. The reinforcement formations discussed herein for 3D printed composite swaths 2c may optionally be used in combination with QI construction.

FDM or FFF layers may be formed in orthogonal layers at +/−45 degrees of alternating raster formation. Generally raster formation is preferred in order to extrude hot, flowing plastic next to still-warm extrudate from the immediately previous row to improve bonding, with only minor consideration for directional strength. The +/−45 degree raster formation gives a multi-directional and satisfactory workable middle range of tensile strength, +/−25% from the best and worst rastering patterns (e.g., 20 MPa UTS for ABS in 45-45 pattern, vs. about +5 MPa for longitudinal raster and about −5 MPa for transverse or diagonal raster). Note also that the better rastering patterns per load direction, which may place the direction of most of the extrudate roads in the same direction as the load, may approach injection molding strength (e.g., about 95% of injection molding).

In 3D printing in a stranded-filament-to-ironed swath 2c technique, both negative and positive contours may be reinforced beyond the matrix or fill material strength with continuous composite swaths looping about the contour without severing the fiber. This in-plane looping is impossible with composite layup, which cannot make turns within the plane without breaking the materials; and of different character and limited effect with extrudate.

Different Modes of Reinforcement—Load Dependent

In the case of one, two, or more holes, negative contours, embedded contours, or overmolded contours in an actual part, in many cases different kinds of reinforcement will be possible. For example:
(1) Reinforcement of inner walls and hole walls may closely follow the walls, with or without layers of fill material shielding the innermost wall to prevent print-through of fiber, e.g., FIG. 2A, 2D, 2F. "Holes" include negative contours and embedded (e.g., overmolded) contours.
(2) Reinforcement of outer walls may closely follow the walls, with or without layers of fill material shielding the innermost wall to prevent print-through of fiber, e.g., FIGS. 5A-5D "outer" reinforcement formations.
(3) Reinforcement may extend along load lines or stress lines, e.g., FIG. 5C outer reinforcement formation.
(4) Reinforcement for tension load purposes may include multiple straight composite swaths between the sites at which the tension load is supported, e.g., FIG. 2C, 2E, 2F.
(5) Reinforcement for torsion, torque, or pressure load purposes may include multiple circular composite swaths along directions of hoop stresses, e.g., FIGS. 2C, 2D.
(6) Reinforcement for compression load purposes may include multiple neighboring composite swaths to provide low aspect ratio cross sections and/or squat structures, and/or anchors at ½, ⅓ fractional, e.g. harmonic lengths to guard vs. buckling; and/or e.g., more composite swaths for compression struts than for tension struts.
(7) Reinforcement for twisting may include angular cross bracing in triangle or X shapes, e.g., FIGS. 2H, 4E.
(8) Reinforcement for bending or combination load purposes may include embedded high moment of inertia (cross section) structures such as sandwich panels, tubes, boxes, I-beams, and/or trusses formed from embedded composite swaths. These may be made in layers spaced from the centroid of the part cross section, or in outer toolpaths spaced from the centroid of the part cross section, depending on the load and the orientation of the part during printing.

Crossing Points

FIGS. 3A through 3C show crossing points or jumps of composite swaths in a single layer of deposition, in different cases of compression amount and printing speed (and/or heat transfer time, with slower printing speeds permitting more softening of an underlying layer), and/or feeding filament at a faster linear rate than the printing speed during the printing of the crossing point, in either the lower swath 2c-1 or the upper swath 2c-2, in order to create slack for the deformation of the swath up and down as it is printed. Each of FIGS. 3A-3C includes an exemplary top-down view and three cross-sections at different locations.

Figure 3F:
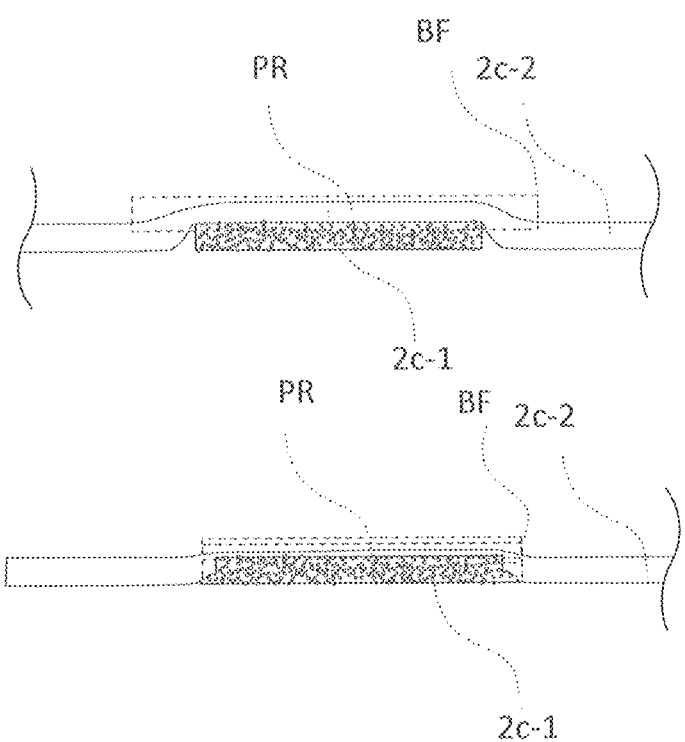

FIGS. 3D-3E shows crossing points as in FIGS. 3A-3C, in this case showing a buffer zone BF recorded in a database (either within the printer or for use by a slicing and/or toolpath synthesis routine) for marking protrusions PR wider than a single swath 2c-1 width or protrusion PR above a single swath 2c-1 height that occurs at crossing points CP. These buffer zones BF may be marked in a database per coordinates or sensed during printing of the current layer or a subsequent layer. As shown in FIG. 3D-3F, as the crossing angle of a crossing point CP increases, the diamond-shaped overlap PR increases in size and a corresponding X-shaped buffer zone BF increases accordingly. FIG. 3F shows side cross sections, reflecting that the horizontal or vertical buffer zone size may be smaller than a swath width or height, respectively, and may be sized depending on time, temperature, or pressure of the printing process as the crossing point is printed.

There are several possible mitigation/exploitation strategies, intra-layer and inter-layer, once toolpaths for composite swaths are overlapped or crossed.

In general, it is preferable to apply strategies in which compression and/or layer height interference of an overlapping or crossing layer (e.g., which may correspond in part to layer height) may be set to deposit two highly compressed layers of composite swaths $2c$-2, $2c$-1, and to square up corresponding fill material $18a$ at a height of close to twice the highly compressed composite swath height. It may also be preferable to permit or create crossings of toolpaths of composite swaths $2c$-1, $2c$-2, and to square up corresponding fill material $18a$ at a height of close to twice the highly compressed composite swath height. Crossings of highly compressed composite swaths with one another, and/or crossings of highly compressed composite swaths with lightly compressed composite swaths may be used. As shown in the CFF patent applications, toolpaths for deposition of core reinforced fiber may be generated within contours and sub-contours, and in order to maintain parallel paths, and often follow offsets of the contours and sub-contours.

Intra-Layer and Inter-Layer Overlap

Figure 4A:
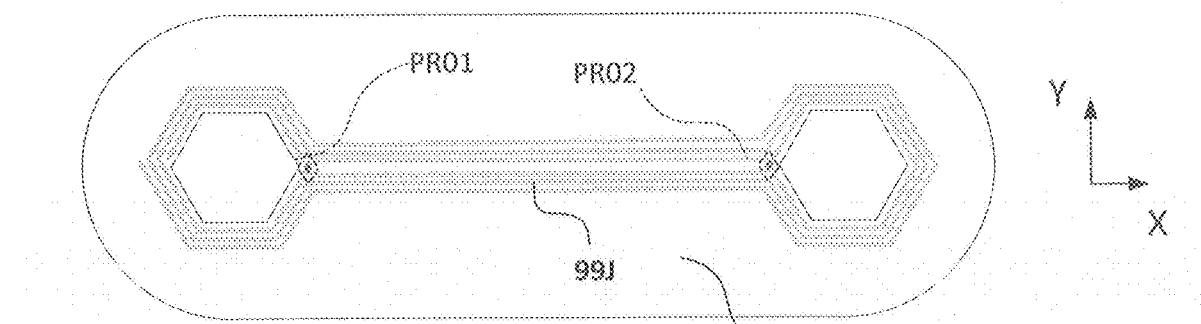
FIG. 4A shows a reinforcement formation with a single crossing turn (with a single overlap) at each end of a pattern similar to FIG. 2A.
Figure 4B:
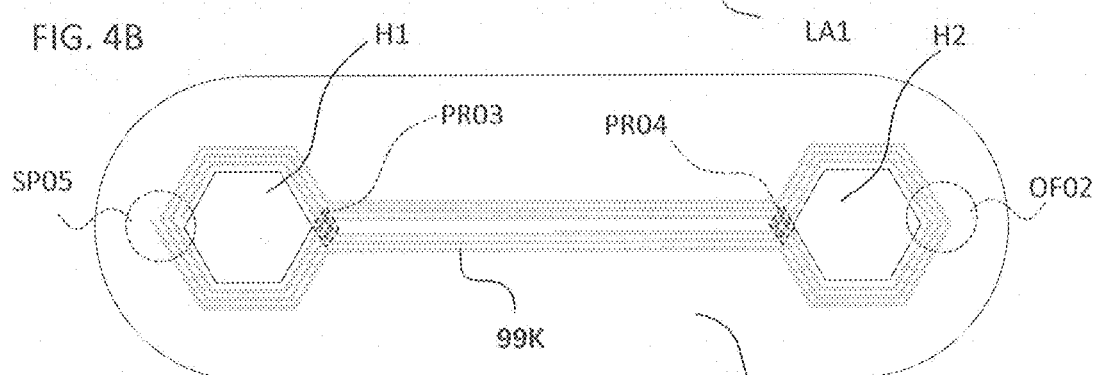
FIG. 4B shows a reinforcement formation with a "double" crossing turn (with four overlaps) at each end of the pattern similar to FIG. 2A.
Figure 4C:
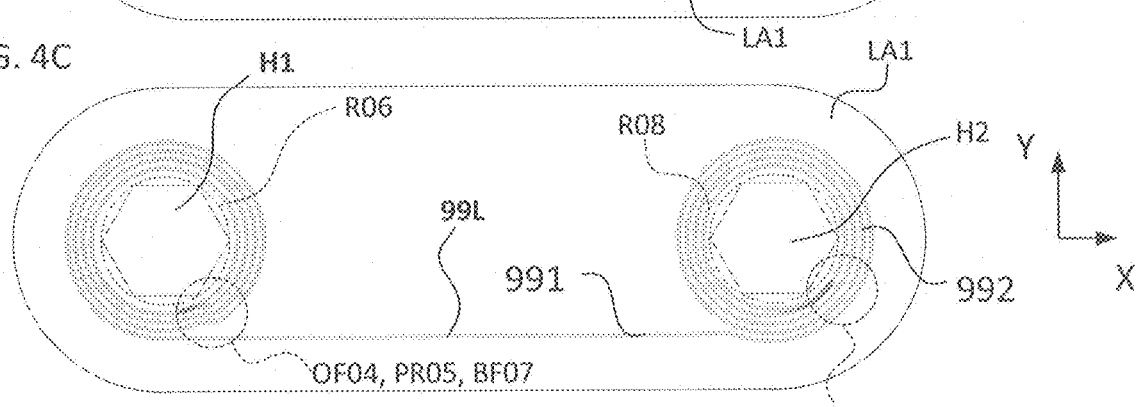
FIG. 4C shows the reinforcement formation of FIG. 2D, in this case including an overlap within the single layer at the beginning and/or end of the reinforcement formation.

It should be noted that only some toolpaths, composite swaths $2c$, and/or multi-swath fiber tracks form "loops", closed "loops", or "crossing turns" as continuously deposited in a single layer $LA_1$ of an additive manufacturing process. For example, FIGS. 4A-4C show such closed loops. Other structures discussed herein—for example the structures shown in FIGS. 4D-4E—may be alternatively deposited as a continuous composite swath in one layer $LA_1$, or as different composite swaths in adjacent layers $LA_1$, $LA_2$, i.e., may be deposited in a complementary manner to overlap in separately deposited layers $LA_1$, $LA_2$, and/or as separately deposited continuous composite swaths. In most cases, a diamond shaped intrusion or protrusion PR of composite swaths $2c$ into a neighboring layer $LA_2$ only occurs with crossing swaths $2c$ deposited within a same layer $LA_1$; and even where depicted as within one layer $LA_1$ in the Figures, in many cases, may be alternatively deposited as a vertically adjacent set of composite swaths $2c$, $2c$ (and not a protrusion PR) so long as the toolpaths or composite swaths $2c$ are deposited in different layers $LA_1$, $LA_2$.

Exemplary Linkage Arm Layers with Crossing Points

FIGS. 4A-4G show different examples of reinforcement formations 99A-99P for composite swaths $2c$ and/or path planning for connecting plates or linkage arms, in which each example includes a crossing point (labeled as a protrusion PR) where a section of composite swath $2c$ within a single layer LA-1 overlaps another section of composite swath $2c$ within the same layer $LA_1$. In each case, similar to FIGS. 2A-2H, a top down view presents a single layer view, with a few cycles of outlining for the composite swaths and/or toolpaths, and two holes are shown although the same principles extend to other contours. As noted, throughout this disclosure a few cycles of outlining or reinforcement formation 99 are often shown, but in each case the limit of the reinforcement formation is the outer wall of the part, and/or the perimeter of a neighboring region or contour. Accordingly, throughout this disclosure, it is contemplated that the reinforcement formations 99 are only limited by the walls of the part or neighboring regions. Some reinforcement formations may enter walls of the part or extend beyond (e.g., in a manner to permit composite swaths to be cut outside the part 14).

FIG. 4A shows a single crossing turn (with a single overlap PR01, PR02) at each end of a pattern similar to that of FIG. 2A and FIG. 4B shows a "double" crossing turn (with four overlaps PR03 a-d, PR04 a-d) at each end of the pattern shown in FIG. 2A. These crossing turns would be applicable for either spiral or offset following toolpaths or reinforcement formations. As previously discussed, the tracing or outlining toolpath strategy of FIG. 2A, in particular, includes a corner entrance/exit zone SC01 that is not reinforced by fiber, and which includes a Y-shaped junction and stress concentration of the two track sections at the corner SC01. If the pattern of FIG. 2A is repeated for many layers $LA_1$-$LA_m$ of an additive manufacturing part, the "seam" of stress concentration and lack of reinforcement may be continued along this corner SC01 in the vertical direction (e.g., extending for tens, hundreds, or even thousands of layers $LA_1$-$LA_m$). This may be addressed by alternating with the strategy of FIG. 4A or 4B (among other strategies discussed herein to change the character and/or the location of a gap, start, stop, or stress concentration of a composite swath or reinforcement formation). As shown, the strategy of FIG. 4B crosses at a crossing point PR01, PR02 the innermost lengths of longitudinal fiber, and generates an overlap/protrusion PR01, PR02 and buffer BF of one composite swath over another at the same corner where the Y-shaped junction of FIG. 2A occurs. By alternating the X-shaped or diamond-shaped crossing turn PR-01 of FIG. 4A with the Y-shaped gapped junction SC01 of FIG. 2A, the stress concentration at this corner may be differentiated and a homogenous seam does not form. The Y-shaped junction shown in FIG. 2A may include sufficient free space (e.g., space not occupied by composite swaths, which may be filled in with fill material) to permit the protrusion from FIG. 4A to intrude into the layer in which the pattern of FIG. 2A is formed. Alternatively, the spacing of the junction in FIG. 2A may avoid the protrusion by sufficient separation between parallel longitudinal connection substantially corresponding to the diamond-shaped protrusion (As shown in FIG. 6E), or with gentle curving to skirt the diamond shaped protrusion, but otherwise (As shown in FIG. 6F).

FIG. 4C shows the composite swath strategy, toolpath, or reinforcement formation of FIG. 2D, and in this case including an overlap PR05, PR06 at the respective beginning and/or end offset crossover or spiraling start region OF04, SP08 of the fiber path. In each case, e.g., for the left side offsetting concentric strategy, and for the right side spiral strategy, the overlap PR05, PR06 is a continuation of an arc which reinforces the last few degrees of arc of a circular perimeter regions R06, R08 about the holes H1, H2 (or a hoop stress load line) that, without overlap, would form a discontinuity in the composite swath loop (as shown in FIG. 2D, which may be filled with fill material 18a). The angular location (about the hole H1 perimeter) of the offset crossovers (and/or corresponding overlap PR05), and/or the beginning of the spiral (and/or corresponding overlap PR06) may be varied in a regular or random fashion in successive layers.

In this regard, as an alternative example, no buffer zone BF is shown in FIG. 4C. It should be noted that a limited protrusion PR of composite swath 2c into a layer L2 above, caused by an overlap PR05, PR06 such as that shown in FIG. 4C, may not be irreversibly cumulative, but may attenuate over several layers (e.g., 10 layers), and more so may attenuate to the point of no cumulative effect on layer height over many layers. Accordingly, should the single protrusion PR05, PR06 at either side of FIG. 4C be overprinted with a composite swath 2c (e.g., with no particular accommodation other than system deformation, or at a slower speed, lesser pressure, or temporary relaxation of layer height) and the angular location about the perimeter R06 and/or R08 varied through, for example 5, 10 or 20 different angular positions through a corresponding number of layers, the limited protrusion may tend to be continually and repeatedly "absorbed" over the layers. This principle applies especially the case of small protrusions/overlaps PR which have coordinate positions that can vary among layers, e.g., when the toolpath strategy or reinforcement formation 99 permits marching or successively staggering the position of an offset crossover, composite swath starting position, and/or composite swath ending position over the course of the toolpath or reinforcement formation 99. FIG. 4F, described below, also shows a protrusion PR into a layer above that may be successively marched about or along a similar version of the toolpath pattern or reinforcement region in different layers, depending on the position of an offset crossover, composite swath starting position, and/or composite swath ending position.

Figure 4D:
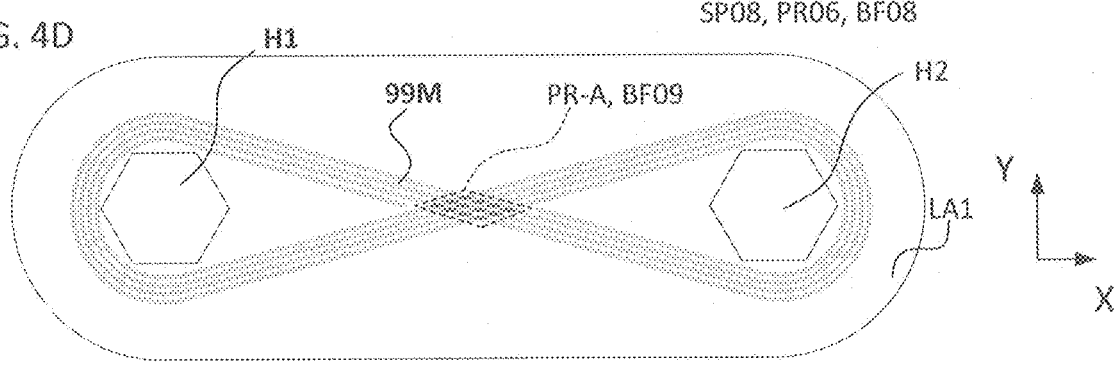
FIGS. 4D and 4E each show a 'FIG. 8 track' reinforcement formation as a composite swath or toolpath strategy about two holes.
Figure 4E:
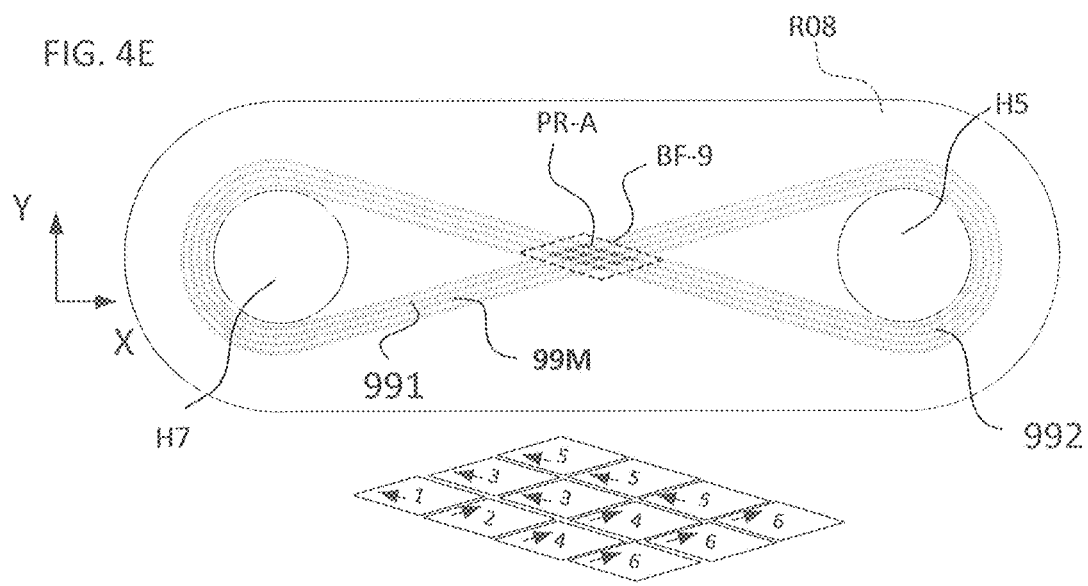
Figure 4F:
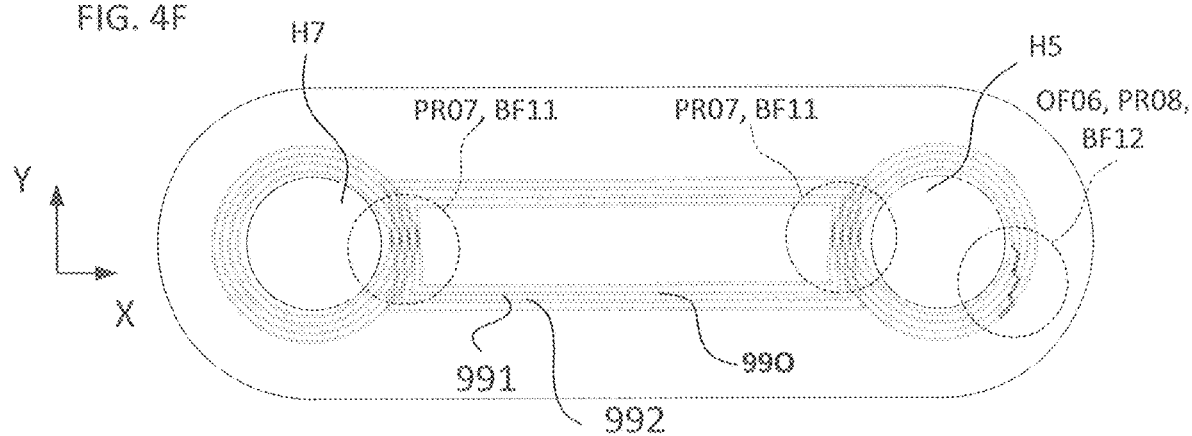
FIG. 4F shows a reinforcement formation or composite swath strategy, toolpath, in which two arrays of overlaps, with corresponding buffer zone, are formed adjacent each hole.

FIGS. 4D and 4E each show a 'figure 8 track' composite swath 2c, toolpath strategy or reinforcement formation 99M about two holes H1, H2, which crosses on each pass, crossing itself multiple times, with an innermost turn on one side corresponding to an outermost turn on the remaining side. The number of crossing points increases progressively, although within a single layer no more than two composite swath heights (e.g., including compaction to add to 1 to 2 composite swath heights overall). A matrix or array PR-A of 12 diamond-shaped overlaps PR is formed where the FIG. 8 track crosses itself. Within the array, one crossing point PR may be adjacent to two others and overlapped along two sides. Particularly with robust materials such as aramid fiber, this reinforcement formation 99M may be an alternative tensile load pattern to the patterns of FIGS. 2E and 2F, and the X-shape and/or center interlacing matrix may help resist twisting or torsion of the plane of the layer $LA_1$.

FIG. 4F shows a composite swath strategy, toolpath, or reinforcement formation 99O in which two arrays of overlaps PR07, with corresponding buffer zone BF11, are formed adjacent each hole H7, H5. In contrast to the reinforcement formation 99M of FIG. 4E, the composite swath 2c path nearest the left hole H7 is mirrored on the right hole H5, the path then transferring to the next offset at a crossover group OF06. Similar to FIG. 4G-2 below, the crossover group OF06 is optionally spread out and marched about the perimeter by overlapping composite swaths 2c within the reinforcement formation 99O. The offset group OF06, in contrast to FIG. 4G-2, shows a lesser amount of circuit length addition.

Figures 1, 4G:
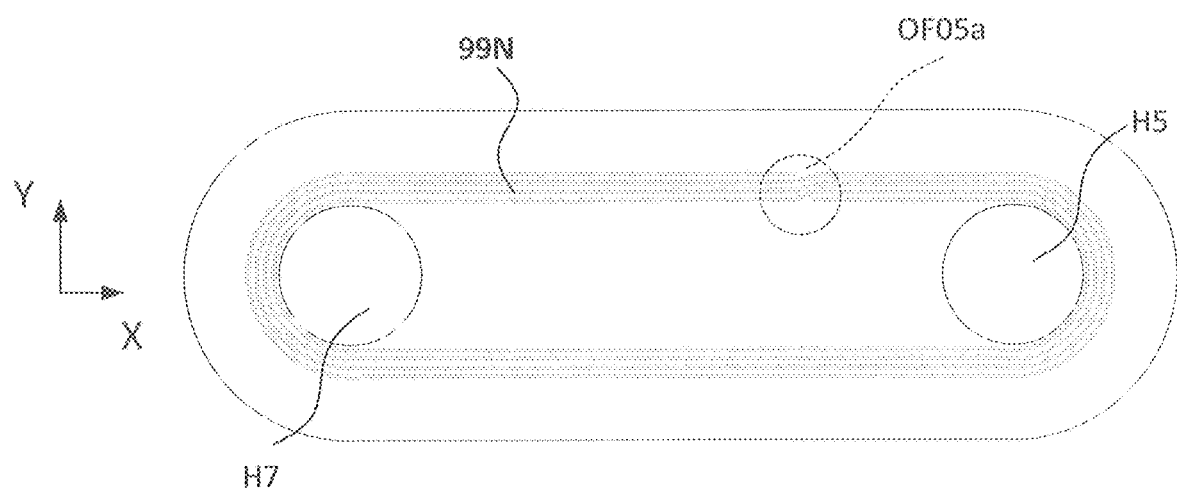
FIGS. 4G-1 and 4G-2 show a reinforcement formation or composite swath strategy, toolpath in which crossovers from a successive offset tracing strategy are marched about a perimeter of the reinforcement formation.
Figures 2, 4G:
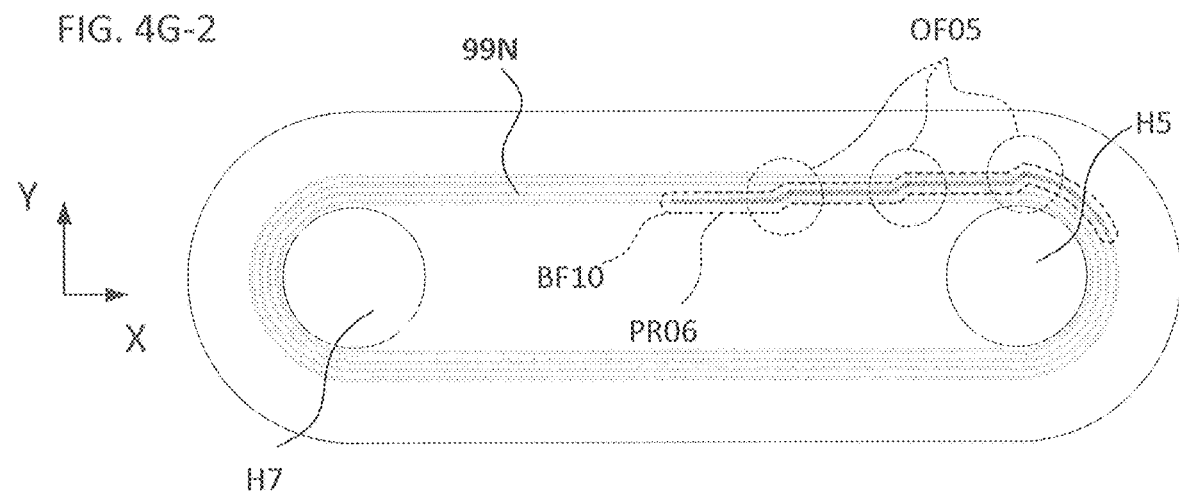

FIG. 4G-2 shows a composite swath strategy, toolpath, or reinforcement formation 99N in which crossovers from a successive offset tracing strategy are marched about the perimeter of the reinforcement formations. As a contrast, FIG. 4G-1 shows a composite swath strategy in which offset tracing is carried out, but without successive staggering or marching as discussed herein. As shown in FIG. 4G-1, in order to lay a composite swath 2c in a path parallel to a contour, in this case a tension load type contour about the two holes H7, H5, in each loop a crossover changes paths from one offset to the parallel offset. Without overlapping the composite swaths 2c, FIG. 4G-1 shows that subsequent crossovers generally are in the same location as the first. Spiral strategies do not have crossovers, but also do not follow parallel to offsets. While the entire group of crossovers of FIG. 4G-1 can be varied in position from one layer to another, within a single layer the crossover group is a gap, start, stop, or stress concentration as described that can create a seam-type formation. In the reinforcement formation of FIG. 4G-2, the offset group OF05 is spread out by overlapping composite swaths 2c within the reinforcement formation 99N. Specifically, each loop is continued for 1-20% longer than the complete circuit, and then a crossover is made to the neighboring offset. As shown in FIG. 4G-2, each offset is thereby 1-20% of the circuit distance from the next offset. A buffer zone BF10 surrounds a protrusion PR06 following the form of the overlaps. As noted, if the reinforcement formation 99N is repeated or alternated in an adjacent layer, the offsetting may begin from a position further along the circuit or loop from the last overlap portion or buffer zone location of the layer underneath or above.

Exemplary Linkage Arm Layers with Overlap

FIGS. 5A-5I show several examples single layer or two layer combinations of composite swaths 2c or reinforcement formations 99 demonstrating overlaps PR, buffer zones BF, and complementary reinforcement formations 99.

Figure 5A:
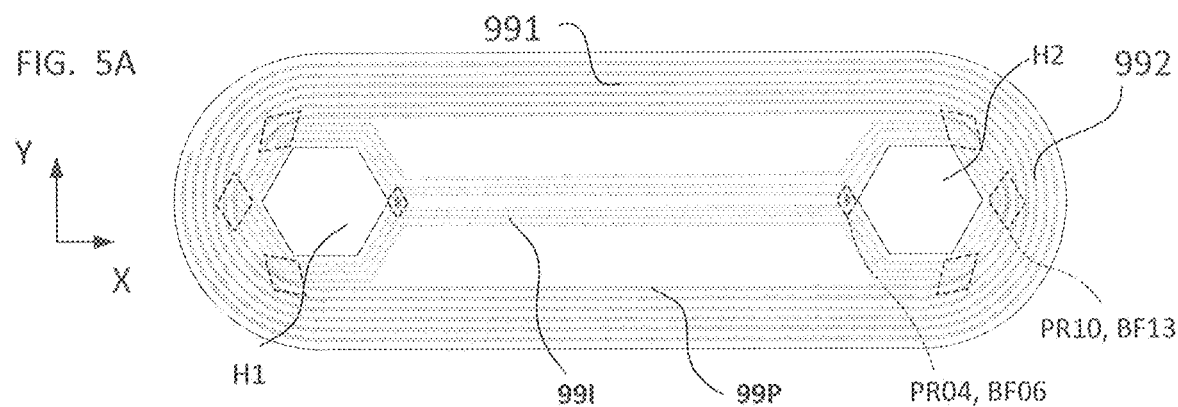
FIG. 5A shows a first reinforcement formation surrounding two hexagonal holes (e.g., the formation of FIG. 5A), together with a second reinforcement formation surrounding the first reinforcement formation.

FIG. 5A shows a first composite swath reinforcement formation 99I surrounding two hexagonal holes H1, H2 (e.g., the formation of FIG. 5A), together with a second composite swath reinforcement formation 99P surrounding the first composite swath reinforcement formation 99I, as shown, within the same layer $LA_1$ (although these formations 99I, 99P could be used in a complementary fashion in different layers L1, L2). As discussed with reference to FIG. 4A, the first formation 99I is an outwardly spiraling looping formation following a shortest line between the two hexagonal holes H1, H2. The first formation 99I includes one isolated overlap or crossing point at each end, nearest the hole H1, H2, in order to reinforce the walls of the hole H1, H2. The second formation 99P is an inwardly spiraling formation following the outer contour or wall of the part 14/$LA_1$, in this case until an overlap PR10 with the first formation (although this is optional, as the extent of the formation may be more limited, and/or set to avoid overlap PR10). Six overlaps PR10 are marked with six buffer zones BF13, and two overlaps PR04 with two buffer zones BF06.

As shown in FIG. 5A, if the second reinforcing formation 99P may be deposited and compacted in the same layer $LA_1$ as the first reinforcing formation 99I, a number (in this case six) of isolated overlaps PR10 may occur. If the first and second formations 99P, 99I are printed in the same layer, then one or both of two strategies, as discussed herein, may be used to accommodate the protrusions into the next layer. In a "smooth-over" strategy, the toolpath planner and/or three dimensional printer use only fill material 18a adjacent or above the overlap/protrusion, and plans or deposits patterns of fill material 18a and/or composite swaths 2c in the layer $LA_2$ above the protrusions PR10, PR04 to avoid the overlap/protrusions PR10, PR04. In this case, a subsequent layer $LA_3$ may be printed without reference to a protrusion PR10, PR04 two layers below (but possibly with reference to any protrusions PR from the layer $LA_2$ immediately below). In an "attenuation" strategy, the toolpath planner or three dimensional printer may use fiber material swaths 2c in the next layer $LA_2$ in positions adjacent or above the overlap/protrusion PR10, PR04, but in such a case, in order to avoid accumulation of multiple overlap/protrusions, limits the number of stacks of protrusions to less than a threshold rate (e.g., less than 2 protrusion stacks in any 10 layers), and may optionally use additional layer height or slower print speeds at locations of underlying overlap/protrusions.

As noted, the second, inwardly spiraling reinforcement formation of FIG. 5A may be printed in a second layer above the first, outwardly spiraling reinforcement formation, and in such a case, does not overlap the isolated overlap/protrusions of the first formation, and may use the smooth-over or attenuation strategy to accommodate those protrusions.

In either case, when printed together with the first formation 99I, the second formation 99P provides additional reinforcement for tensile loads between the two holes H1, H2, reinforced wall strength in compression or vs. impact or crushing for the outer walls of the eventual multi-layer (e.g., 100-1000 layer) link arm. Further, the second formation 99P provides additional moment of inertia in cross section, in two bending directions. For example, with respect to an X-Y-Z coordinate system with the XY plane parallel to the layer and the X axis along a lone joining the hole centers, as shown, a part having the second formation 99P printed in substantially top and bottom layers along the Z direction will have a higher moment of inertia vs. bending loads on the X-Y plane as well as bending loads on the ZY plane.

Figure 5B:
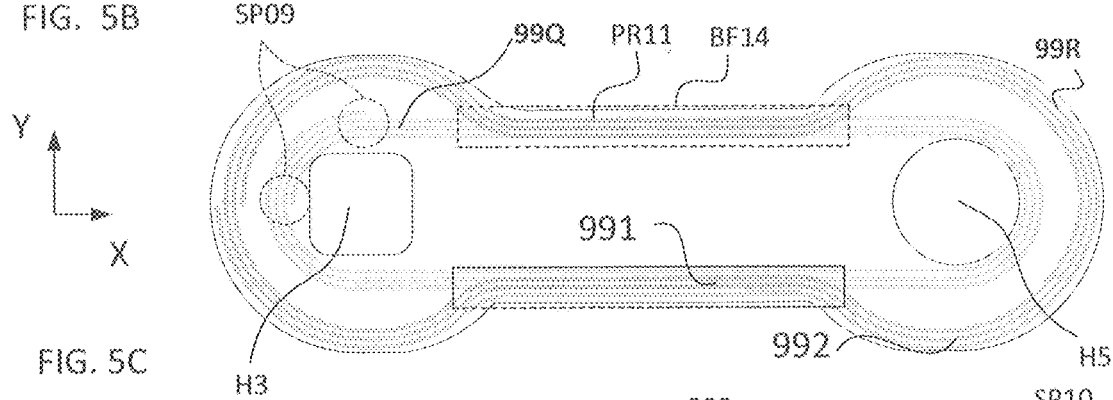
FIG. 5B shows a first composite swath reinforcement formation surrounding a round hole and a square hole (e.g., the formation of FIG. 2C), together with a second composite swath reinforcement surrounding the first composite swath reinforcement formation.
Figure 5C:
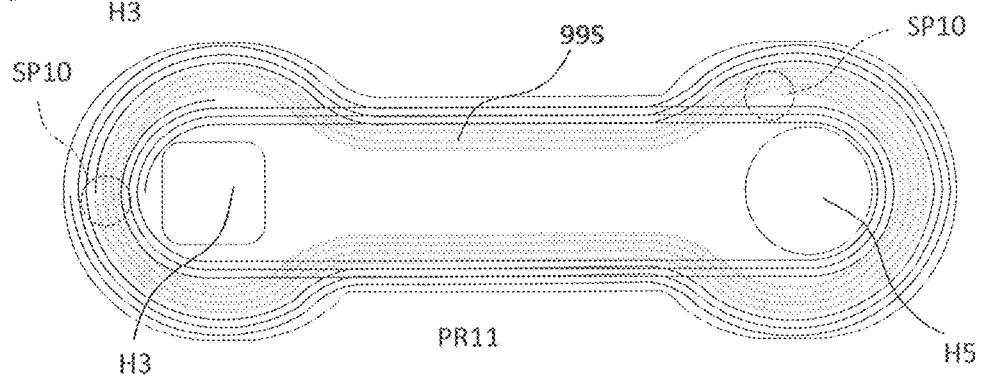
FIG. 5C shows, in schematic form, one application of a substantial smooth-over strategy in a layer above the reinforcement formation of FIG. 5B.

FIG. 5B shows a first composite swath reinforcement formation 99Q surrounding a round hole H5 and a square hole H3 (e.g., the formation of FIG. 2C), together with a second composite swath reinforcement formation 99R surrounding the first composite swath reinforcement formation. As discussed with reference to FIG. 2C, the first formation 99Q is an outwardly spiraling looping formation following an envelope including the two holes H5, H3. The second formation 99R is an inwardly spiraling formation following the outer contour or wall of the part 14 or layer $LA_1$. While neither the first formation 99Q nor the second formation 99R include crossing loops or turns, the outer positive and inner negative contours in this exemplary part are of different shapes.

As shown in FIG. 5B, if the second reinforcing formation 99R is deposited and compacted in the same layer as the first reinforcing formation, a number (in this case six) of isolated, elongated overlaps PR11 may occur. Two elongated buffer zones BF14 are marked as rectangular dashed outlines. If the first and second formations 99Q, 99R are printed in the same layer $LA_1$, then one or both of the "smooth-over" or "attenuation" strategies, as discussed herein, may be used to accommodate the protrusions PR11 into the next layer. Alternatively, the second, inwardly spiraling reinforcement formation 99R of FIG. 6B may be printed in a second layer $LA_2$ above the first, outwardly spiraling reinforcement formation 99Q, and in such a case, does not overlap the isolated overlap/protrusions of the first formation 99Q, and may use the smooth-over or attenuation strategy to accommodate those protrusions PR11.

In either case, when printed together with the first formation 99Q, the second formation 99R in FIG. 5B provides additional reinforcement for tensile loads between the two holes H5, H3, and reinforced wall strength in compression or vs. impact or crushing for the outer walls of the link arm, as well as additional moment of inertia in cross section. Further, direct overprinting and compression of the two elongated overlaps PR11 between the first and second layers may create a long ridge which resists shear among lamina. For example, should the either the "smooth-over" or "attenuation" strategies be used, at least some layers and potentially many layers will include protrusions PR into a layer above, and/or composite swaths which are partially within one layer of laminate fill material and partially in another.

FIG. 5C shows, in schematic form, one application of a substantial "smooth-over" strategy in a layer above the formations of FIG. 5B (e.g., in the case where they are printed in a common layer). The underlying composite swaths 2c are shown in FIG. 6B as thinner dark lines. As shown in FIG. 5C, an additional fiber reinforcement formation 99S extends through the part, about the holes H5, H3 and along the walls, in this case an inwardly spiraling formation from an outer, offset and internal contour including one or both of the buffer zones BF14 and the second formation 99R of FIG. 5B. In the "smooth-over" strategy, the layer $LA_2$ would include fill material 18a above the first and second formations 99Q, 99R of FIG. 5B. It may be noted that this formation 99S does not create any overlaps of three stacks of composite swath, and may also be used as a third formation 99S printed in the same layer as the first two formations 99Q, 99R of the FIG. 5B.

Figure 5D:
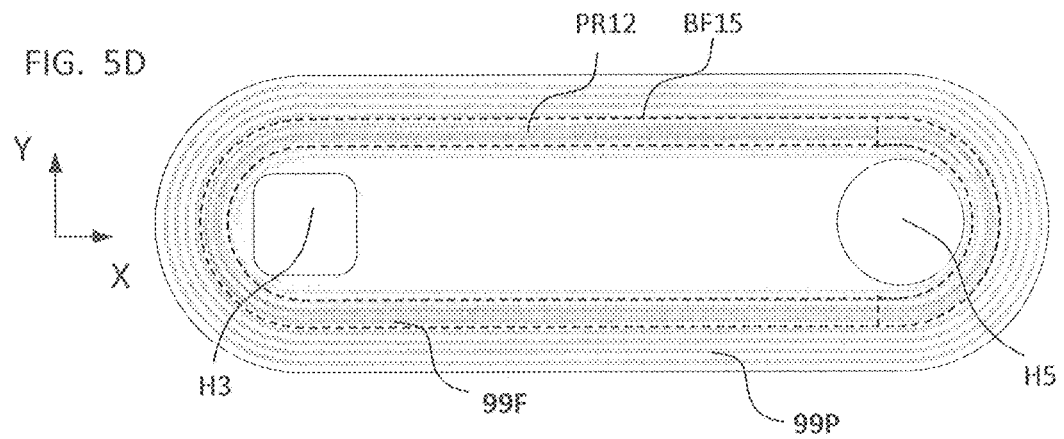
FIG. 5D shows a first composite swath reinforcement formation surrounding a round hole and a square hole (e.g., the formation of FIG. 2C), together with a second composite swath reinforcement surrounding the first composite swath reinforcement formation.

FIG. 5D shows a first composite swath reinforcement formation 99F surrounding a round hole H5 and a square hole H3 (e.g., the formation of FIG. 2C), together with a second composite swath reinforcement formation 99P surrounding the first composite swath reinforcement formation 99F. As with FIG. 5A, the second formation 99P is an inwardly spiraling formation following the outer contour or wall of the part, in this case until an overlap with the first formation 99F of more than one swath 2c width in a substantially full loop or circuit of overlap PR12 within one layer. This substantially full loop of overlap PR2, by direct overprinting and compression of the elongated overlap creates a loop ridge which resists shear among lamina X, Y, and angled X-Y directions, in the manner discussed with respect to FIG. 5BA but more extensively than with isolated overlap ridges.

Figure 6A:
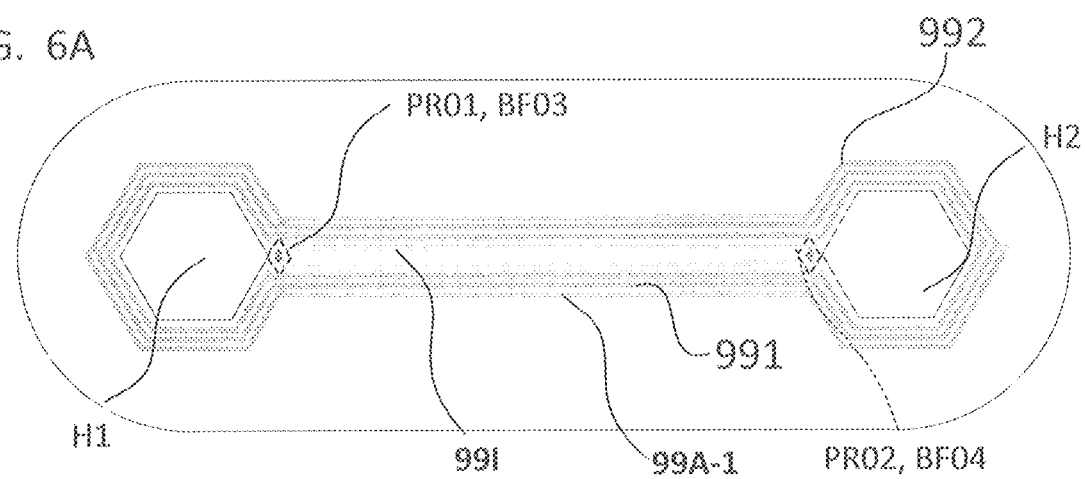
FIG. 6A shows, in schematic form, an application of a substantial smooth-over strategy substantially overlaying the reinforcement formation of FIG. 2A over the reinforcement formation of FIG. 4A, in which straight composite swaths are translated to avoid a protrusion.
Figure 6B:
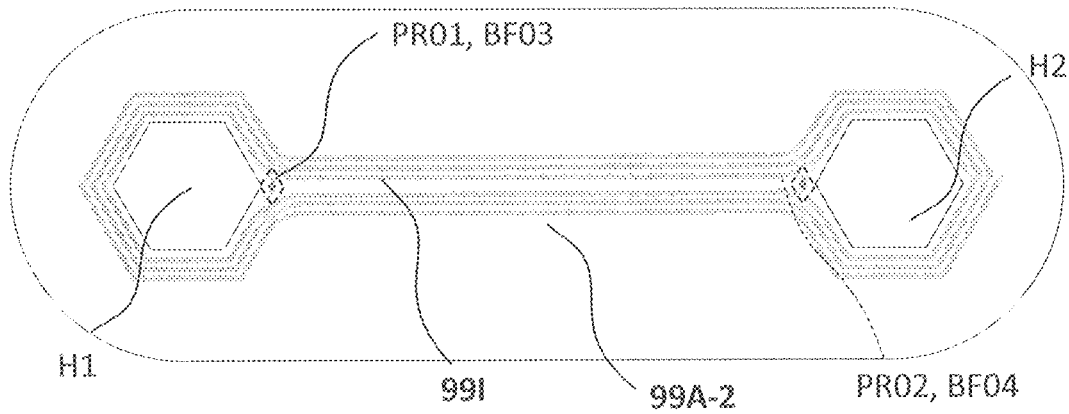
FIG. 6B shows, in schematic form, an application of a substantial smooth-over strategy substantially overlaying the reinforcement formation of FIG. 2A over the reinforcement formation of FIG. 4A, in which straight composite swaths are curved to avoid a protrusion.

FIGS. 6A and 6B show different versions of printing the reinforcement formation 99A of FIG. 2A over the reinforcement formation 99J of FIG. 4A in a smooth-over strategy. In FIG. 6A, the distance between the parallel, lengthwise portions of the circuits or loops are arranged to be of wider separation than the protrusion PR01 and/or its buffer zone BF03. As such, for example, if the nominal height of the swaths is 0.1 mm, and the protrusion into the second layer is 0.05 mm, then in a smooth over or fill material leveling strategy (i) the reinforcement formation 99A-1 avoids the protrusion PR01, PR02 and (ii) the printer fills in the second layer above the protrusion of 0.05 mm with an additional 0.05 mm of fill material 18a. All composite swath in the second layer are of height 0.1 mm and lower, and no part of the layer protrudes above the height of 0.1 mm. As such, a subsequent layer $LA_3$ may again return to composite swaths which create protrusions into a neighboring layer. It should be noted that the layer height need not be reset every two layers or otherwise, but instead the positions of protrusions and fill material leveling may be varied or distributed. FIG. 6B is similar to FIG. 6A, except that instead of displacing paths laterally as shown in FIG. 6A to accommodate the protrusion PR01, the paths are curved near the protrusion PR01 to avoid the PR01.

Exemplary Intra-Layer and Inter-Layer Crossing Points

Figure 9A:
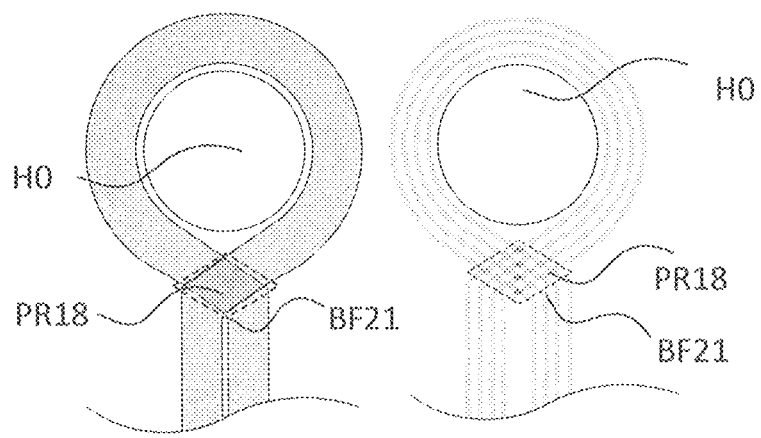
FIG. 9A shows the reinforcement formation or pattern represented in FIG. 7A, broken out as a 4-swath track
Figure 9B:
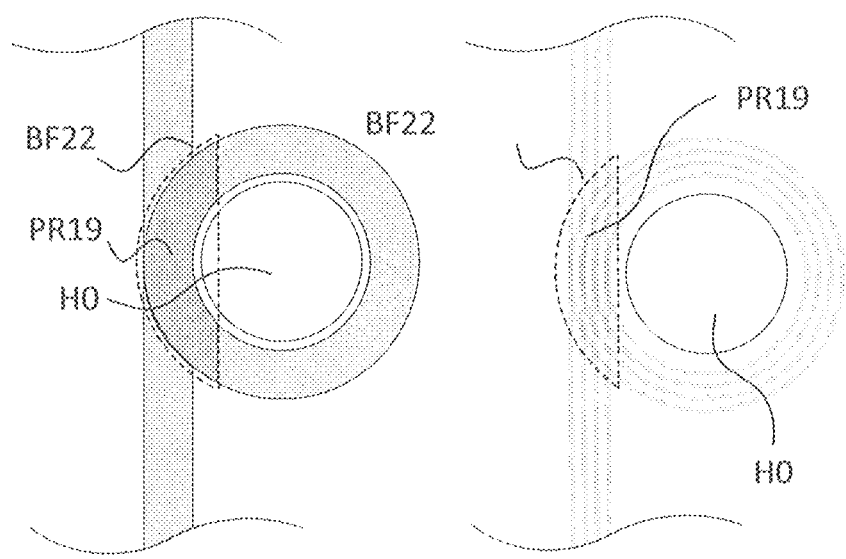
FIG. 9B shows the reinforcement formation or pattern represented in FIG. 7B, broken out as a 4-swath track.

FIGS. 7A-7C show three examples of crossing turns, i.e., loops or crossed loops that are made about internal geometry, such as a hole within a layer (a hole represented as a negative contour); and FIGS. 7D-7E show two examples that may be crossing turns but could also be distributed between two layers. Each represented crossing turn may depict either a single composite swath, or a multi-swath track of parallel composite swaths (e.g., as shown in FIGS. 9A and 9B). "Track" in this context means closely arranged (often touching), and often parallel swaths, which may be printed concentrically, spirally, or in parallel. A track need not have all swaths parallel throughout its entire length. The followed hole H0 is in each case circular, but may be any shape having a perimeter that can be followed by a toolpath (e.g., hexagonal or square). In FIGS. 7A-7E, single layer or double layer overlaps (i.e., locations where a swath or multi-swath track is directly over an underlying swath or multi-swath track within the same printing layer) are depicted as darker shade and single swaths or multi-swath tracks as comparatively lighter shade/transparency). In several cases, parallel or neighboring entering and exiting swaths or multi-swath tracks are depicted as cleanly separated and cleanly on either side of the center line, but may overlap and/or cross a center line.

Figure 13:
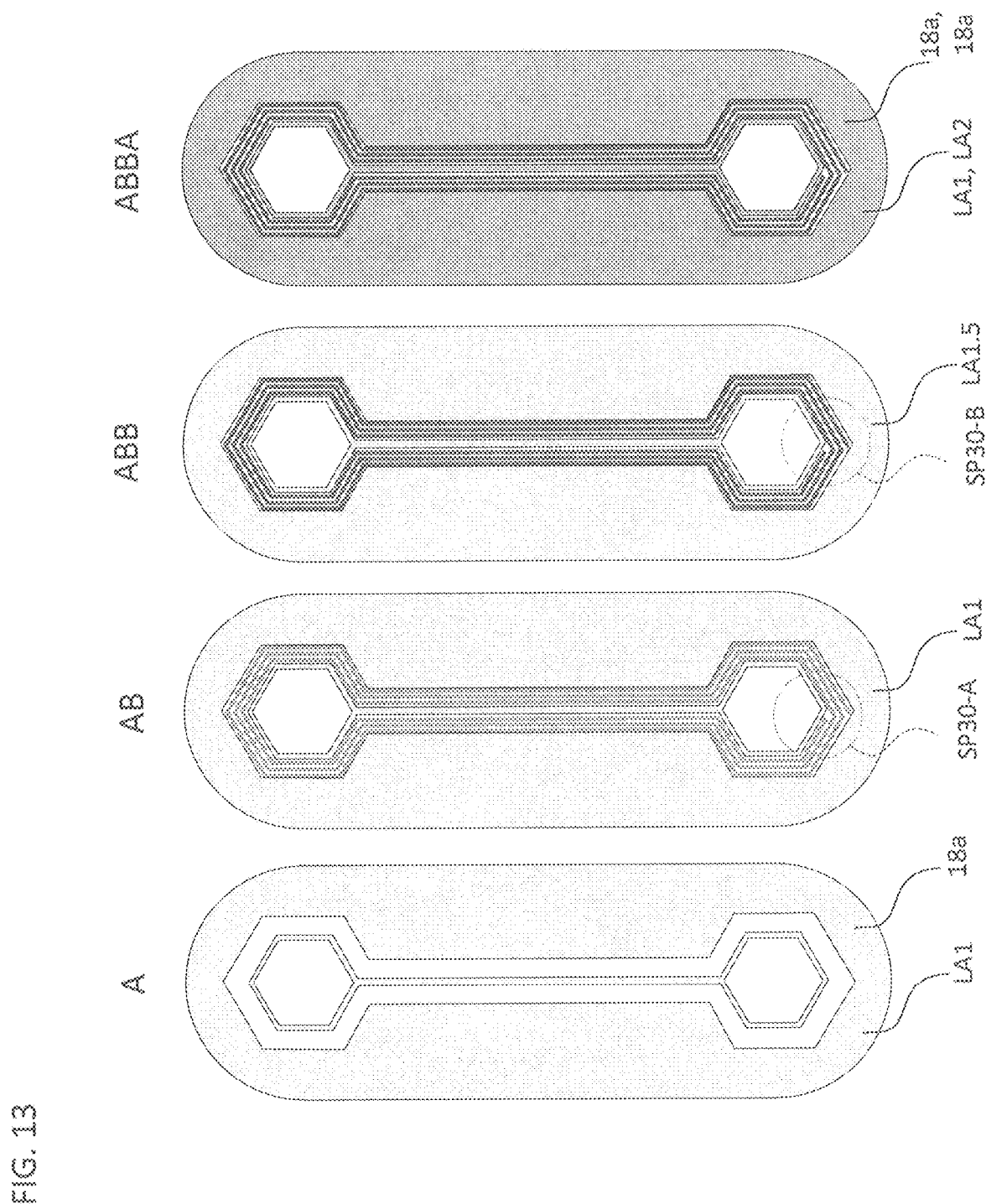
FIG. 13 show the principles of FIGS. 2A-9H applied in which the composite swath $2c$ of a reinforcement formation in a layer $LA_n$ is continuously deposited end-to-end with an adjacent reinforcement formation continuing into the next layer $LA_{n+1}$, i.e., without cutting the composite swath $2c$ as the part 14 is indexed to the next layer.
Figure 14A:
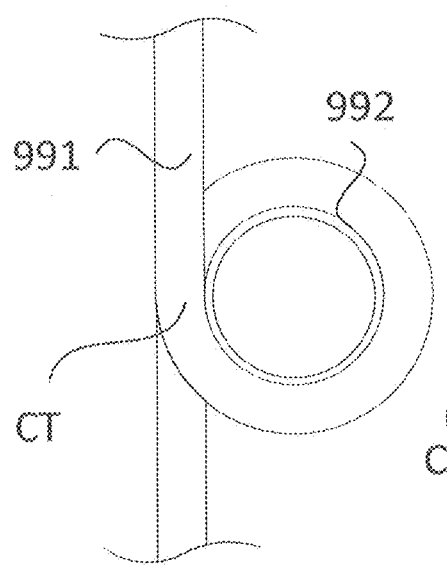
FIGS. 14A-14E show designations of crossing turns (CT) for the formations of FIGS. 2A-2E.
Figure 14B:
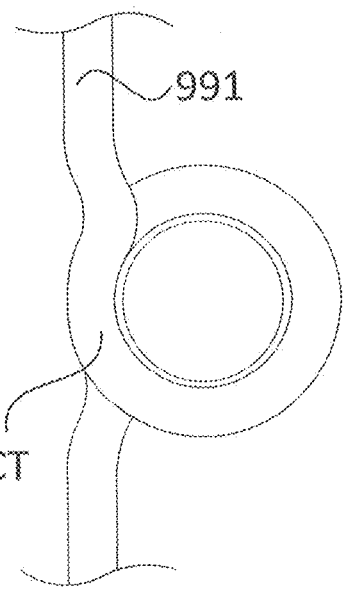
Figure 14C:
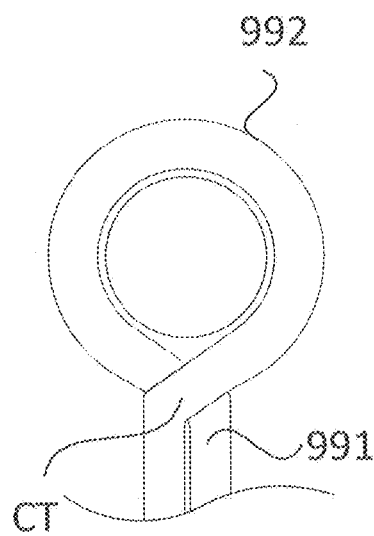
Figure 14D:
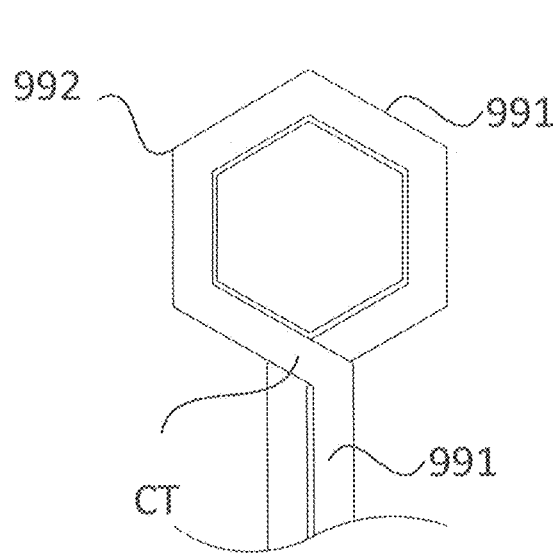
Figure 14E:
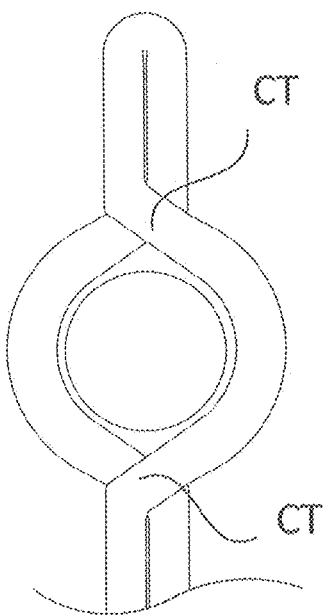
Figure 16A:
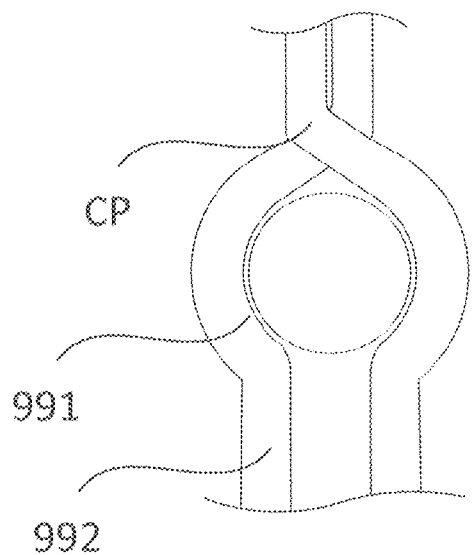
FIGS. 16A-16C show designations of crossing points (CP), which are optionally also crossing turns, for the formations of FIGS. 8D-8G.
Figure 16B:
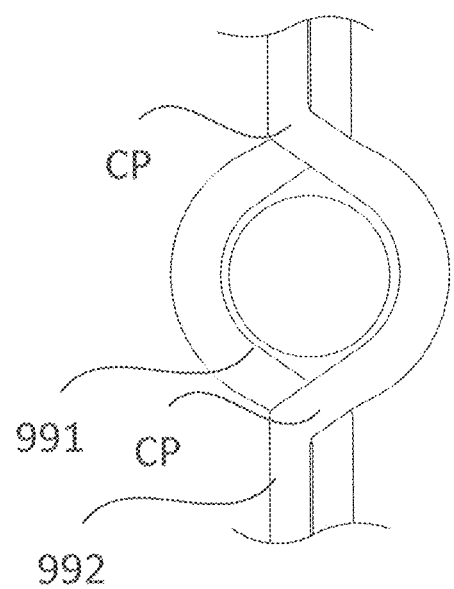
Figure 16C:
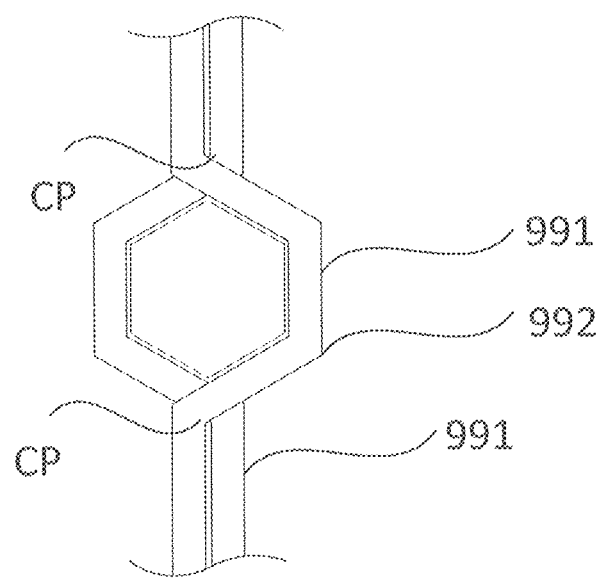

Crossing points made in a same layer, which may be one continuous composite swath or different composite swaths, may be referred to as "intra-layer" crossing points. Crossing points made between two layers, which in most cases may be different continuous composite swaths (one exception being the ABBA pattern of FIG. 13) are referred to as "inter-layer" crossing points. It should be noted that a raster pattern crossed with another raster pattern on another layer produces a dense array of inter-layer crossing points, but these crossing points do not particularly reinforce any neighboring feature or contour. As such, a single inter-layer crossing point (e.g., such as that in FIG. 7D or 7E) or a small group of inter-layer crossing points (e.g., such as that in FIG. 9H) are herein discussed as "isolated crossing points". As discussed herein, intra-layer crossing points tend to create protrusions at the crossing point layers in the case of composite swaths, less so in the case of extruded fill material alone; while inter-layer crossing points do not create such protrusions unless otherwise described.

FIG. 7A shows a crossing turn made about a hole H0, in which (i) the swath or multi-swath track approaches the hole H0 approximately parallel to an (imaginary) line through its center, axis or centroid, (ii) crosses the line to an opposing side of the hole, (iii) closely follows the perimeter of the hole H0, (iv) crosses itself and the line, and (v) departs from the hole H0 approximately parallel to itself and the line. A diamond-shaped overlap PR13 is formed, which may extend above the height of a single swath 2c. A buffer-zone BF15 may be created or marked about the overlap. This type of crossing turn closely follows and reinforces a hole wall for greater than 300 degrees of arc, and may be the end loop of a larger pattern. It should be noted that the entering and exiting swaths 2c or multi-swath tracks are depicted as cleanly separated and cleanly on either side of the center line, but may overlap and/or cross the center line.

FIG. 7B shows a crossing turn made about a hole H0, in which (i) the swath 2c or multi-swath track approaches the hole H0 approximately parallel to an (imaginary) line parallel to a tangent to a perimeter of the hole H0, (ii) crosses the line to follow a perimeter of the hole H0, (iii) closely follows the perimeter of the hole H0, (iv) crosses itself and (v) departs from the hole H0 approximately along the same line from which it approached, continuing the entry toolpath. A C-shaped overlap BF16 is formed, which may extend above the height of a single swath 2c. A buffer-zone BF16 may be created or marked about the overlap. This type of crossing turn closely follows and reinforces a hole wall for greater than 360 degrees of arc, and may be a middle loop in a larger pattern. It should be noted that the entering and exiting swaths 2c or multi-swath tracks are depicted as along the same line, but may be offset or exit at an angle to the approaching swath 2c or track. FIG. 7C shows a crossing turn similar to FIG. 7B, except that (i) the approaching swath 2c or multi-swath track is more offset from the (imaginary) tangent to the hole, and so turns slightly in an S-shape to approach the tangent at an angle, and similarly (v) departs from the hole H0 in a manner mirroring the entry. The C-shaped overlap PR15 and buffer zone BF17 may be of different or more concave shape.

FIGS. 7D and 7E show overlaps or crossing points adjacent a hole in which a bight, open loop or touching loop may be made away from the reinforced hole H0 from which the swath 2c or multi-swath track returns toward the hole H0 (e.g., one example of returning shown in FIG. 13E). A different swath 2c or multi-swath track within the same layer may also form the return path. In the case of FIG. 7D, (i) the swath 2c or multi-swath track approaches the hole H0 approximately parallel to an (imaginary) line through its center, axis or centroid, separated by approximately a track width, (ii) follows the perimeter of the hole H0, then (iii) crosses the line to an opposing side of the hole H0, and (iv) departs from the hole H0 approximately parallel to itself and the line. Upon returning from the pattern away from the hole H0, the swath 2c or multi-swath track (v) crosses itself and the line to an opposing side of the hole H0, (vi) closely follows the perimeter of the hole H0, and (vii) departs from the hole H0 approximately parallel to itself and the line, again separated by a swath or track width. A diamond-shaped overlap PR16, PR17 is formed, which may extend above the height of a single swath. A buffer-zone BF18, BF19 may be created or marked about the overlap PR16, PR17. This type of crossing point closely follows and reinforces a hole wall for 240 degrees of arc, and may be the end loop of a larger pattern. The crossing point of FIG. 7E may be complemented by a vertically mirrored version of itself in a complementary layer without stacking overlaps or buffer zones (as shown in FIG. 8E). The crossing point of FIG. 7D, in contrast, approaches the hole closer to the center line and crosses itself at both sides of the hole.

FIGS. 8A through 8F depict single-layer or two layer complementary approaches to reinforcing holes H0. As shown with respect to FIGS. 8A-8C, depending on the time, temperature, and pressure at which a crossing turn or parallel overlap is made, the upper composite swath 2c-2 or multi-swath track may protrude beyond the width or height of a single composite swath 2c-1 or multi-swath track, as may the lower one when the lower track is re-softened with application of reduced pressure (e.g., moving the compaction ironing tip above the current layer height by 10-90% of the next layer height while crossing the lower track), temperature or time (e.g., slowing the linear travel of the compaction ironing tip to 90-20% of the approaching or normal printing speed, or pausing the compaction ironing tip at the edge of crossing the lower track).

Each of FIGS. 8A through 8F is a set, first showing a crossing turn from the set of FIGS. 7A-7F, then a composite swath or multi-swath track complementary to the crossing point or crossing turn, and then a representation of overlap in two layers (including crossing turns within a single layer as well as overlap). In each of FIG. 8A-8F, among two layers, the accumulation of fiber stacking is no more than two heights of a composite swath 2c for the two reinforcing formations spanning two layers. A reinforcing formations may be a subset of a continuous composite swath 2c formed within a contour. In each of FIGS. 8A through 8F, among the two layers, composite swaths 2c may stack to 2 layer heights (generally one composite swath height in the underlying layer, with a protrusion area that may extend up by up to 2 times the layer height or 2 times a composite swath height; and only one composite swath height in the second layer, avoiding the intrusion/protrusion of stacked fiber from the lower layer). Accordingly, FIGS. 8A-8F accumulation of protrusions or composite swath height among layers.

Figure 8A:
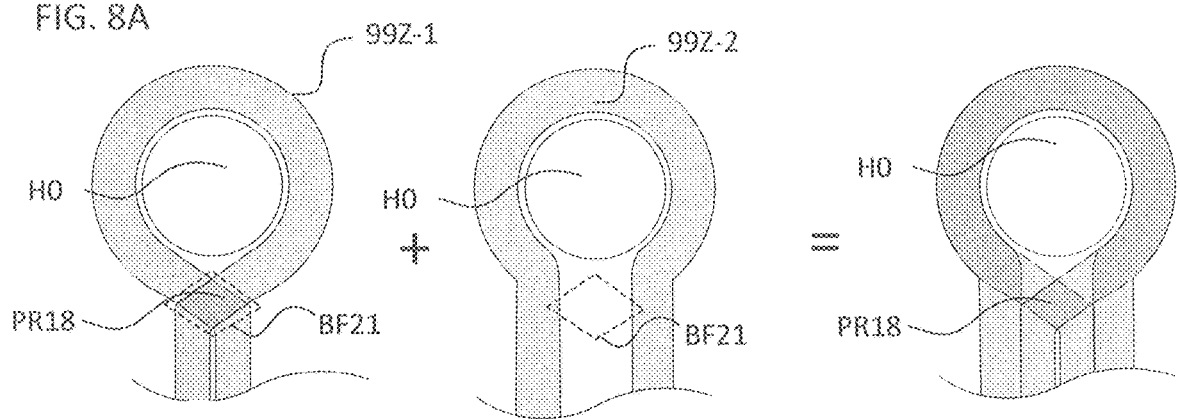
FIG. 8A shows the crossing turn of FIG. 7A formed as a roughly 300 degree arc follow, as a loop, crossing once, with the entry and exit parallel, adjacent, and in opposite directions on the same side of the hole.

FIG. 8A shows the crossing turn of FIG. 7A (e.g., reinforcement formation 99Z-1) formed as a roughly 300 degree arc follow, as a loop, crossing once, with the entry and exit parallel, adjacent, and in opposite directions on the same side of the hole H0. A diamond-shaped overlap PR18 or buffer BF21 is formed, where the height of the upwardly protruding fiber stack may be, e.g., 1-2 times the height of the underlying composite swath 2c-1. As shown, an open loop turn (e.g., reinforcement formation 99Z-2) may be formed about the same negative contour in the next layer. The open loop turn approaches from an (imaginary) line adjacent and parallel to the crossing turn entry, and with an edge separated from the center line by about half the protrusion/overlap/buffer width, follows the hole H0 or negative contour closely, and then returns along a parallel but opposite direction path. The open loop turn does not substantially cross over the protrusion PR18 from the layer below.

Figure 8B:
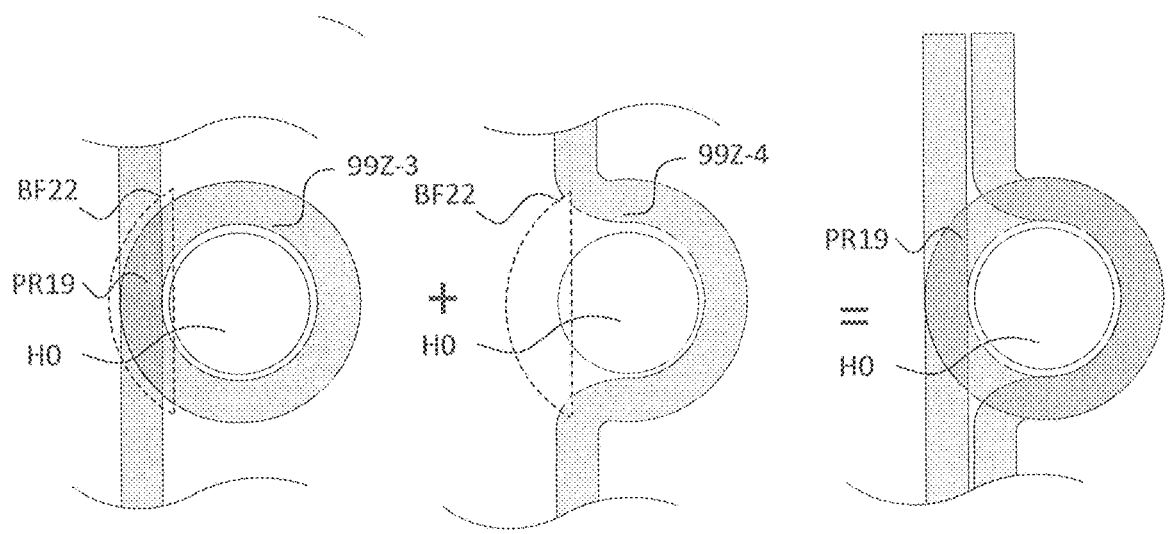
FIGS. 8B and 8C show the crossing turn of FIGS. 7B and 7C, respectively, formed as a roughly 360 degree arc follow, as a loop, crossing once, with the entry and roughly co-linear, and in opposite directions on either side of the hole.
Figure 8C:
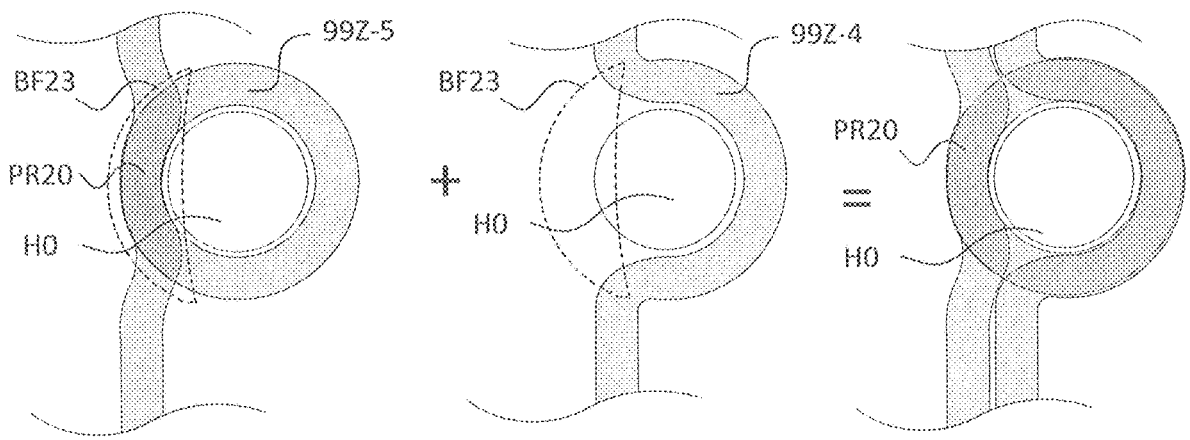

FIGS. 8B and 8C show the crossing turn of FIGS. 7B and 7C, respectively (e.g., reinforcement formations 99Z-3 and 99Z-5), formed as a roughly 360 degree arc follow, as a loop, crossing once, with the entry and roughly co-linear, and in opposite directions on either side of the hole H0. A C-shaped overlap PR19, PR20 or buffer BF22, BF23 is formed, where the height of the upwardly protruding fiber stack may be, e.g., 1-2 times the height of the underlying composite swath 2c-1. As shown, an open loop turn may be formed about the same negative contour in the next layer. The open loop turn (e.g., reinforcement formation 99Z-4) approaches from a line adjacent and parallel to the crossing turn entry, and with an edge adjacent to the lower layer's entry composite swath or multi-swath track, then following the hole or negative contour closely, and then continuing along and adjacent and parallel path to the exit path of the lower layer's exit composite swath 2c or multi-swath track. The open loop turn does not substantially cross over the protrusion PR19, PR20 from the layer below.

Figure 8D:
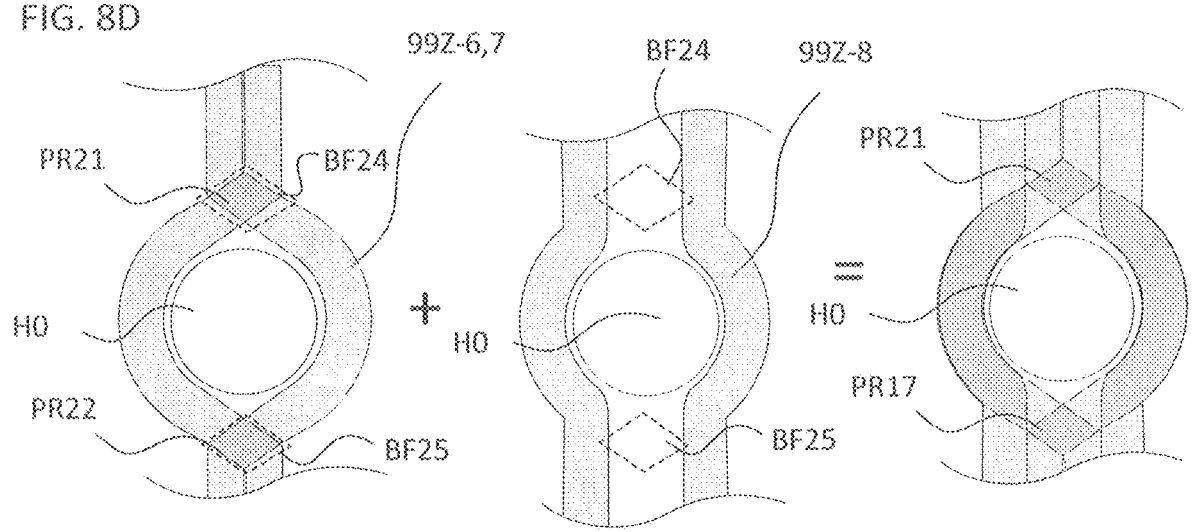
FIG. 8D shows the crossing points adjacent a hole of FIG. 7D formed as a pair of two 120 degree arc following paths.
Figure 8E:
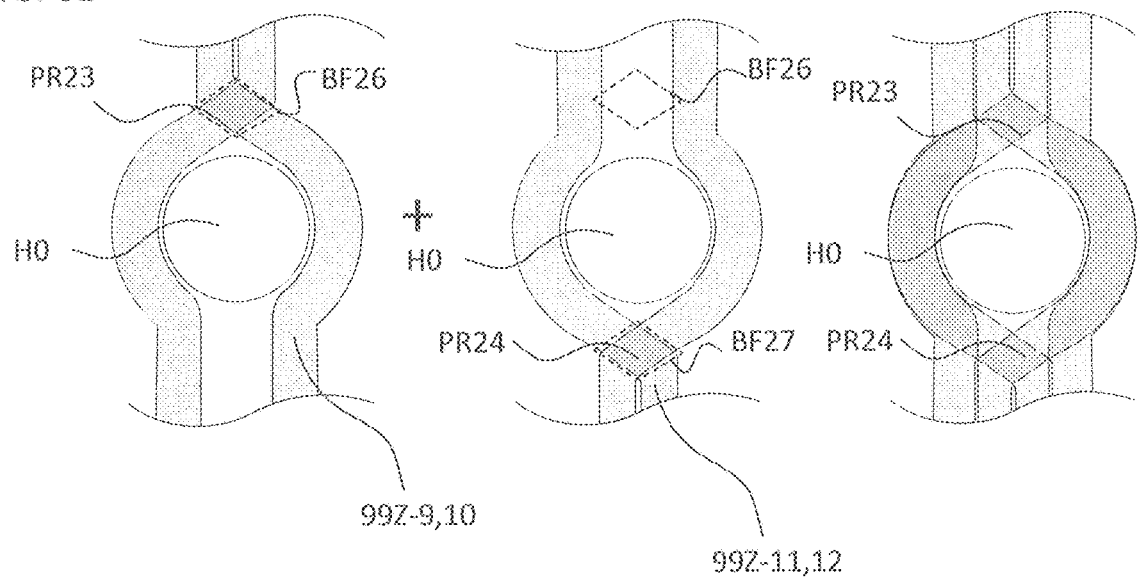
FIG. 8E shows the crossing turn of FIG. 7E formed similarly to FIG. 8D, except that the narrow and wider arms are shared among the two layers.

FIG. 8D shows the crossing turn of FIG. 7D formed as a pair of two 120 degree arc following paths (e.g., reinforcement formations 99Z-6 and 99Z-7), each a bight or open loop, crossing twice, with the entry and exit of each open loop being adjacent, and optionally in opposite directions. Two diamond-shaped overlaps PR21, PR22 or buffers BF24, BF25 of similar maximum height to FIG. 8D are formed. As shown, two more widely spaced bights or open loop turns (e.g., reinforcement formation 99Z-8) may be formed about the same negative contour in the next layer. The two more widely spaced bights approach from lines adjacent and parallel to the two lower open loop entries, each with an edge separated from the center line by about half the protrusion/overlap/buffer width, follows the hole or negative contour closely, and then continue or return along a parallel paths. As with FIG. 8A, the open loop turn does not substantially cross over the protrusion PR21, PR22 from the layer below.

FIG. 8E shows the crossing turn of FIG. 7E (e.g., reinforcement formations 99Z-9 and 99Z-10) formed similarly to FIG. 8D, except that the narrow and wider arms are shared among the two layers (each pattern or reinforcement formation has a composite swath 2c or multi-swath track which approaches the hole H0 narrowly and exits the hole H0 more widely, mirrored both horizontally and vertically as, e.g., reinforcement formations 99Z-11 and 99Z-12). FIG. 8E is distinctive because it includes an overlap PR23 in a lower layer, and an overlap PR24 in the upper layer (but in a different coordinate location from the lower overlap PR23). As such, while the two layers among them have a stacked composite swath height of greater than 2 composite swath heights, these reinforcement formations may be alternated among layers with no accumulation of height over many layers. As such, it is not necessary that among two layers, the maximum stacked composite swath height is no more than two composite swath heights. Protrusions from a lower layer may be avoided in an upper layer in patterns that extend over many layers, with lower and upper layers progressively building up in changing roles, many upper layers including protrusions avoided by layers above.

Figure 8F:
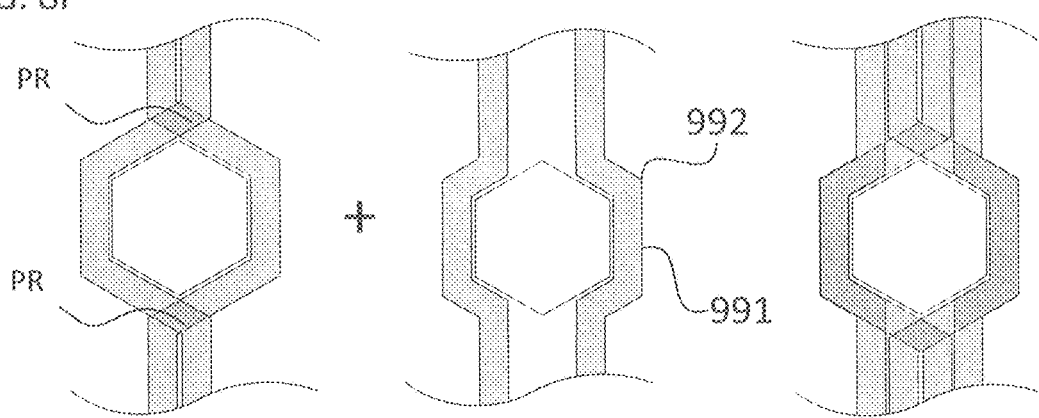
FIG. 8F is similar to FIG. 8D, but shows hexagonal hole and corresponding following crossing points adjacent the hole.

FIG. 8F is similar to FIG. 8B, but demonstrates that the principle shown and described with respect to FIG. 5B and protrusions PR is applicable to hexagonal holes (and additionally most negative and embedded contour shapes, e.g., square, rectangular, star-shaped or gear-shaped spline, and the like).

Figure 8G:
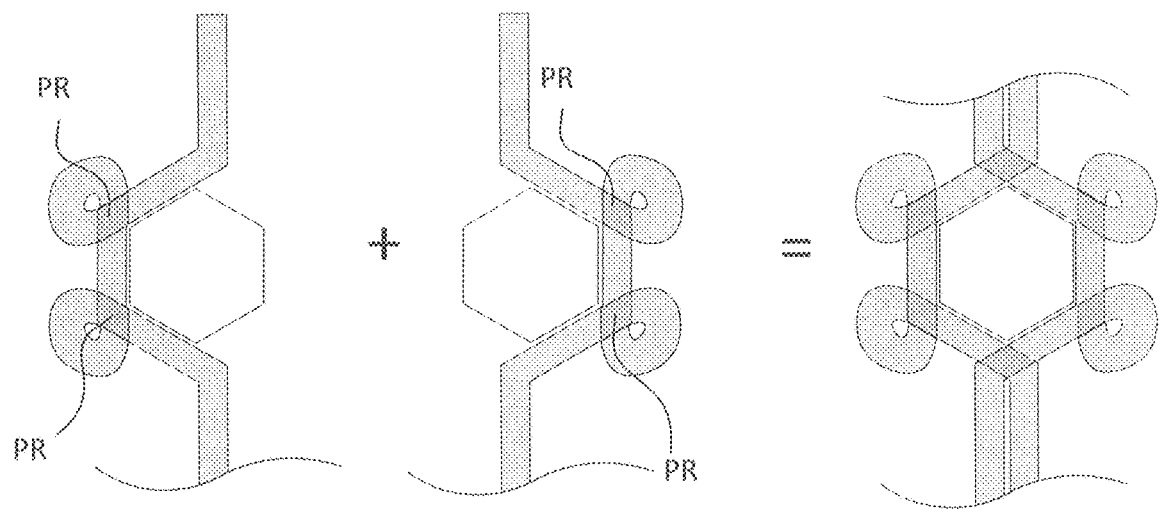
FIG. 8G demonstrates that self-crossing loops in a composite swath or multi-swath track may be generated to form sharp angle turns and additional corner reinforcement about holes, negative, and embedded contours.

FIG. 8G is similar to FIG. 7B, but demonstrates that self-crossing loops in a composite swath or multi-swath track which form protrusions PR may be generated to form sharp angle turns and additional corner reinforcement about holes, negative, and embedded contours.

Complementary Composite Swath Routing Between Two Layers

FIGS. 9A and 9B, with two different examples, show that the bight, open loop, closed loop, crossing turn, and jump patterns discussed herein, apply equally to individual composite swaths and to multi-swath tracks of multiple swaths. As shown in FIGS. 9A and 9B each composite swath 2c is printed individually, the increasing radius of successive turns about a same center is accommodated by different amounts of composite swath. It would be difficult for a wide (e.g., ½ cm or ⅛ inch or more) fiber composite tape to be placed as shown in many of the drawings, but the multi-swath tracks (e.g., successive tracks of 1:9 proportioned 0.1 mm thick swaths 2c) are laid with individual composite swaths 2c having differing lengths/perimeters/arcs.

As one example, FIG. 9A shows the pattern or reinforcement formation represented in FIG. 7A (which may represent from 1 composite swath 2c to, e.g., a 20-swath or higher track), and FIG. 9B shows the pattern represented in FIG. 7B, each "broken out" as a 4-swath track. Each of the swaths 2c is laid individually, and may be part of a larger pattern or reinforcement formation. For example, as a 4-swath track, each individual swath may integrate into a larger pattern or reinforcement formation arbitrarily (e.g., the 4 swaths may be any arrangement from interconnected within the part as a single continuous composite swath 2c to individual swaths 2c laid variously throughout the layer $LA_1$ together with numerous other continuous composite swaths). Appropriate widths or height dimensions or swath multiples may be represented, with the negative contours surrounded by crossing turns being of proportionate. For example, as a single swath of approximately 0.7 mm width, the negative or embedded contour or hole H0 shown in FIG. 7A or 7B would be of approximately 0.22 mm diameter. However, as a 4-swath track, the negative or embedded contour or hole H0 shown in FIG. 9A or 9B would be of approximately 1 cm diameter.

Figure 9C:
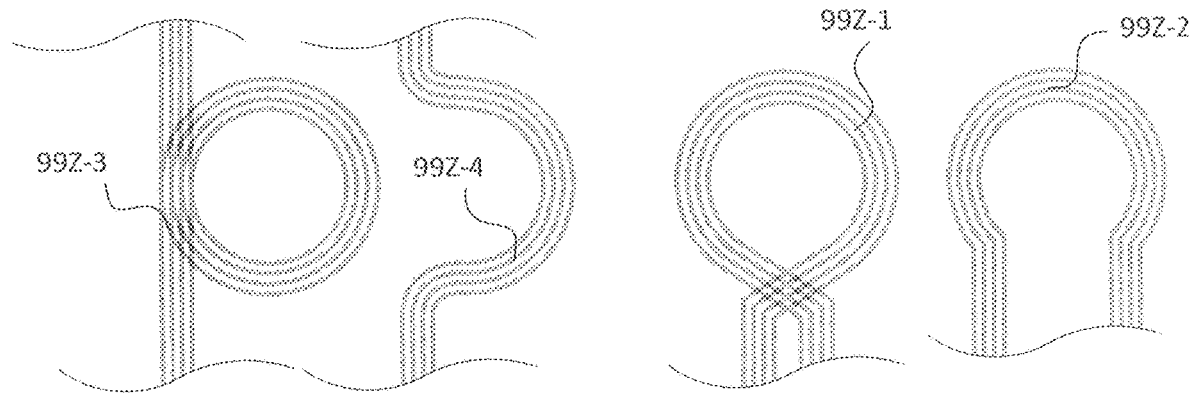
FIGS. 9C-9E show examples of using different patterns to vary reinforcement (and location of gaps, starts, stops, and/or stress concentration) among multiple layers.
Figure 9D:
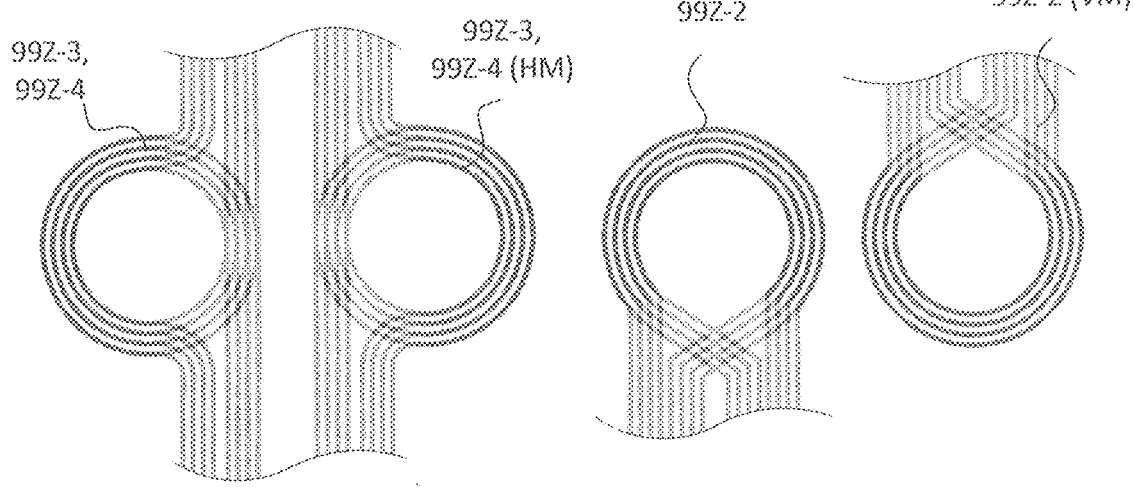
Figure 9E:
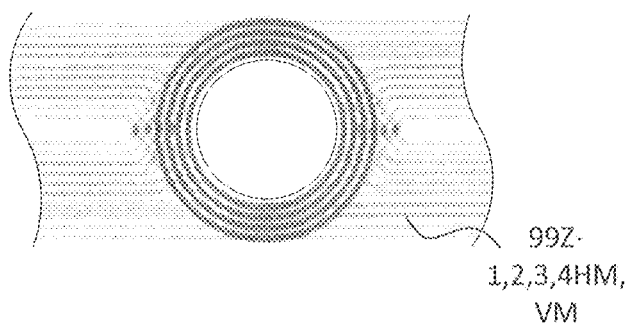

FIGS. 9C-9E show one example of using different patterns to vary reinforcement (and location of stress concentration) among multiple layers $LA_1$, in this case using the crossing turn and complementary example of FIGS. 9A and 9B, each in horizontally and vertically mirrored arrangements, to distribute wall reinforcement and stress concentration in about 4 layers. In each layer, the hole wall is reinforced over from 180 to 360 degrees, with unreinforced portions about the compass points depending on the layer. While mirroring is shown, any distribution about the center axis of the hole (e.g., radially symmetric, or random angle) would have a similar effect over a sufficient number of layers. FIG. 9E shows all 8 reinforcement formations overlaid in, for example, 4 layers $LA_1$-$LA_4$, with the wall-following reinforcement being denser in appearance in FIG. 9E. It should be noted that in many cases, the remainder of the toolpaths or reinforcement formations in each layer $LA_1$-$LA_4$ would be more densely filled with composite swaths.

Figure 9F:
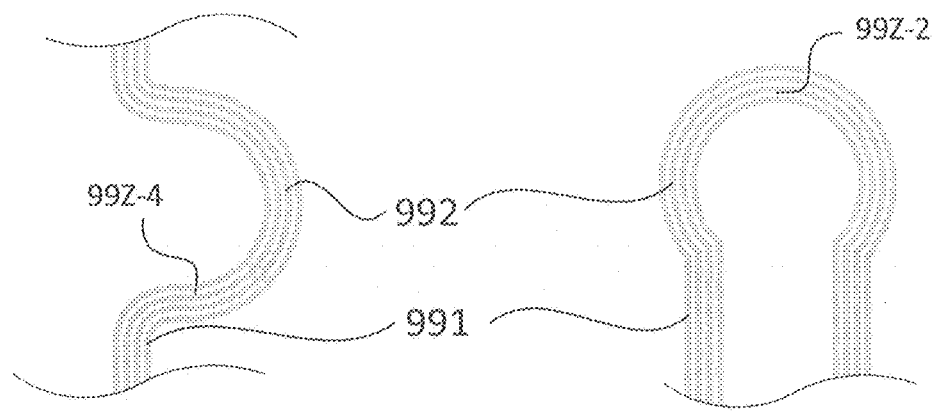
FIGS. 9F-9H show a similar example to FIGS. 9C-9E, except using reinforcement formations without crossing turns.
Figure 9G:
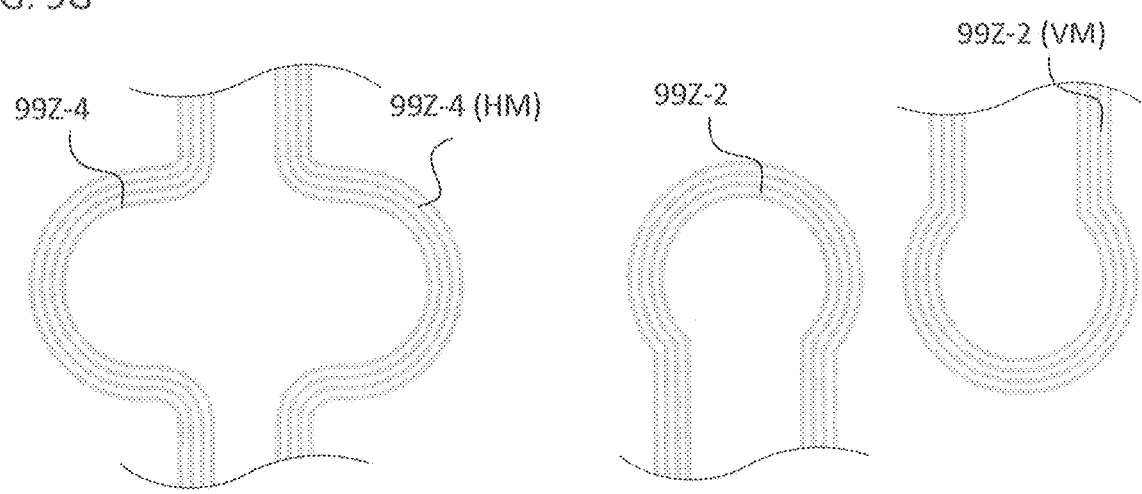
Figure 9H:
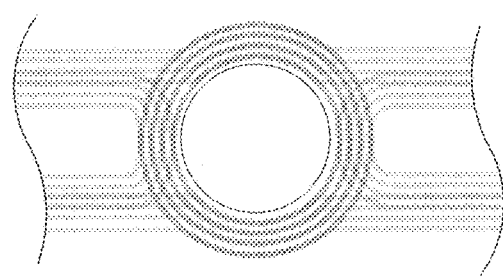

FIGS. 9F-9H show a similar example to FIGS. 9C-9E, except using paths without crossing turns (in each case, only the complementary paths). FIG. 9H shows the reinforcement formations 99Z-4, 99Z-2, mirrored horizontally (HM) and vertically (VM) e.g., in 4 layers, overlaid.

It should be noted that complementary patterns between two layers need not include a crossing point, jump, or crossing turn to have the benefits of the use of complementary patterns, or to maintain the amount of stacking at 2 composite swath thicknesses among 2 layers. The discussion herein of beneficial stacking of complementary patterns applies even to layers which do not cross composite swaths within the layer. For example, FIGS. 9F-9H show superimpositions of the complementary paths of FIGS. 6C-6E, but without the crossing turns. As shown, in 4 alternations over 4 layers, the hole H0 is reinforced on all sides, with gaps, stress concentrations and/or seams being distributed to different locations among layers (and within layers when reinforcement formations are formed within a same layer). Using crossing turns may have various benefits, among them additional freedom in determining the location of gaps, starts, stops, and stress concentrations; additional freedom in orienting gaps, starts, stops, and stress concentrations in different directions and in different forms; and resisting shear and layer and road delamination by creating inter-layer bonding and shear resistance (e.g., vertical, horizontal, and other binding surfaces). Note a "gap" may be an area within a layer $LA_n$ at the beginning, ending, or other location of a fiber or composite reinforcement formation that is filled with fill material 18a, e.g., because the shape of the region or contour within which the reinforcement formation is determined may not have sufficient space for fiber to be laid.

Figure 10A:
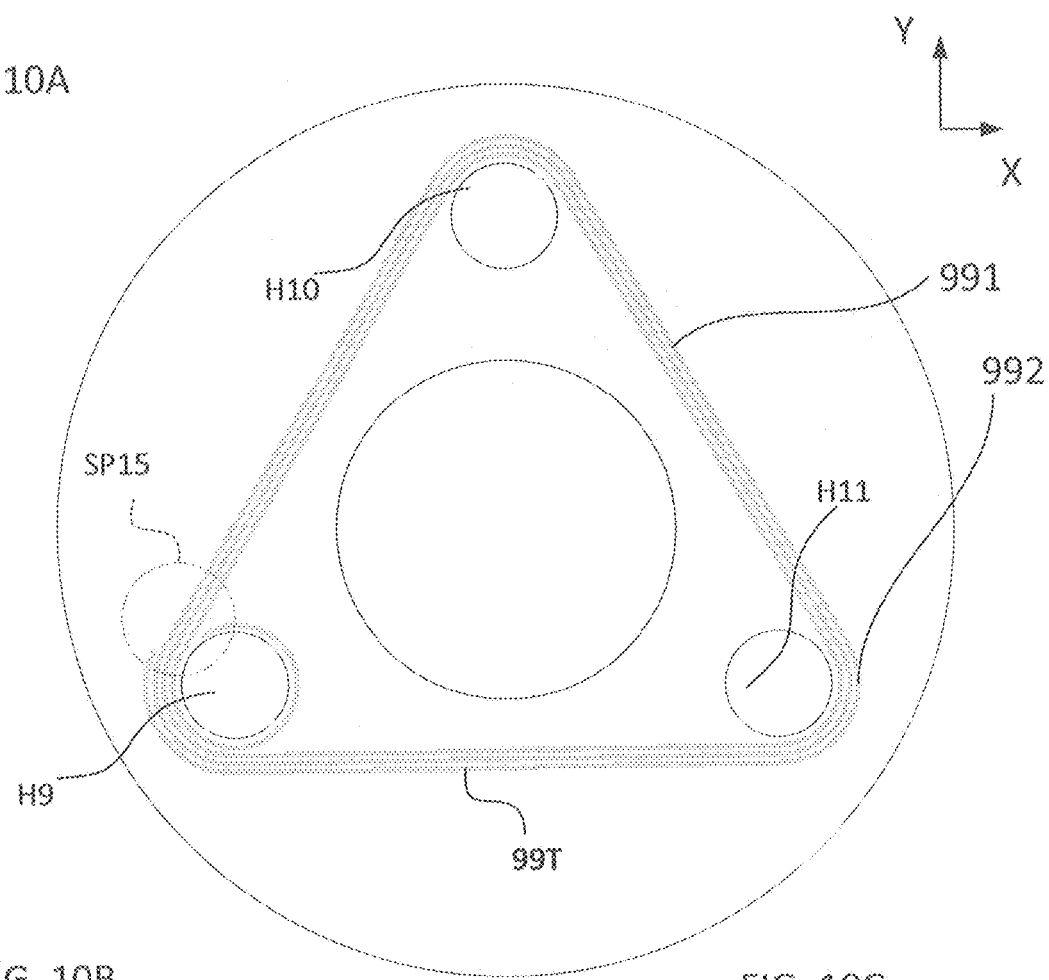
FIGS. 10A-10C show the principles of FIGS. 2A-9H in a trilaterally symmetric (three sided) context.
Figure 10B:
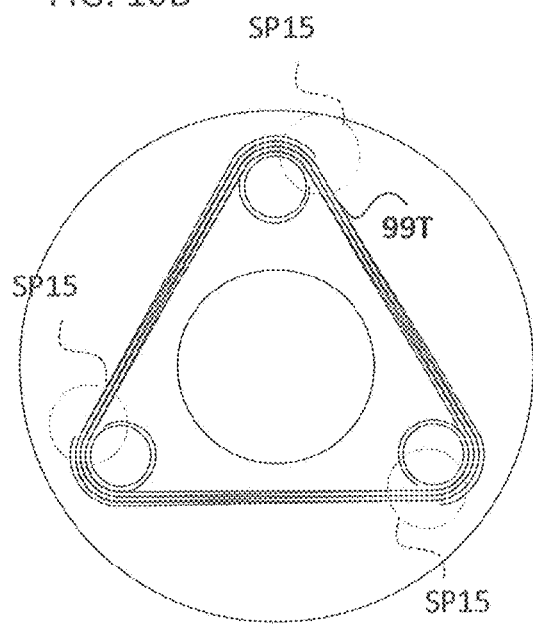
Figure 10C:
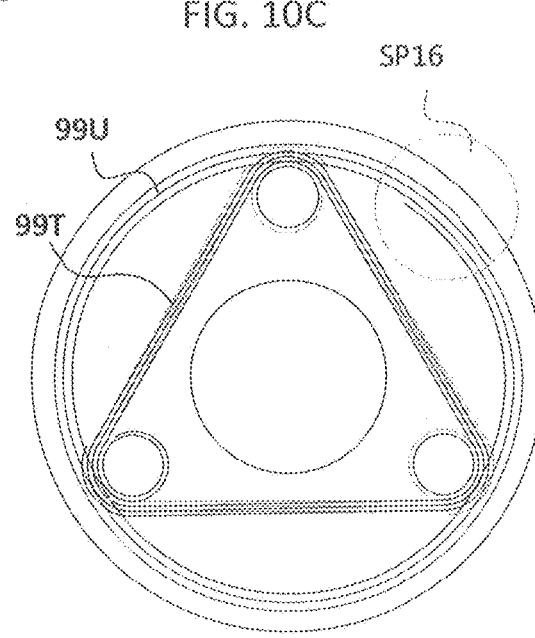
Figure 10D:
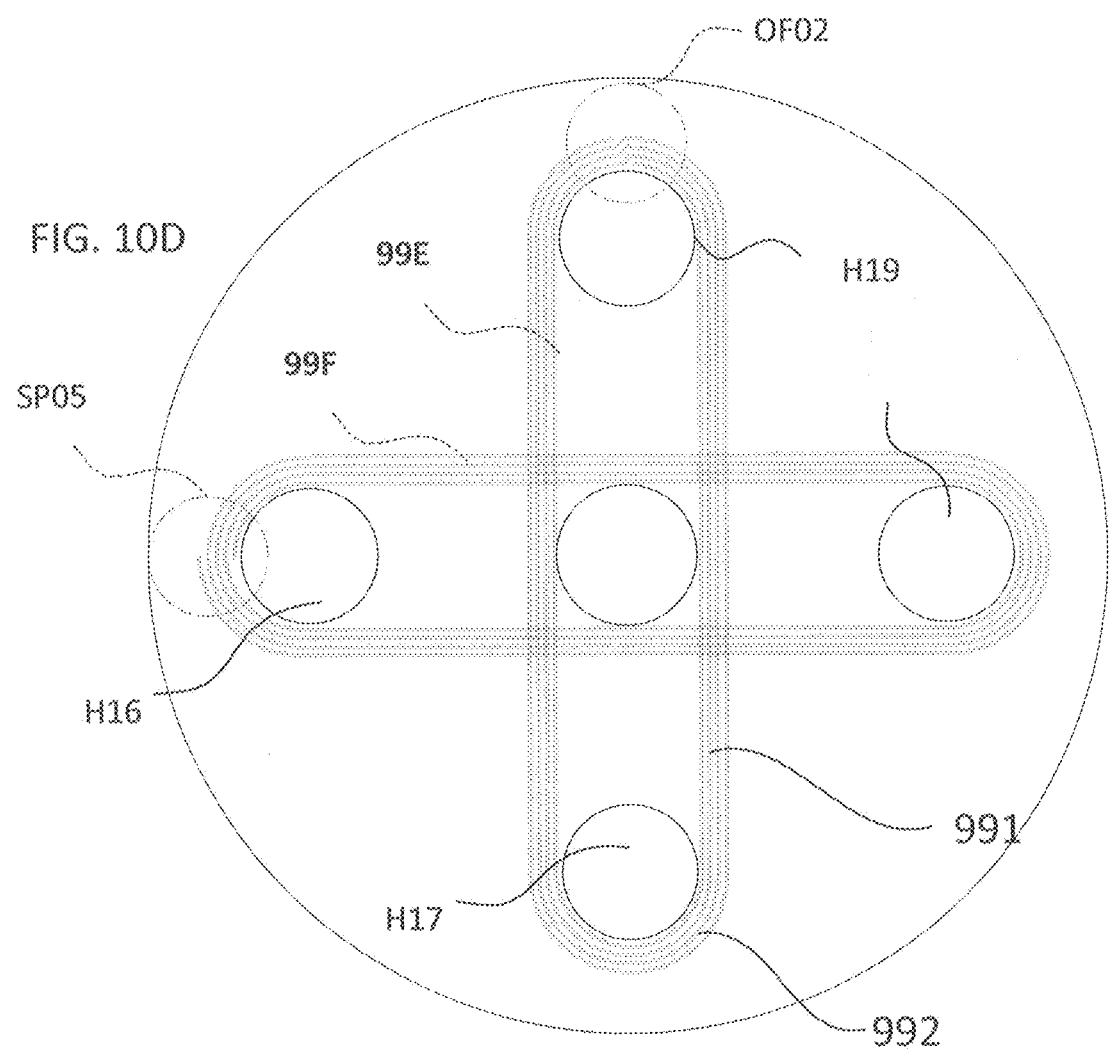
FIGS. 10D-10E show the principles of FIGS. 2A-9H in a four sided context.
Figure 10E:
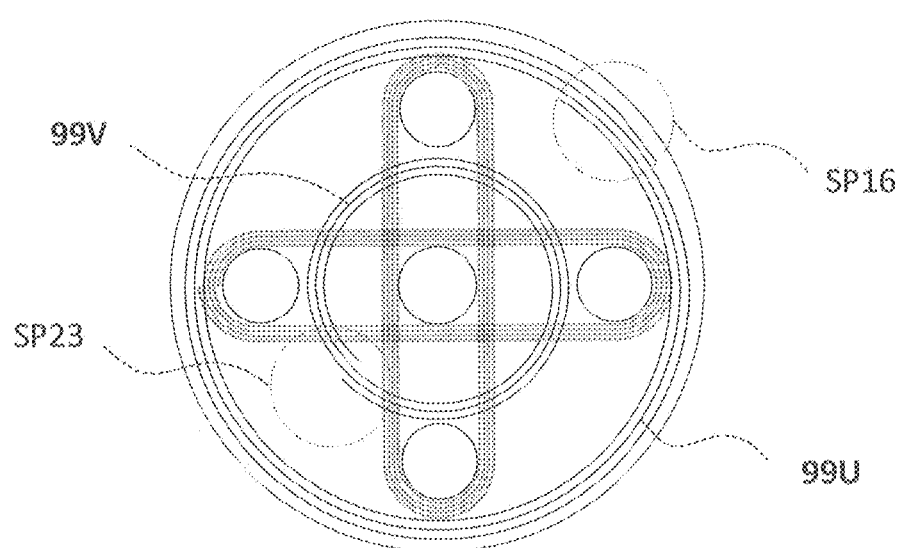

Three, Four, and More "Sided" (Optionally Substantially Rotationally Symmetric) Parts FIGS. 10A-10C show the principles of FIGS. 2A-9H in a trilaterally symmetric (three sided) context; FIGS. 10D-10E in a four sided context; and FIGS. 10F-10H in a second example of a three sided context.

FIG. 10A shows a single layer of a rotating or three-point contact connecting plate having three circular holes $H_a$, $H_b$, $H_c$ (here labeled H9, H10, H11). In FIG. 10A, as shown, contours or region followed by the strategy are coincident with the hole wall but may be offset from the hole wall (e.g., representing wall thicknesses of fill material 18a). In FIG. 10A, a reinforcement formation 99T having a spiral tracing strategy is used to follow the three negative contours of the hexagonal holes H1, outlined (linking H10, H11, H12). As shown in FIG. 10A, the spiral tracing strategy begins/ends at SP15 the toolpath surrounding 300 degrees of a round hole H9 and is "anchored" on that side (i) against the hole wall (ii) by the 300 degree curve about the hole wall and/or (iii) by surrounding composite swaths in the second and subsequent cycles/loops. As shown, the start/stop of a spiral SP15 toolpath do not necessarily start/stop at the same precise location, but may have additional or added length to surround negative contours or holes so that the lengths of fiber in tension are well anchored. The swaths 2c extending between the three holes H10, H11, H12 may be expected to carry load in a tension mode, and the swaths 2c closely surrounding the holes H10, H11, H12 may be expected to reinforce the walls of the holes H1, H2, in a combined tension-compression mode. FIG. 10B shows the superposition of three toolpaths or composite swath depositions or reinforcement formations 99T of FIG. 10A over one, two, or three layers, rotated from one another or trilaterally mirrored, placing the stress concentrations and/or gaps of the offsets and/or spiral start and end in positions displaced from one another in at least two orthogonal directions (here, substantially the X direction as well as the Z direction between layers). FIG. 10C shows the further superposition of a circular spiral toolpaths or composite swath depositions or reinforcement formation 99U over the same layers or an additional layer, two, or three two layers, carrying or reinforcing versus hoop stresses about the part.

FIG. 10D shows a single layer of a rotating or four-point contact connecting plate having four circular holes $H_a$, $H_b$, $H_c$, $H_d$ (here labeled H16, H17, H18, H19). In FIG. 10D, as shown, contours or region followed by the strategy are coincident with the hole wall but may be offset from the hole wall (e.g., representing wall thicknesses of fill material 18a). In FIG. 10D, reinforcement formations 99E and 99F, substantially similar to those depicted in FIGS. 2E and 2F, are used to follow the four negative contours of the holes, with the offset strategy of 99E beginning and ending at OF02, and the spiral strategy of 99F beginning and ending at SP05. The reinforcement formations are substantially as described with respect to FIGS. 2E and 2F, but are orthogonally arranged about different holes and deposited in one or two layers. The swaths 2c extending between the three holes H16, H17, H18, H19 may be expected to carry load in a tension mode, and if printed in the same layer may create protrusions. FIG. 10E shows the superposition of four toolpaths or composite swath depositions or reinforcement formations 99E, 99F, 99V, 99U or reinforcement formations 99T of FIG. 10A over one, two, three, or four layers, with the further superposition of two circular spiral toolpaths or composite swath depositions or reinforcement formations 99U, 99V carrying or reinforcing versus hoop stresses about the part.

Figure 10F:
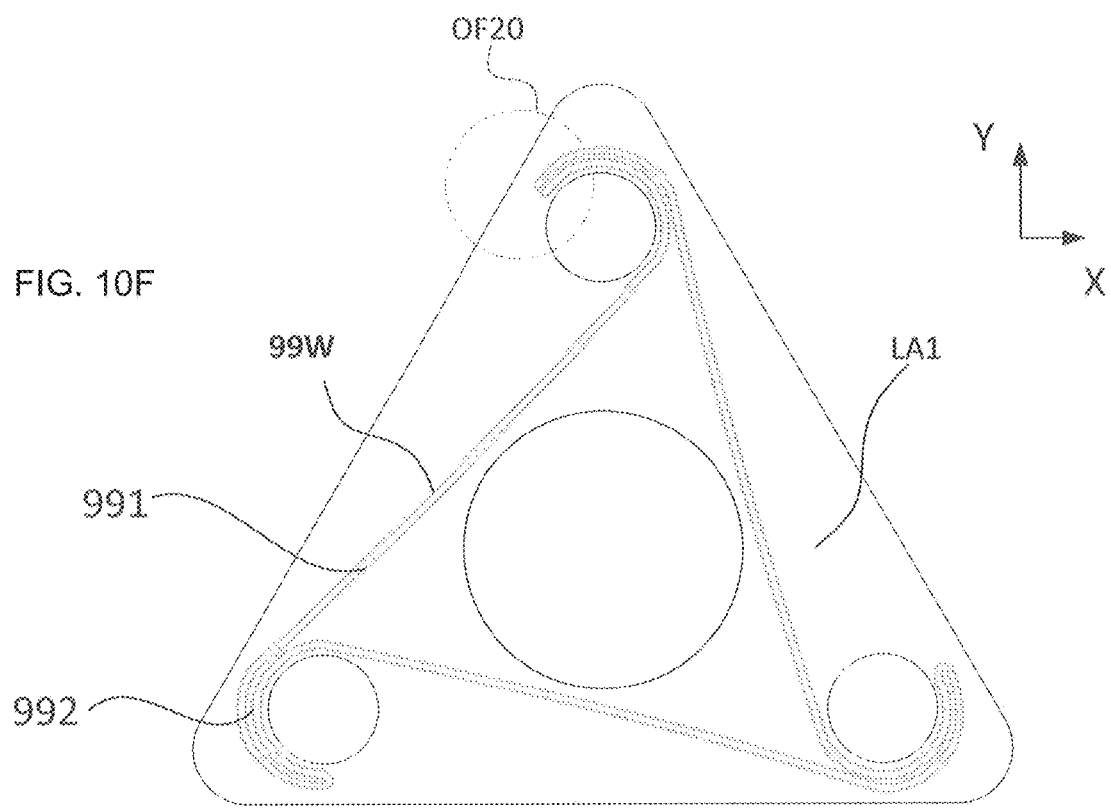
Figure 10G:
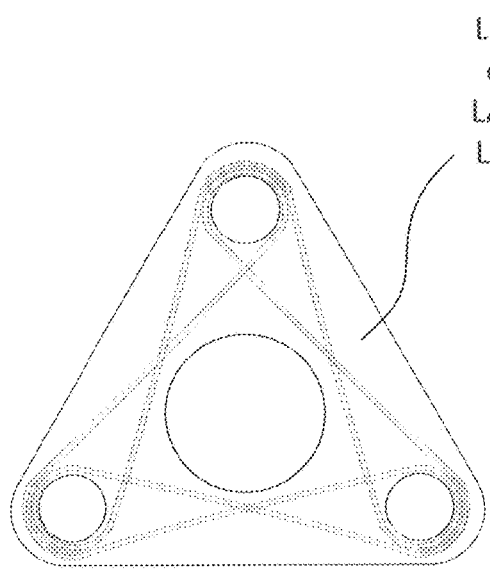
Figure 10H:
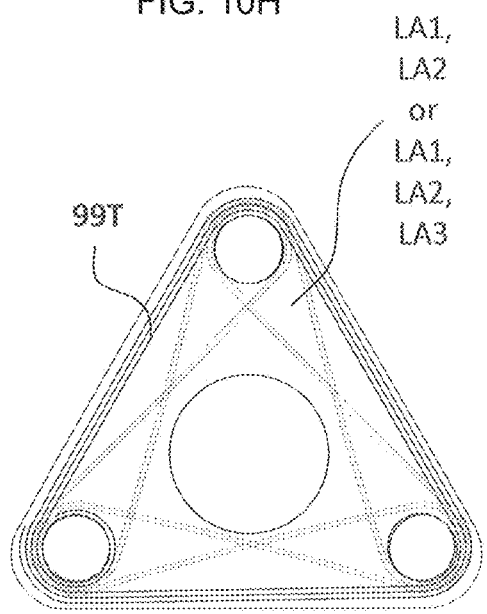

FIG. 10F shows another example of a three-point contact (in this case triangular) connecting plate having three circular holes $H_a$, $H_b$, $H_c$. In FIG. 10F, as shown, contours or region followed by the strategy are coincident with the hole wall but may be offset from the hole wall (e.g., representing wall thicknesses of fill material 18a). In FIG. 10F, a reinforcement formation 99W having an offset tracing strategy of an angle offset triangle tangent to the three holes is used to follow the three negative contours of the hexagonal holes. As shown in FIG. 10F, the spiral offset triangle tracing strategy begins/ends at OF20 and is "anchored" by the 180 degree curve about the hole wall and/or by surrounding composite swaths in the second and subsequent cycles/loops. The swaths 2c extending between the three holes are angled with respect to hoop stress and tension, to be mirrored and form cross-bracing and/or X shapes to resist twisting of the plate of the connecting plate. FIG. 10G shows the superposition of two toolpaths or composite swath depositions or reinforcement formations 99U of FIG. 10A over one or two layers, left-right mirrored and rotated, placing the stress concentrations and/or gaps of the offsets and/or spiral start and end in positions displaced from one another in at least two orthogonal directions (here, substantially the X direction as well as the Z direction between layers). FIG. 10C shows the further superposition of the spiral toolpath of FIG. 10A to add further resistance to tension and hoop stresses about the part.

Figure 10I:
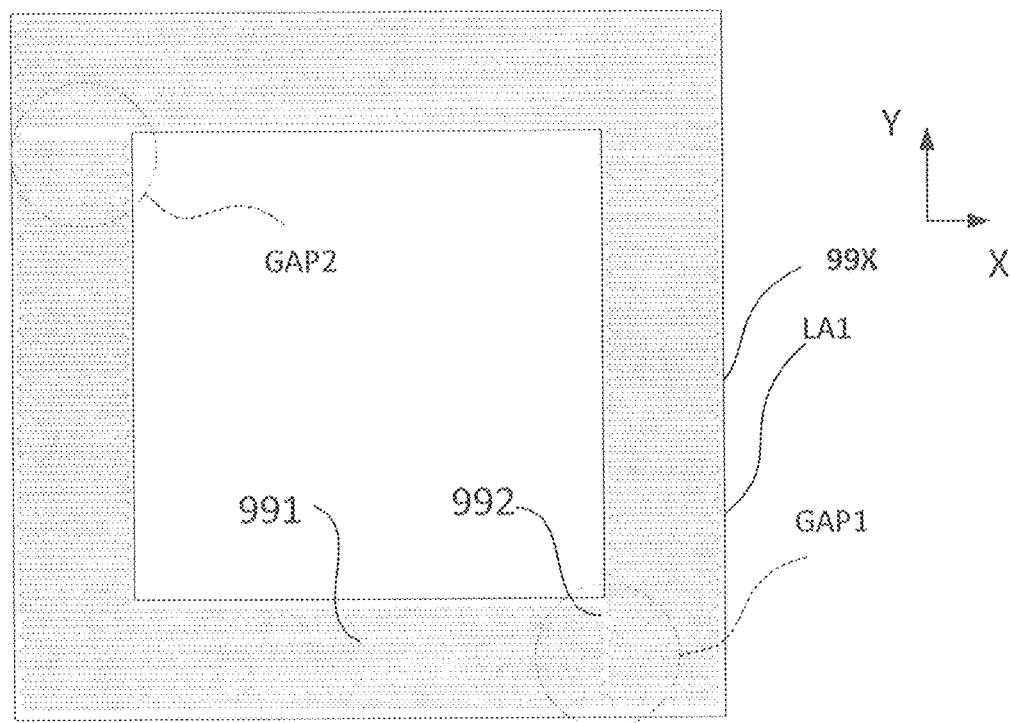
FIGS. 10I-10K show the principles of FIGS. 2A-9H in a rastering or boustrophedon reinforcement formation of touching loops.
Figure 10J:
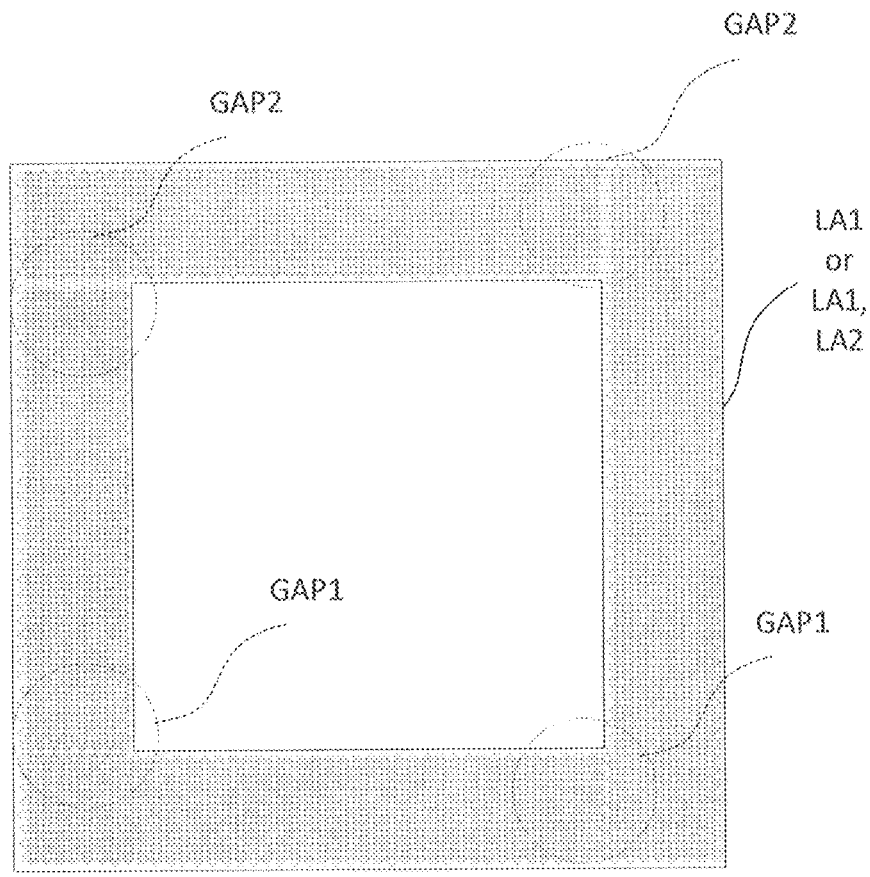
Figure 10K:
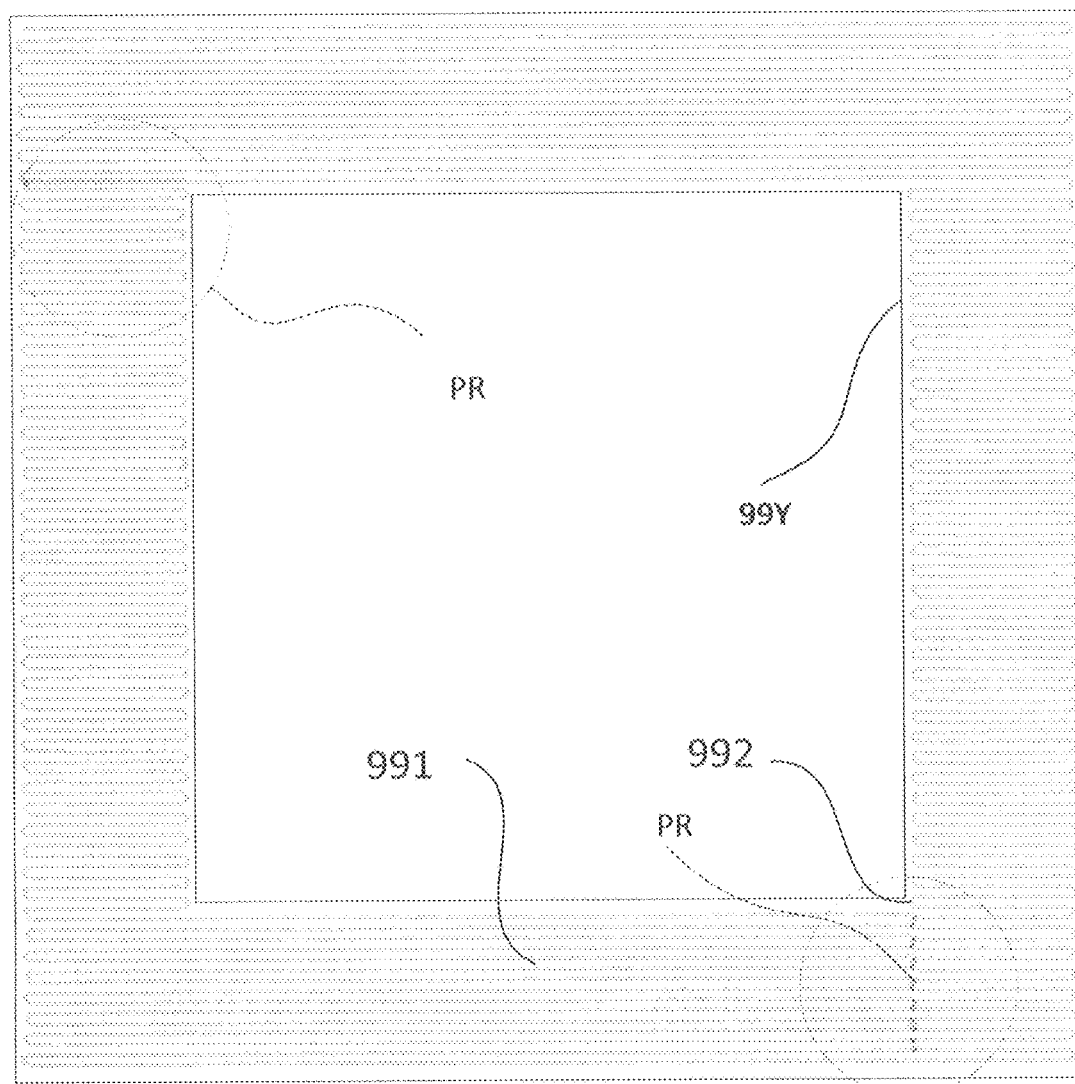

FIG. 10I shows a single layer of a densely filled square plate of four long side members, with a hole or negative contour in the middle. In FIG. 10I, as shown, a lengthwise raster fill reinforcement formation 99X surrounds the contour or region in the middle. There are many turns in the raster pattern, and two gaps GAP1 and GAP2 (which may also be stress concentrations, starts, or stops are formed. GAP1 is formed where the pattern changes regional groups, and GAP 2 is formed at the end of the composite swath 2c. These gaps may also occur if the composite swath 2c length is not perfectly predicted or measured. Within the layer, the gaps may be filled with (i) fill material 18a, (ii) lengths of composite swath 2c which do not continue the raster fill (e.g., gap filling patterns, which may be concentric, wall or region following), (iii) and/or with overlapping composite swath 2c or protrusion PR. E.g. in order to fill the GAP1 or GAP2 in FIG. 10I with overlapping composite swath 2c, each raster pattern would be widened to overlap (e.g., FIG. 10K, wherein the gaps are closed with protrusions PR, which may be varied in position among layers as discussed herein). In FIG. 10J, two superimposed reinforcement formations 99X, 99X layers are shown, where the reinforcement formation 99X is rotated by 90 degrees, optionally in the subsequent layer. The reinforcement formation 99X may be rotated at 90 degrees, then again, in an additional two layers to continue to change the position of the gap, stress concentration, starts, or stops. Optionally, the pattern is rotated by 45 degrees in some intervening layers.

Sparse Fill in, or with, Complementary Formations

As shown in FIGS. 12A-12D, complementary formations can be used in sparse fill approaches, e.g., generally honeycombs and tessellations for filling internal volumes of a part 14. In this case, as described herein, some approaches are suitable for honeycomb regions of layers $LA_n$, $LA_{n+1}$, $LA_{n+2}$, etc. including either or both of consolidated composite swaths 2c and fill material 18a. In the case of consolidated composite swaths 2c, more attention may be given to stacking of protrusions from an underlying layers $LA_n$ to layer(s) above $LA_{n+1}$, etc.

Each of FIGS. 12A-12D again shows reinforcement formations 99 within single or multiple layers $LA_n$, $LA_{n+1}$, $LA_{n+2}$, etc.

Figure 12A:
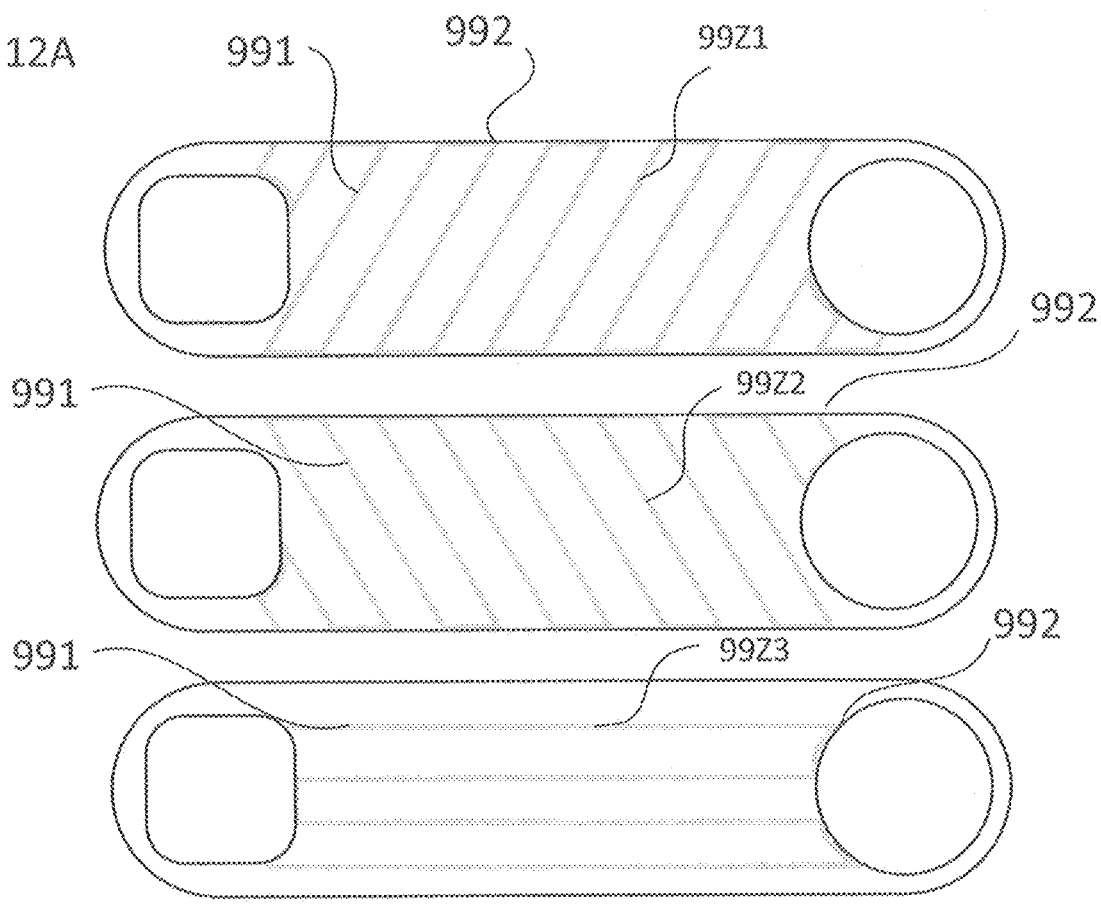
FIGS. 12A-12D show the principles of FIGS. 2A-9H applied as a sparse or honeycomb infill strategy (with an alternative fill material oriented example).

The controller 20 of the printer 1000, may, as described herein, supplying a multi-strand core reinforced filament 2 including a flowable matrix material 4a and a plurality of substantially continuous reinforcing strands 6a of a material having a tensile strength of greater than 300 MPa. The substantially continuous reinforcing strands 6a extend in a direction parallel to a length of the filament. As shown in FIG. 12A, within a first layer $LA_n$, the printer 1000 deposits a first consolidated composite swath 2c of a height less than 1 the width of the filament 2 in a first reinforcement formation 99Z1 (although the printer 1000 could begin with any of 99Z1, 99Z2, 99Z3) including a first plurality of parallel lengths each extending in a first direction by flowing the matrix material 4a and applying an ironing force that spreads the reinforcing strands 6a within the filament against a deposition surface 14 or 2d. In the case of FIGS. 12A-12D, the parallel lengths of reinforcement formations 99Z1, 99Z2, 99Z3, 99Z3-1 are attached to one another by further lengths following an outline, offset, or wall of the part 14, but this is optional. In this case, the first formation 99Z1 deposited is a reference formation, and the remaining formations in the sparse fill set are angled with reference to the parallel lengths of the first formation 99Z1.

Optionally, within the same first layer $LA_n$, the printer 1000 deposits a second consolidated composite swath 2c of a height less than ½ the width of the filament 2 in a second reinforcement formation 99Z2 including a second plurality of parallel lengths each extending a second direction angled from the first direction by sixty degrees, by flowing the matrix material 4a and applying an ironing force to spread the reinforcing strands 6a within the filament 2 against the first plurality of parallel lengths of the first consolidated composite swath 2c of the formation 99Z1. Subsequently, in a second layer $LA_{n+1}$ above the first layer $LA_n$, the printer 1000 may deposit a third consolidated composite swath 2c of a height less than ½ the width of the filament 2 in a third reinforcement formation 99Z3 including a third plurality of parallel lengths each extending a third direction angled from the first and second directions by sixty degrees, by flowing the matrix material 4a and applying an ironing force to spread the reinforcing strands 6a within the filament 2 against both the first and second pluralities of parallel lengths of the first and second consolidated composite swaths 2c, 2c of the formations 99Z1, 99Z2. The angle from the first formation of the second, third formations may alternatively be 120 degrees, 90 degrees, or other angles which divide evenly into 360 degrees.

Figure 12B:
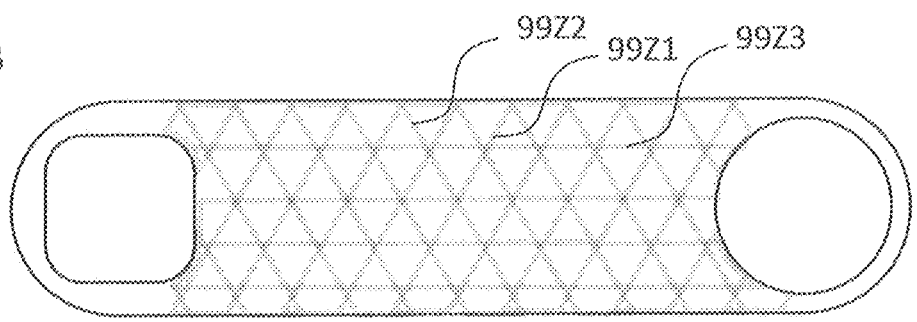
Figure 12C:
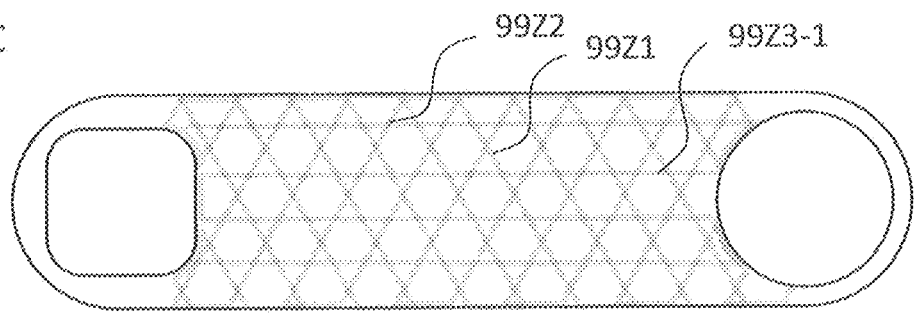

Further optionally, as shown in FIG. 12B, the printer 1000 for may deposit the third consolidated composite swath 2c of the third formation 99Z3 is deposited with the third plurality of parallel lengths each crossing (e.g., triangle honeycomb, tessellation, or network) an intersection of the first and second consolidated composite swaths 2c, 2c of the first and second formations 99Z1, 99Z2. Alternatively or in addition, as shown in FIG. 12C, the printer 1000 for may deposit the third consolidated composite swath 2c of the third formation 99Z3 is deposited with the third plurality of parallel lengths each offset (e.g., Star-of-David honeycomb, tessellation, or network) from an intersection of the first and second consolidated composite swaths 2c, 2c of the first and second formations 99Z1, 99Z2.

Alternatively, even in the case of fill material 18a only, the controller 20 of the printer 1000, may, supplying a filament including a flowable polymer material, and within a first layer $LA_n$, deposit rows of the flowable polymer material 18a in a first reinforcement formation 99Z1 including a first plurality of parallel lengths each extending in a first direction by flowing the flowable polymer material 18a against a deposition surface 14, and within the same first layer $LA_n$, deposit rows of the flowable polymer material 18a in a second reinforcement formation 99Z2 including a second plurality of parallel lengths each extending in a second direction angled from the first direction by sixty degrees, by flowing the flowable polymer material 18a against the deposition surface (at least in part the prior bead from formation 99Z1) and to thin out when the second plurality of parallel lengths crosses the first rows of the flowable polymer material. Within the same first layer $LA_n$, the controller 20 may deposit rows of the flowable polymer material 18a in a third reinforcement formation including a third plurality of parallel lengths each extending in a third direction angled from the first and second directions by sixty degrees, by flowing the matrix material against the first rows of the flowable polymer material and to thin out when the third plurality of parallel lengths crosses the first and second pluralities of parallel lengths of the first two rows of the flowable polymer material.

This technique for fill material 18a also applies to composite swaths, e.g., in the case where supplying a filament further comprises supplying a multi-strand core reinforced filament 2 including a flowable polymer matrix material 4a and a plurality of substantially continuous reinforcing strands 6a of a material having a tensile strength of greater than 300 MPa as discussed herein, where each row of flowable polymer material is deposited as a consolidated composite swath 2c as discussed herein, and advantageously as the third plurality of parallel lengths is deposited with each parallel length offset from an intersection of the first and second consolidated parallel lengths.

The interaction of the reinforcement formations may be implemented on the slicer or toolpath planner. In this case, a computer or workstation executes instructions for generating three-dimensional toolpath instructions for a three dimensional printer. The computer receives a three-dimensional geometry such as a solid model, NURBS model, mesh or STL file. The computer slices the three-dimensional geometry into layers $LA_1 \ldots LA_m$, and generates toolpath instructions to deposit consolidated composite swaths 2c by ironing strand reinforced composite filament 2 to form consolidated composite swaths 2c having reinforcing strands 6a spread out against a surface 14 or 2d. The computer generates toolpath instructions to deposit a first consolidated composite swath 2c according to a first single layer toolpath or reinforcement formation 99Z1 within a first layer of the layers $LA_1 \ldots LA_m$; (note a layer designated $LA_1$ herein need not be the first layer of the part; $LA_1$ is rather the first layer of the set of layers under discussion, which may begin or end anywhere within the part 14. The computer may generate toolpath instructions to deposit a second consolidated composite swath 2c according to a second single layer toolpath or reinforcement formation 99Z2 within the same first layer, the second consolidated composite swath having a crossing point with the first consolidated composite swath within the same first layer $LA_1$, and Generate toolpath instructions to iron the second consolidated composite swath 2c to spread against the first consolidated composite swath 2c within the same first layer $LA_1$.

With reference to FIG. 12A and the preceding discussion, all of reinforcement formations 99Z1-99Z3, together forming a honeycomb, may be deposited in one layer $LA_n$. If all three reinforcement formations 99Z1-99Z3 are formed from composite swaths 2c and the pattern 99Z1-99Z2-99Z3 of FIG. 12B is constructed, each intersection of three composite swaths will form a double-height protrusion which will tend to accumulate, and the neighboring layer $LA_{n+1}$ may be deposited with only fill material 18a (in the same reinforcement formations). Alternatively, the double-height protrusion that is an intersection of three paths 2c may be smaller than other protrusions as the intersection is entirely surrounded by air space into which the paths 2c may flatten. Alternatively, if all three reinforcement formations 99Z1-99Z3 are formed from composite swaths 2c and the pattern 99Z1-99Z2-99Z3-1 of FIG. 12C is constructed, all intersections are a protrusion of only one additional layer of swath 2c-2. Again, the neighboring layer $LA_{n+1}$ of honeycomb may be deposited with only fill material or again with fiber or composite swaths 2c, although in the case of the reinforcement formation set of FIG. 12C, the accumulation of overlaps is less than with FIG. 12B.

Figure 12D:
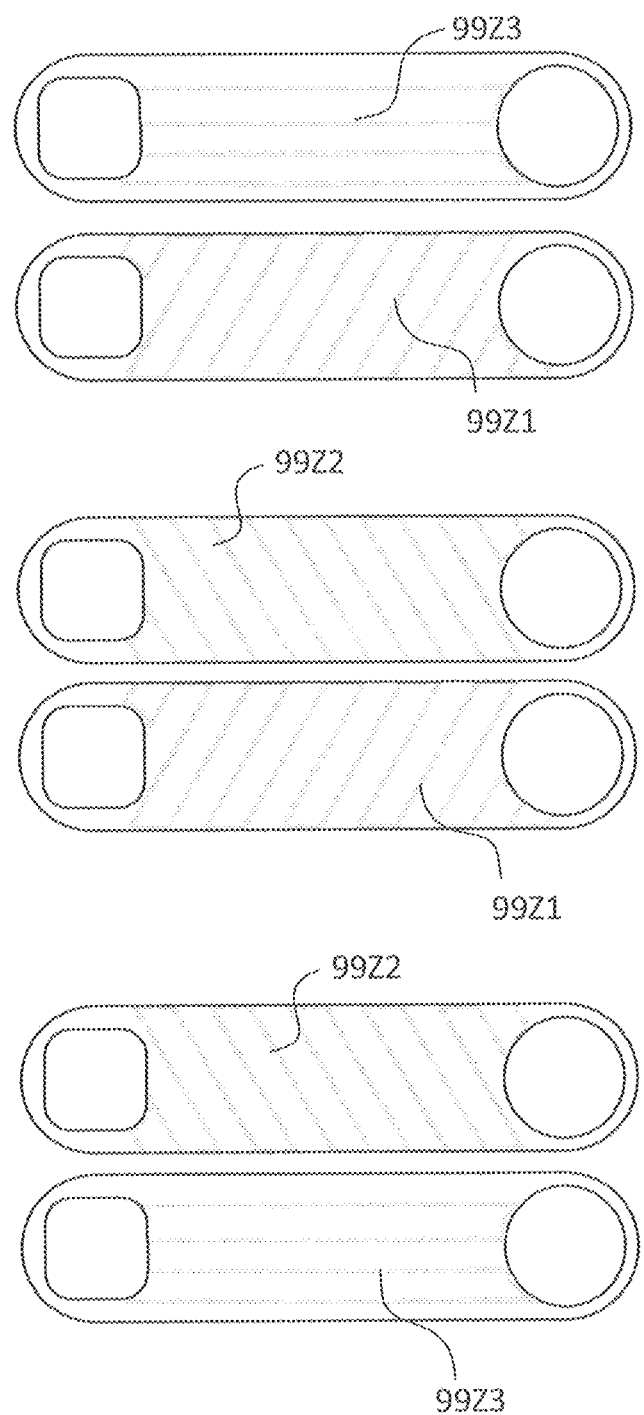

Further, with reference to FIG. 12D, the reinforcement formations 99Z1, 99Z2, 99Z3 may be arranged in permutation pairs per layer. E.g. if the first pair of reinforcement formations 99Z1, 99Z2 is printed in a first layer $LA_n$, an array of protrusions PR occurs at the intersections of the reinforcement formations. If the second pair of reinforcement formations 99Z2, 99Z1 is printed in a first layer $LA_{n+1}$, a second array of protrusions PR occurring at the intersections of the reinforcement formations are in a different coordinate locations (without interfering with those from the first pair), and if the third pair of reinforcement formations 99Z2, 99Z3 is printed in a first layer $LA_{n+2}$, a third array of protrusions PR occurs at the intersections of the reinforcement formations in this layer $LA_{n+2}$, and different from both of the first two layers $LA_n$, $LA_{n+1}$. Accordingly, if these three layers $LA_n$, $LA_{n+1}$, $LA_{n+2}$ as described are repeatedly laid next to one another, no more than one protrusion PR height is generated per layer. With this strategy, the third complementary pattern (e.g., for 99Z1, 99Z3 pair, the third complementary pattern would be 99Z2) may be printed with fill material 18a in the same layer.

Effects of Jumps and/or Crossing Points

When toolpaths and composite swaths 2c within a single layer $LA_1$ cross or overlap, the composite swaths 2c maintain a cross-section of substantially constant area. A protrusion PR upwards or sideways will generally be created (in some cases, downward when space permits). For tough continuous fiber materials (e.g., aramid), the overlap may be made at a similar speed/pressure to the current straight line printing speed. For strong but more brittle fiber materials (e.g., glass or carbon fiber), the overlap may be made a slower speed and/or less pressure. For example, the composite swath 2c deposition may be printed at from 0 to 1.0 layer heights above the previously printed layer), and/or with a briefly higher feed rate. The protrusion PR, will generally not be larger than a single swath 2c width or height.

At least the following strategies are available for accommodating the protrusion PR in a part 14 where layers $LA_1$-$LA_m$ are nominally of a consistent height—for example, 0.1 mm height. These strategies would in many cases be applied during slicing and toolpath or reinforcement formation planning for the part 14, in part so that inter-layer accommodations may be made. Where the protrusion PR scale (e.g., height and/or width) is modeled/ predicted/empirically known and stored as an absolute or relative value or a function of system variables, the overlap PR or a buffer zone BF larger than the overlap PR may be marked or planned in the current layer $LA_n$.

(1) Subsequent path planning in the same layer (layer $LA_n$ may:

(a) avoid crossing the overlap within the same layer (e.g., layer $LA_n$ by planning toolpaths which do not cross the overlap, although the new toolpaths may form a crossing point, jump, crossed loop or crossing turn forming a new overlap).

(b) plan new toolpaths within the same layer (layer $LA_n$ separated by more than the buffer zone.

Subsequent or integrated path planning for a new, adjacent layer ($LA_{n+1}$) adjacent to the layer in which protrusions are formed (layer $LA_n$ may:

(c) increase the previous layer height (of layer $LA_n$ in the overall slicing approach, and/or decrease the current layer height (of layer $LA_{n+1}$). This is most applicable when no composite swaths, or composite swaths which do not cross and create protrusions, will be formed in the current layer.

(d) path plan composite swaths to avoid overlaps and/or buffer zones in the layer below (layer $LA_n$);

(e) path plan a complementary or partner patterns in the current layer ($LA_{n+1}$) which provide complementary functionality to a pattern in an adjacent or previous layer (layer $LA_n$).

An example is proposed for the case of FIG. 5A. In this example, composite swath or multi-swath track has a rectangular proportion of roughly 1:7, having been compressed to ⅓ of the diameter of a substantially circular core reinforced filament including, e.g., 100-1000 continuous fibers. One example would be a ⅓ mm diameter core reinforced filament flattened to a shape of approximately 0.1 mm height by 0.7 mm wide. Overlapping the swaths may be set to create a flatter shape for the overlapping swath at the crossing point, e.g., about 0.07 mm height by about 0.1 mm width, which creates a protrusion of about 0.015 mm on either side of the overlapping swath and about 0.07 mm high.

In order to accommodate this crossing protrusion horizontally, individual composite swaths 2c may be deposited at a pitch having an increased spacing associated with the overlap, protrusion, or buffer zone.

In order to accommodate this crossing and/or overlapping protrusion PR in the vertical direction, different steps may be taken (separately or together):

For example, the slice height for the layer including the crossing protrusion(s), e.g., layer $LA_n$ may be set to twice the composite swath 2c height, e.g., in particular for fill material 18a, and the feed rate of fill material 18a lowered at the location of the crossing protrusions PR. In such a case, per the example above, the maximum height of stacked fiber 2c, 2c within the layer $LA_n$ would be roughly 0.17 mm, where much of the fiber 2c is deposited at 0.1 mm high. Accordingly, fill material 18a would be deposited at a height of 0.2 mm, with a possible lowering of fill material 18a feed rate in the location of the fiber stacks 2c, 2c or PR where the additional material should be only 0.03 mm on top of the fiber stack 2c, 2c or PR. In the adjacent layer, the slice height may be returned to the composite swath 2c height of 0.1 mm, and/or continued at 0.2 mm should additional crossing points or protrusions PR or 2c, 2c be anticipated or planned.

In another example, the slice height for the layer including the crossing protrusion, e.g., layer $LA_n$ is continued at the composite swath 2c height. In this case, any protrusions into layer $LA_{n+1}$ may be marked, and layer $LA_n$ completed at the 0.1 mm height. Layer $LA_{n+1}$ is planned such that the protrusions PR are considered already printed, and planning is completed considering the protrusions PR as to be avoided (e.g., as negative contours, or specially coded). In layer $LA_{n+1}$, composite swaths $2c$ and fill material $18a$ may be considered differently. For example, the planning of composite swath $2c$ toolpaths and/or reinforcement formations may avoid the protrusions PR into the layer $LA_{n+1}$ (to avoid accumulation of stacks of fiber $2c$, $2c$ or PR), while the planning of fill material $18a$ toolpaths may fill at the location of protrusions PR. Again, the feed rate of fill material $18a$ may be lowered at the location of the crossing protrusions PR. In such a case, per the example above, the maximum protrusion of stacked fiber $2c$, $2c$ into layer $LA_{n+1}$ may be roughly 0.07 mm, where much of the fiber $2c$ is deposited in lower layer $LA_n$ at 0.1 mm high. Accordingly, fill material $18a$ would be deposited in layer $LA_n$ at a height of 0.1 mm, and in layer $LA_{n+1}$ at a height of 0.1 mm, with a possible lowering of fill material $18a$ feed rate in the location of the protrusions PR where the additional material should be only 0.03 mm on top of the fiber stack $2c$, $2c$.

The controller 20 of the printer 1000, may, as described herein, receive toolpath instructions having a plurality of single layer toolpaths encoded with first and second degrees of freedom (e.g., a toolpath for composite swath $2c$ and/or fill material $18a$, or a reinforcement formation 99A-99M). As noted, the printer 1000 may supply a strand reinforced composite filament 2 having reinforcing strands $6a$ embedded in a flowable matrix $4a$. The printer 1000 may deposit consolidated (e.g., highly compressed) composite swaths $2c$ by both controlling the print head 10 to output the strand reinforced composite filament 2 with the reinforcing strands $6a$ oriented parallel to a trajectory of the print head 10, and controlling the print head 10 to iron the strand reinforced composite filament 2 to form consolidated composite swaths $2c$ having reinforcing strands $4a$ spread out against a surface 14 or $2d$.

In order to overlap composite swaths $2c$-2, $2c$-1 one over another, whether in the same direction (parallel) and or in different directions (crossing), the printer 1000 may deposit a first consolidated composite swath $2c$-1 according to a first single layer toolpath or reinforcement formation 99A-99Z within a first layer $LA_n$, and deposit a second consolidated composite swath $2c$-2 according to a second single layer toolpath or reinforcement formation 99A-99Z within the same first layer $LA_n$, the second consolidated composite swath $2c$-2 having a crossing point PR with the first consolidated composite swath $2c$-1 within the same first layer $LA_n$, while ironing the second consolidated composite swath $2c$-2 to spread against the first consolidated composite swath $2c$-1.

In a further refinement, variation, addition, or alternative to of this technique, the first and second single layer toolpaths or reinforcement formations 99A-99Z form a closed loop from the continuous strand reinforced composite filament $2c$, and the first and second consolidated composite swaths $2c$-1, $2c$-2 form a crossing turn within the same first layer $LA_n$. The closed loop and the crossing turn may be deposited in a location adjacent to and reinforcing a negative subcontour $H_a$, $H_b$, etc., within an interior of the same first layer $LA_n$. The printer 1000 may deposit a third consolidated composite swath $2c$ in a location adjacent to and reinforcing the closed loop and crossing turn in one of the same first layer $LA_n$ or an adjacent second layer $LA_{n+1}$ or $LA_{n-1}$.

In an additional further refinement, variation, addition, or alternative to of this technique, the printer 1000 may, in order to control the print head 10 to iron the strand reinforced composite filament 2 to form consolidated composite swaths $2c$ having reinforcing strands spread out against a surface 14 or $2d$, further flow the matrix material $4a$, and apply an ironing force that spreads the reinforcing strands $6a$, in a manner to form consolidated composite swaths $2c$ of a height less than ½ the width of the strand reinforced composite filament 2 (e.g., as supplied in a roughly circular, square, or other roughly unitary aspect ratio cross-section).

Extrusion Toolpaths and/or Extrudates

In general, in the "FFF" or "FDM" extrusion method of additive manufacturing, extrusion beads in adjacent layers $LA_n$, $LA_{n+1}$ may be arranged to run either parallel or transverse to one another, without crossing while within a layer. A "retract" may be performed in the filament feed path to stop nozzle flow and move from one isolated area to another to restart extrusion, but the active printing beads tend to remain uncrossed. This is reasonable, because continuing to extrude while crossing a previously printed bead may cause extrudate to jet out horizontally and unpredictably as the nozzle is partially blocked. Additionally, any time spent extruding with a blocked nozzle reduces the amount of active deposition of extrusion. Slicing software generally avoids creating extrusion toolpaths which cross one another.

However, in the FFF printer discussed herein, extrusion toolpaths may cross one another in the same manner as described with respect to core reinforced fiber toolpaths, partially enabled by a fast-response clutching in the filament supply for the extrusion head 18, e.g., a low motor current or other slippable drive. In such a case, crossing extrusion toolpaths should cross at a high angle (e.g., from 45-90 degrees) and/or limited to short periods of time or narrow existing beads (e.g., for $\frac{1}{10}$ to $\frac{1}{100}$ of a second, e.g., for a printing extrusion speed of 300 mm/s, crossing no more than 1 mm of previously solidified extrudate, and preferably ¼ to ½ mm of solidified extrudate). This is particularly advantageous in the case of honeycomb fills of patterned lines (e.g., triangular tessellation, e.g., of 60-60-60 degree crossing straight paths, either with all paths intersecting [triangular honeycomb] or two paths intersecting with one path offset [Star of David network or honeycomb]).

Generally, even the fast-response buffered crossing of a newly extruded bead or road of fill material $18a$ across a previously printed extrusion bead or toolpath may not change the layer height of the current layer $LA_n$ either on top of the solidified bead crossed or in the currently deposited row, i.e., neat plastic does not generally vertically accumulate as beads are crossed. Rather, fluidized fill material $18a$ tends to find a least resistance direction to escape horizontally or downward when the extrusion nozzle 18 is blocked by a previously deposited bead.

Folds and/or Sharp Corners

Figure 17A:
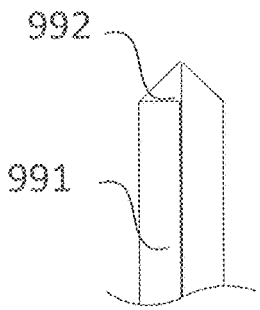
FIGS. 17A-17H show examples of folds and sharp corners discussed herein.
Figure 17B:
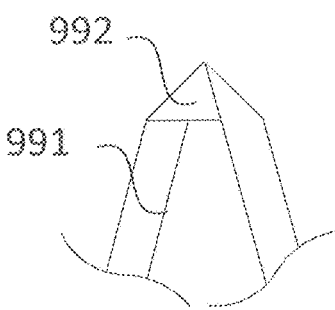
Figure 17C:
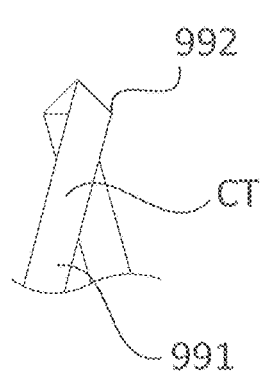
Figure 17D:
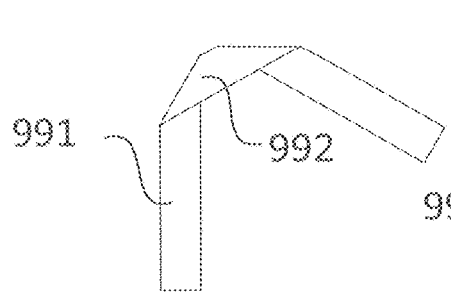
Figure 17E:
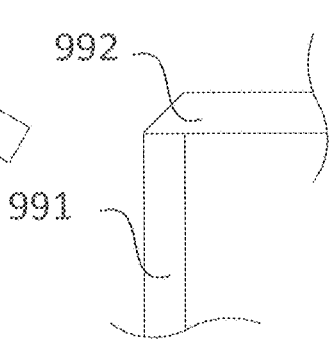
Figure 17F:
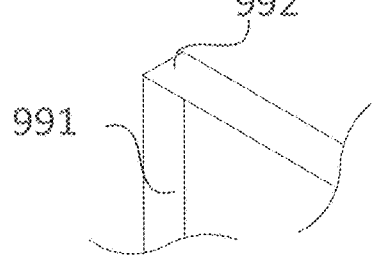
Figure 17G:
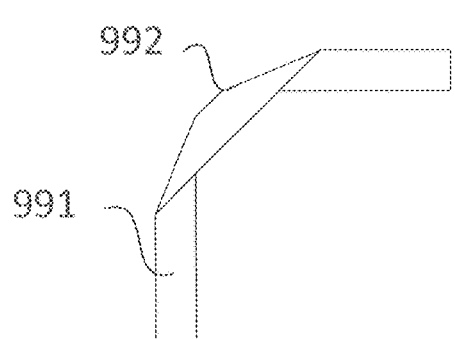
Figure 17H:
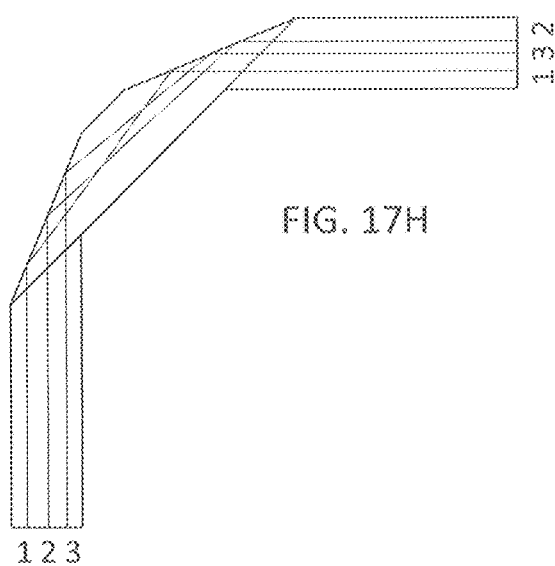

A "fold" may refer to a composite swath $2c$ or part of a reinforcement formation 99A-99Z which folds, twists, or bunches over itself along a curved segment of composite swath $2c$ (such as a sharp corner, where a sharp corners is an unfolded or folded corners having a corner radius from 0 to twice the composite swath $2c$ width). As shown in FIGS. 17A-17H, a "fold" is not limited to sheet-like or tape-like folds where different fibers within the composite swath may cleanly switch sides of a swath $2c$, but also includes path changes in which, as shown in FIG. 17H, strands within the swath $2c$ may also cross, twist, or bunch along the curved or angled segment 992 (including sharp corners).

The controller 20 of the printer 1000, may, as described herein, supply a strand reinforced composite filament 2 including a flowable matrix material 4a and a plurality of substantially continuous reinforcing strands 6a of a fiber material having a tensile strength of greater than 300 MPa. The substantially continuous reinforcing strands 6a extend in a direction parallel to a length of the filament 2. The controller 20 of the printer 1000 may receive toolpath instructions having a plurality of single layer toolpaths and or a reinforcement formation 99A-99Z encoded with first and second degrees of freedom. The controller 20 of the printer 1000 may consolidate composite swaths 2c by controlling the print head 10 to iron the strand reinforced composite filament 2 to less than ½ the width of the strand reinforced composite filament 2 to form consolidated composite swaths 2c having reinforcing strands 6a spread out against a surface 14 or 2d.

The printer 1000 may deposit a first reinforcement formation 99A-99Z including a plurality of interconnected straight segments 991 and curved segments 992, and/or deposit a second reinforcement formation 99A-99Z including a plurality of interconnected straight segments 991 and curved segments 992, different from the first reinforcement formation 99a-99Z. On curved segments 992 which change a direction of a connected straight segment 991 by more than 45 degrees, the controller 20 of the printer 1000 may control the printhead 10 to deposit consolidated composite swaths 2c in a toolpath or trajectory that is different from the embedded path or trajectory of the consolidated composite swath 2c as it is actually deposited in the part 14.

In forming corners as shown in FIGS. 17A-17H, tight touching loops as shown the left of FIG. 15D, and in some cases tight open loops as shown toward the bottom of FIG. 15C, the print head 10 may be moved in a travel path which travels more than the composite swath trajectory embedded in the part 14.

In a further refinement, variation, addition, or alternative to of this technique, on curved segments 992 which change a direction of a connected straight segment 991 by more than 45 degrees, controlling the printhead 10 to deposit consolidated composite swaths 2c in a toolpath is a longer linear trajectory than the embedded path of the consolidated composite swath 2c. Optionally, on curved segments 992 which change a direction of a connected straight segment 991 by more than 45 degrees, the controller 20 of the printer may control the printhead 10 to deposit consolidated composite swath 2c in a toolpath (e.g., within a reinforcement formation 99A-99Z) that folds the consolidated composite swath 2c in a curved segment 992 of the consolidated composite swath 2c. Further optionally, alternatively, or in addition, on curved segments 992 which change a direction of a connected straight segment 991 by more than 45 degrees, the controller 20 of the printer 1000 may control the printhead 10 to deposit consolidated composite swaths 2c in a toolpath (e.g., within a reinforcement formation 99A-99Z) that folds the consolidated composite swath 2c by moving many fibers within the consolidated composite swath 2c from one lateral location to a displaced lateral location along a curved segment 992 of the consolidated composite path 2c, e.g., as shown in FIG. 17H, where fibers in order 1-2-3 in the entry path are, by example only, reordered 1-3-2 in the exit path. In composite swaths 2c as described herein tens, hundreds to thousands of strands may displace about the curved segment 992.

Section headings used herein are dependent upon following content which they describe, and can only broaden the content described.

TERMINOLOGY

1. A "composite swath" or "composite swath" may refer to a deposited fiber-reinforced composite filament, having been compressed, consolidated and widened by ironing during deposition. Extending within the composite swath are a plurality of individual fibers, from 50-5000, preferably 100-2000, within a matrix material.

2. A "multi-swath track" may refer to a set of parallel swaths that generally follow parallel paths, although individual swaths may deviate to avoid obstacles or achieve reinforcement goals.

2. A "loop" or "crossed loop" may refer to a toolpath, composite swath, or multi-swath track that jumps or crosses over itself.

3. A "crossing turn" may be a "loop" that loops about a contour, to directly surround the contour, or surround the contour at an offset from walls formed of fill material. "Loops" and "crossing turns" are "underhand loops" unless otherwise described.

4. The generally diamond-shaped crossing of two bonded ranks or two composite swaths, including those occurring in a loop or crossing turn, may be described as a "crossing point".

5. A "bight" or "open loop" may mean a curved section of toolpath or composite swath, generally curved in a manner in which the toolpath or composite swath does not touch itself upon return from the curve (at least locally).

6. A "touching loop" may refer to a curved toolpath or composite swath that loops back to touch itself.

7. A "fold" may refer to a composite swath which folds, twists, or bunches over itself along a curved segment of composite swath (such as a corner). As shown in FIGS. 17A-17H, a "fold" is not limited to sheet-like or tape-like folds, but includes path changes in which, as shown in FIG. 17H, different fibers within the composite swath may cleanly switch sides of a swath, but may also cross, twist, or bunch along the curved or angled segment (such as a corner).

8. A "standing end" may refer to a portion of a fiber reinforced filament that remains undeposited, e.g., within the printhead or upstream.

9. A "running end" may refer to a terminal, distal, or cut end of the swath deposited within the part.

10. "Fill material" includes material that may be deposited in substantially homogenous form as extrudate, fluid, or powder material, and is solidified, e.g., by hardening, crystallizing, transition to glass, or curing, as opposed to the core reinforced filament discussed herein that is deposited as embedded and fused composite swaths, which is deposited in a highly anisotropic, continuous form. "Substantially homogenous" includes powders, fluids, blends, dispersions, colloids, suspensions and mixtures, as well as chopped fiber reinforced materials.

11. "Honeycomb" includes any regular or repeatable tessellation for sparse fill of an area (and thereby of a volume as layers are stacked), including three-sided, six-sided, four-sided, complementary shape (e.g., hexagons combined with triangles) interlocking shape, or cellular.

12. A "Negative contour" and "hole" are used herein interchangeably. However, either word may also mean an embedded contour (e.g., an embedded material or object) or a moldover contour (e.g., a second object with surfaces intruding into the layer).

13. "Outwardly spiraling" or "outwardly offsetting" meaning includes that a progressive tracing, outlining, or encircling is determined with reference to an innermost, generally negative or reference contour, not necessarily that the composite swath mush begin next to that contour and be built toward an outer perimeter. Once the toolpath is determined, it may be laid in either direction. Similarly, "inwardly spiraling" or "inwardly offsetting" means that the progressive tracing is determined with reference to an outer, generally positive contour.

14. "3D printer" meaning includes discrete printers and/or toolhead accessories to manufacturing machinery which carry out an additive manufacturing sub-process within a larger process. A 3D printer is controlled by a motion controller 20 which interprets dedicated G-code (toolpath instructions) and drives various actuators of the 3D printer in accordance with the G-code.

15. "Extrusion" may mean a process in which a stock material is pressed through a die to take on a specific shape of a lower cross-sectional area than the stock material. Fused Filament Fabrication ("FFF"), sometimes called Fused Deposition Manufacturing ("FDM"), is an extrusion process. Similarly, "extrusion nozzle" shall mean a device designed to control the direction or characteristics of an extrusion fluid flow, especially to increase velocity and/or restrict cross-sectional area, as the fluid flow exits (or enters) an enclosed chamber.

16. A "conduit nozzle" may mean a terminal printing head, in which unlike a FFF nozzle, there is no significant back pressure, or additional velocity created in the printing material, and the cross sectional area of the printing material, including the matrix and the embedded fiber(s), remains substantially similar throughout the process (even as deposited in bonded ranks to the part).

17. "Deposition head" may include extrusion nozzles, conduit nozzles, and/or hybrid nozzles.

18. "Filament" generally may refer to the entire cross-sectional area of an (e.g., spooled) build material, and "strand" shall mean individual fibers that are, for example, embedded in a matrix, together forming an entire composite "filament".

19. "Alternating", with respect to reinforcement regions, generally means in any regular, random, or semi-random strategy, unless the pattern is described, specified, or required by circumstances, for distributing different formations within or among layers. E.g., simple alternation (ABA-BAB), repeating alternation (AABBAABB), pattern alternation (ABCD-ABCD), randomized repeating groups (ABCD-CBDA-CDAB), true random selection (ACBADB-CABDCD), etc.

20. "Shell" and "layer" are used in many cases interchangeably, a "layer" being one or both of a subset of a "shell" (e.g., a layer is an 2.5D limited version of a shell, a lamina extending in any direction in 3D space) or superset of a "shell" (e.g., a shell is a layer wrapped around a 3D surface). Shells or layers are deposited as 2.5D successive surfaces with 3 degrees of freedom (which may be Cartesian, polar, or expressed "delta"); and as 3D successive surfaces with 4-6 or more degrees of freedom. Layer adjacency may be designated using descriptive notations "$LA_1$", "$LA_2$" or $LA_n$, $LA_{n+1}$", etc., without necessarily specifying unique or non-unique layers. "$LA_1$" may indicate the view shows a single layer, "$LA_2$" indicating a second layer, and "$LA_1$, $LA_2$" indicating two layers superimposed or with contents of each layer visible. For example, in a top down view, either of "$LA_1$, $LA_2$, $LA_3$" or "$LA_n$, $LA_{n+1}$, $LA_{n+2}$" may indicate that three layers or shells are shown superimposed. "$LA_1$, $LA_2$ . . . $LA_m$" may indicate an arbitrary number of adjacent layers (e.g., m may be 2, 10, 100, 1000, or 10000 layers).

20. Some representative Ultimate/Tensile Strength and Tensile/Young's Modulus values for reinforcing fibers, matrix materials, fill materials, and comparative materials are as follows:

| MATERIAL | Ultimate Strength MPa | Young/Tensile Modulus GPa |
|---|---|---|
| reinforcing strands - UHMWPE- Dyneema, Spectra | 2300-3500 | 0.7 |
| reinforcing strands - Aramid or Aramid Fiber - Kevlar Nomex, Twaron | 2000-2500 | 70.5-112.4, 130-179 |
| reinforcing strands - Carbon Fiber | 4000-4500 | 300-400 |
| reinforcing strands - Glass Fiber (E, R, S) | 3500-4800 | 70-90 |
| reinforcing strands - Basalt fiber | 1300-1500 | 90-110 |
| Carbon Fiber reinforced plastic (70/30 fiber/matrix, unidirectional, along grain) | 1600 | 170-200 |
| Glass-reinforced plastic (70/30 by weight fiber/matrix, unidirectional, along grain) | 900 | 40-50 |
| Steel & alloys ASTM A36 | 350-450 | 200 |
| Aluminum & alloys | 250-500 | 65-80 |
| matrix, fill material, solidifiable material - Epoxy | 12-30 | 3.5 |
| matrix, fill material, solidifiable material - Nylon | 70-90 | 2-4 |

What is claimed is:

1. A method for additive manufacturing a part, comprising steps of:
   depositing, with at least one print head of a 3D printer, a fill material filament;
   depositing, with the at least one print head of the 3D printer, a core reinforced filament including a flowable matrix material and one or more substantially continuous reinforcing strands;
   applying an ironing force with the at least one print head of the 3D printer to the filament to press the reinforcing strands against a deposition surface and/or a previous layer and to spread the strands within the flowable matrix of the filament;
   after the matrix is melted applying a tension with the at least one print head of the 3D printer such that a tensile force extends along the ironed filament;
   forming a layer of the ironed filament along a toolpath with the at least one print head of the 3D printer; and
   forming one or more subsequent layers of the ironed filament along neighboring toolpaths with the at least one print head of the 3D printer,
   wherein the ironing force applied to the one or more subsequent layers along the neighboring toolpaths further spreads strands therebetween the one or more subsequent layers and the previous layer beside and/or below, and
   wherein the depositing and applying steps of the neighboring toolpaths form complementary reinforcing formations in the additively manufactured part.

2. The method of claim 1, wherein the ironing force applied to the one or more subsequent layers diffuses the strands therebetween the one or more subsequent layers and the previous layer beside and/or below.

3. The method of claim 1, wherein the ironing force applied to the one or more subsequent layers results in the strands penetrating into a subsequent or previous layer.

4. The method of claim 1, wherein the step of forming the layer of the ironed filament along the toolpath comprises following a circuit.

5. The method of claim 4, wherein the step of forming the one or more subsequent layers along neighboring toolpaths comprises substantially cloning the circuit.

6. The method of claim 1, wherein the step of forming the one or more subsequent layers along neighboring toolpaths comprises following an adjacent circuit.

7. The method of claim 1, wherein the one or more subsequent layers is adjacent to the layer.

8. The method of claim 1, wherein the step of forming the one or more subsequent layers comprises substantially cloning the layer.

9. The method of claim 1, wherein the step of forming the layer of the ironed filament along the toolpath comprises following at least one contour.

10. The method of claim 9, wherein the step of forming the one or more subsequent layers along neighboring toolpaths comprises following at least a portion of the toolpath parallel to the at least one contour.

11. The method of claim 1, wherein the step of forming the one or more subsequent layers along neighboring toolpaths comprises inwardly spiraling from an outer layer having a substantially positive contour.

12. The method of claim 1, wherein the step of forming the one or more subsequent layers along neighboring toolpaths comprises outwardly spiraling from an inner layer having a substantially negative contour.

13. The method of claim 1, wherein the step of forming the one or more subsequent layers along neighboring toolpaths comprises forming a protrusion to link the layer to a subsequent layer.

14. The method of claim 13, wherein the step of forming the protrusion comprises forming a buffer zone, wherein the buffer zone substantially overlaps with a portion of the layer.

15. The method of claim 14, wherein the overlap extends a length of the layer about 1% to about 20%.

16. The method of claim 1, wherein the step of forming the one or more subsequent layers along neighboring toolpaths comprises a step of repositioning, with a controller of the 3D printer, the neighboring toolpaths to avoid stacking seams or stress concentrations in the one or more subsequent layers.

17. The method of claim 16, wherein the step of repositioning, with the controller of the 3D printer, the neighboring toolpaths to avoid stacking seams or stress concentrations comprises relatively displacing, with the controller of the 3D printer, gaps within the layer.

18. The method of claim 16, wherein the step of repositioning, with the controller of the 3D printer, the neighboring toolpaths to avoid stacking seams or stress concentrations comprises a step of changing, with the controller of the 3D printer, turning locations of toolpaths among layers.

19. The method of claim 18, wherein the step of changing, with the controller of the 3D printer, turning locations comprises regularly varying, with the controller of the 3D printer, an entry/exit location along a toolpath.

20. The method of claim 18, wherein the step of changing, with the controller of the 3D printer, turning locations comprises randomly varying, with the controller of the 3D printer, an entry/exit location of the fill material filament and the core reinforced filament along a toolpath.

21. The method of claim 1, further comprising, prior to the step of forming one or more subsequent layers along neighboring toolpaths, offsetting from the toolpath.

22. The method of claim 1, wherein the step of forming the one or more subsequent layers along neighboring toolpaths comprises outlining the toolpath.

23. The method of claim 1, wherein the step of forming the one or more subsequent layers along neighboring toolpaths comprises following the toolpath.

24. The method of claim 1, wherein the step of forming the one or more subsequent layers along neighboring toolpaths comprises tracing the toolpath.

25. The method of claim 1, wherein the step of depositing the core reinforced filament comprises heating the filament to a temperature that is greater than a melting temperature of the matrix material and is less than a melting temperature of the continuous reinforcing strands.

\* \* \* \* \*